US012718893B2

(12) United States Patent
Matsuno et al.

(10) Patent No.: US 12,718,893 B2
(45) **Date of Patent: *Aug. 25, 2026**

(54) SEMICONDUCTOR DEVICE INCLUDING INVERTER CIRCUIT

(71) Applicant: Kioxia Corporation, Tokyo (JP)

(72) Inventors: Junya Matsuno, Yokohama Kanagawa (JP); Kenro Kubota, Fujisawa Kanagawa (JP); Masato Dome, Yokohama Kanagawa (JP); Kensuke Yamamoto, Yokohama Kanagawa (JP); Kei Shiraishi, Kawasaki Kanagawa (JP); Kazuhiko Satou, Yokohama Kanagawa (JP); Ryo Fukuda, Yokohama Kanagawa (JP); Masaru Koyanagi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 159 days.

This patent is subject to a terminal disclaimer.

(21) Appl. No.: 18/672,202

(22) Filed: May 23, 2024

(65) Prior Publication Data

US 2024/0312532 A1 Sep. 19, 2024

Related U.S. Application Data

(63) Continuation of application No. 17/952,659, filed on Sep. 26, 2022, now Pat. No. 12,033,704, which is a
(Continued)

(30) Foreign Application Priority Data

Sep. 18, 2020 (JP) ................................ 2020-157763

(51) Int. Cl.
*G11C 16/32* (2006.01)
*G11C 16/04* (2006.01)
(Continued)

(52) U.S. Cl.
CPC .......... *G11C 16/32* (2013.01); *G11C 16/0483* (2013.01); *G11C 16/08* (2013.01); *G11C 16/26* (2013.01); *H10B 69/00* (2023.02)

(58) Field of Classification Search
CPC ..... G11C 16/32; G11C 16/0483; G11C 16/08; G11C 16/26; G11C 7/222;
(Continued)

(56) References Cited

U.S. PATENT DOCUMENTS 5,081,377 A 1/1992 Freyman
6,301,322 B1 10/2001 Manning
(Continued)

FOREIGN PATENT DOCUMENTS

CN 106960684 A 7/2017
CN 107404306 A 11/2017
(Continued)

OTHER PUBLICATIONS

Notice of Allowance dated Feb. 22, 2024, issued in parent U.S. Appl. No. 17/952,659.
(Continued)

*Primary Examiner* — Khamdan N. Alrobaie
(74) *Attorney, Agent, or Firm* — Holtz, Holtz & Volek PC

(57) ABSTRACT

A semiconductor memory device includes a memory cell array having a memory cell; a data signal terminal configured to receive data to be written into the memory cell from an exterior of the semiconductor memory device and to output data read from the memory cell to the exterior of the semiconductor memory, and a timing signal terminal configured to receive a timing control signal. An interface circuit includes a first comparator having a first input terminal connected to the data signal terminal, a second input terminal connected to a reference voltage, and an output terminal. A plurality of first inverters are connected in
(Continued)

series, an input terminal of a first stage one of the first inverters being connected to the output terminal first of the first comparator. A first switch circuit has a first terminal connected to an output terminal of a final stage one of the first inverters and a second terminal; a second inverter having an input terminal connected to the second terminal of the first switch and an output terminal connected to the second terminal of the first switch; and a first latch circuit connected to the second terminal of the first switch.

12 Claims, 38 Drawing Sheets

Related U.S. Application Data continuation of application No. 17/202,661, filed on Mar. 16, 2021, now Pat. No. 11,495,308.

(51) Int. Cl.
*G11C 16/08* (2006.01)
*G11C 16/26* (2006.01)
*H10B 69/00* (2023.01)

(58) Field of Classification Search
CPC .......... G11C 2207/2254; G11C 29/021; G11C 29/028; G11C 16/10; G11C 7/106; G11C 7/1087; G11C 7/12; G11C 8/08; H10B 69/00; H10B 43/27
See application file for complete search history.

(56) References Cited

U.S. PATENT DOCUMENTS

| | | | | |
|---|---|---|---|---|
| 7,474,116 | B2 | 1/2009 | Uemura et al. | |
| 9,520,164 | B1 | 12/2016 | Yamamoto et al. | |
| 10,360,982 | B2 | 7/2019 | Suematsu et al. | |
| 10,461,750 | B2 | 10/2019 | Hirashima et al. | |
| 10,916,276 | B2 | 2/2021 | Yamamoto et al. | |
| 2003/0071661 | A1 | 4/2003 | Eguchi | |
| 2006/0198194 | A1 | 9/2006 | Ha | |
| 2010/0265760 | A1 | 10/2010 | Sakimura et al. | |
| 2011/0317496 | A1 | 12/2011 | Bunce et al. | |
| 2012/0008385 | A1* | 1/2012 | Yoo | G11C 16/10 365/185.2 |
| 2012/0038386 | A1 | 2/2012 | Uemura et al. | |
| 2014/0145773 | A1 | 5/2014 | Hashimoto | |
| 2017/0317666 | A1* | 11/2017 | Liu | H10D 89/10 |
| 2018/0054190 | A1 | 2/2018 | Takagiwa | |
| 2019/0295661 | A1 | 9/2019 | Hirashima et al. | |
| 2020/0202948 | A1 | 6/2020 | Okuyama et al. | |
| 2021/0295934 | A1 | 9/2021 | Dozaka | |
| 2022/0020404 | A1 | 1/2022 | Cho et al. | |

FOREIGN PATENT DOCUMENTS

| | | | |
|---|---|---|---|
| CN | 110299168 | A | 10/2019 |
| JP | 2007312104 | A | 11/2007 |
| JP | 2019008859 | A | 1/2019 |
| WO | 2013018217 | A1 | 2/2013 |

OTHER PUBLICATIONS

Notice of Allowance dated Jun. 28, 2022, issued in U.S. Appl. No. 17/202,661.
Office Action (Non-Final Rejection) dated Nov. 9, 2023, issued in parent U.S. Appl. No. 17/952,659.
U.S. Appl. No. 17/002,816, First Named Inventor: Junya Matsuno; Title: "Semiconductor Memory Device"; Filed: Aug. 26, 2020.
U.S. Appl. No. 17/017,726, First Named Inventor: Yousuke Hagiwara; Title: "Output Circuit"; Filed: Sep. 11, 2020.
U.S. Appl. No. 17/202,590, First Named Inventor: Masato Dome; Title: "Semiconductor Memory Device"; Filed: Mar. 16, 2021.

* cited by examiner

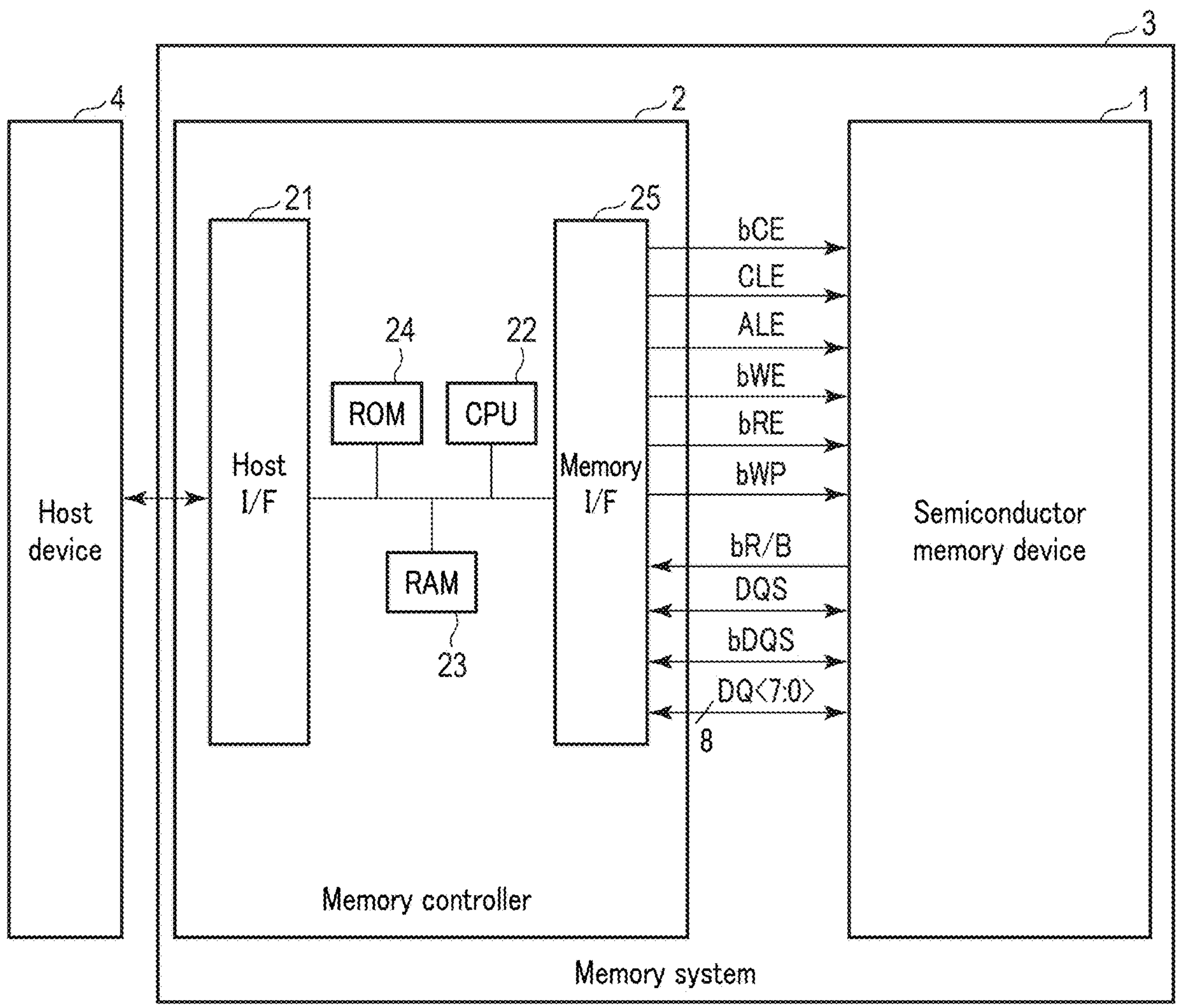
F I G. 1

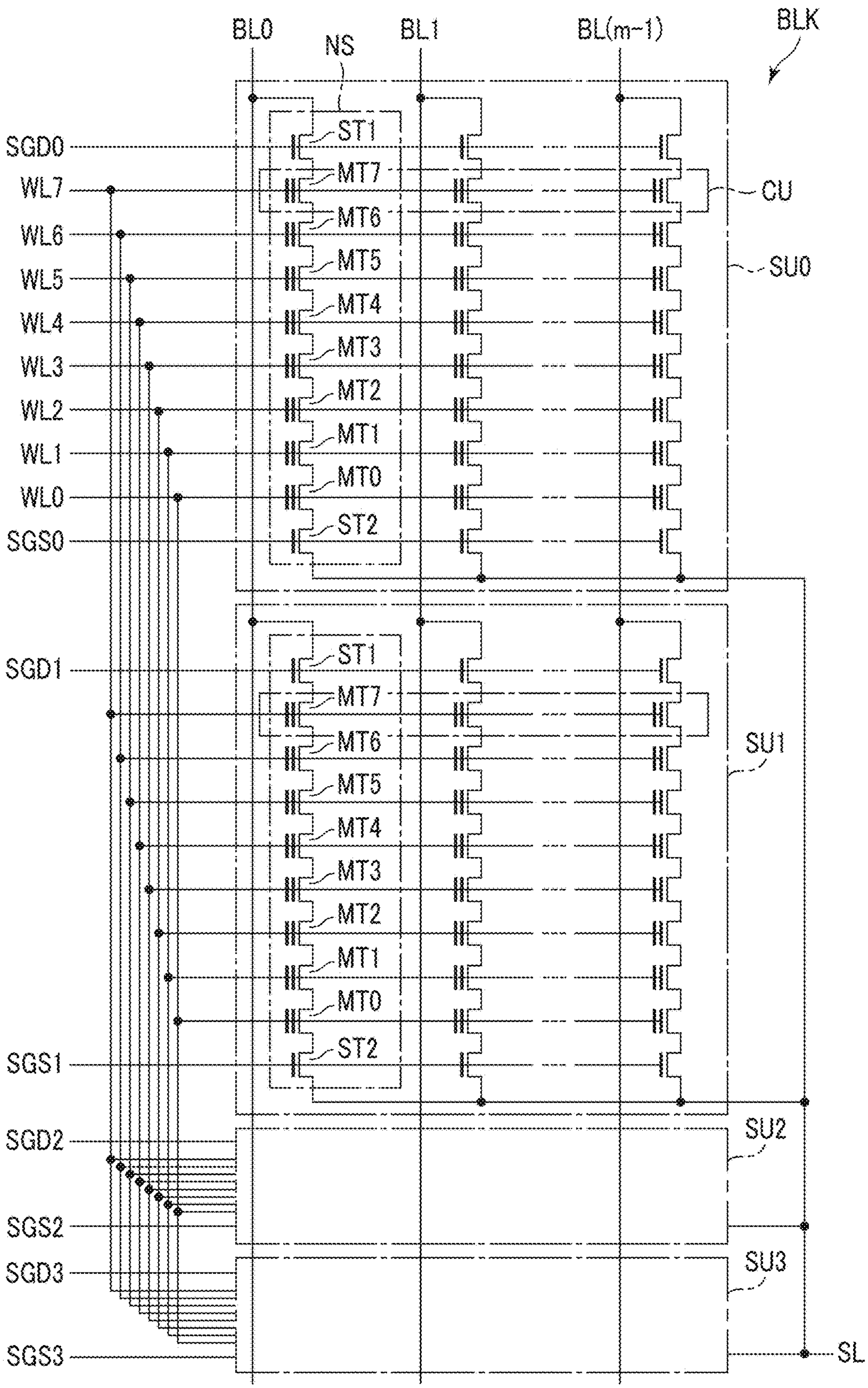
F I G. 4

| Page | Data | | | |
|---|---|---|---|---|
| Upper | 1 | 0 | 0 | 1 |
| Lower | 1 | 1 | 0 | 0 |

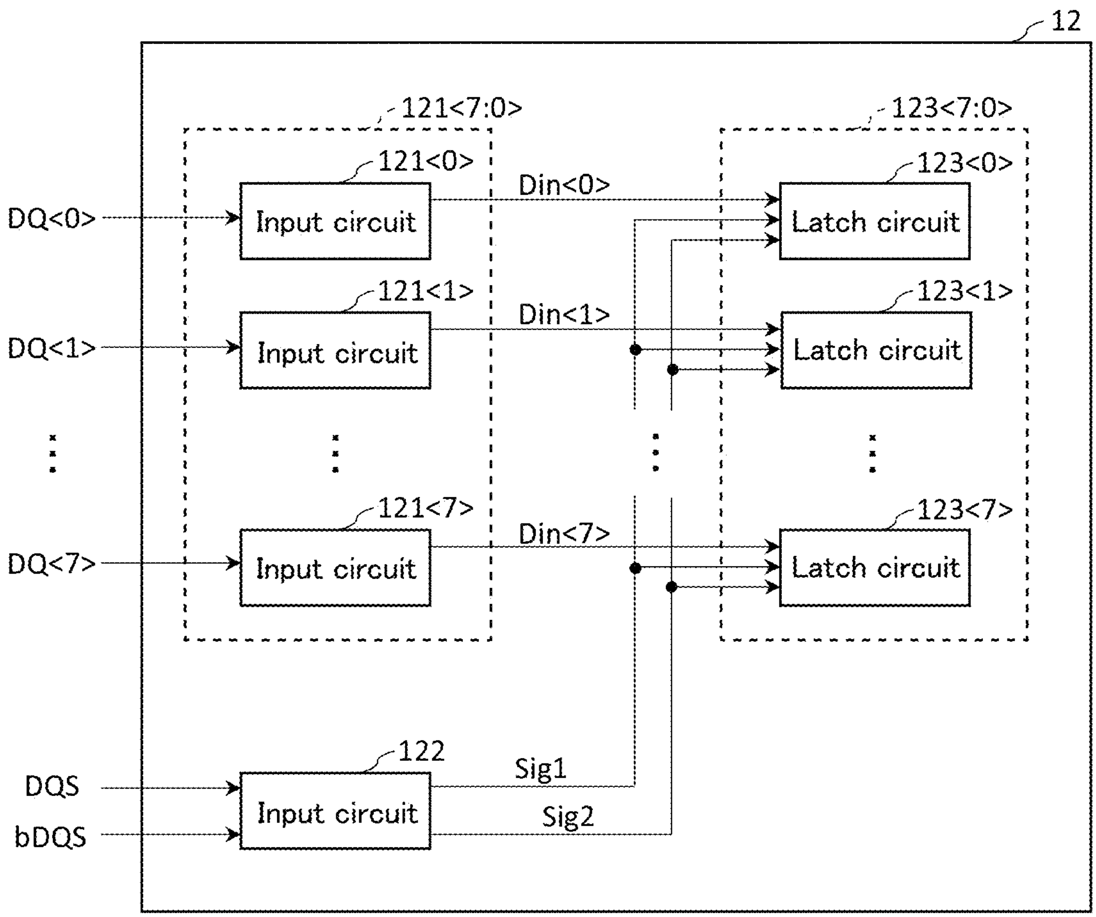
F I G. 7

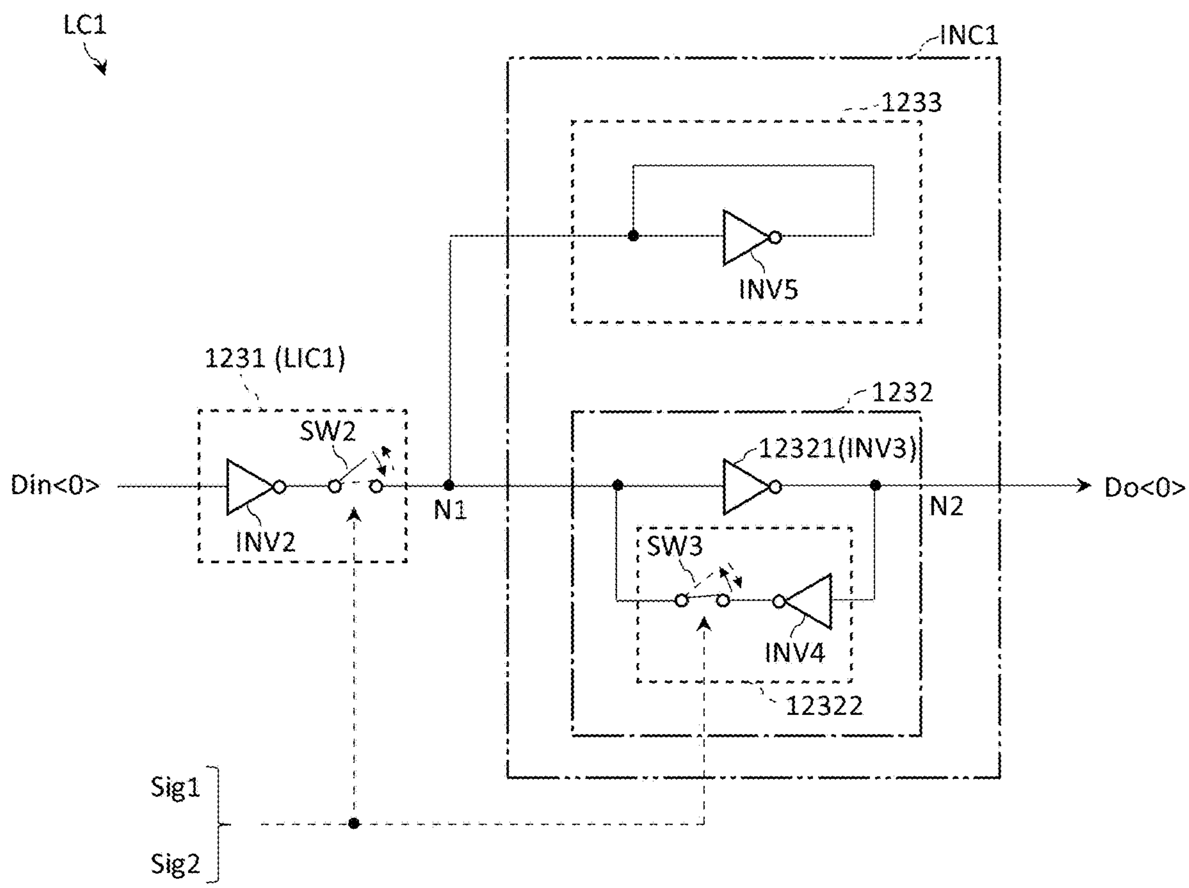
F I G. 10

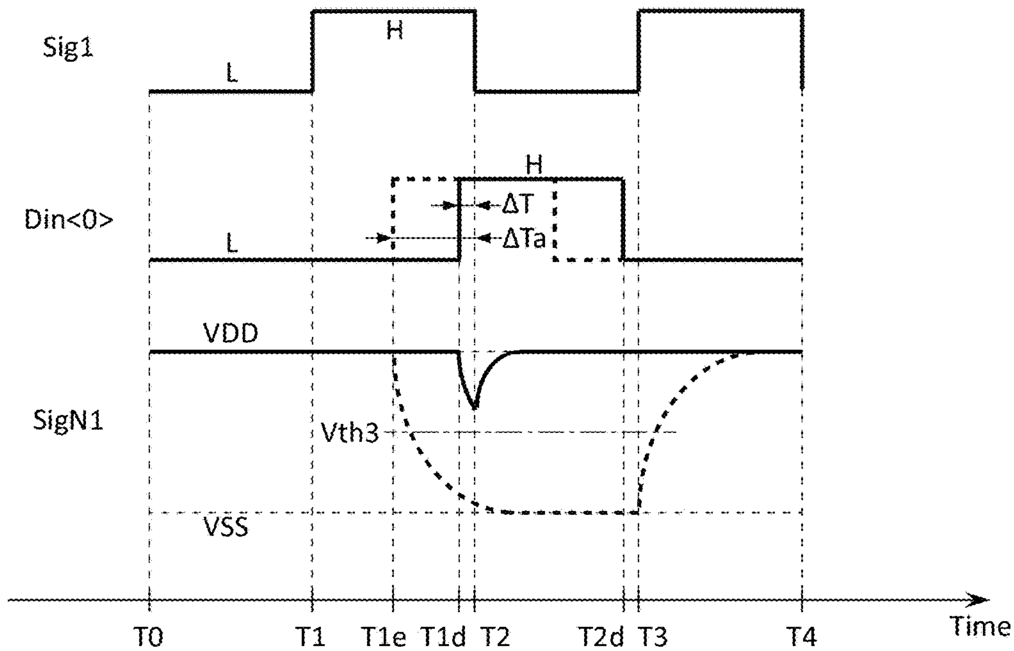
F I G. 15
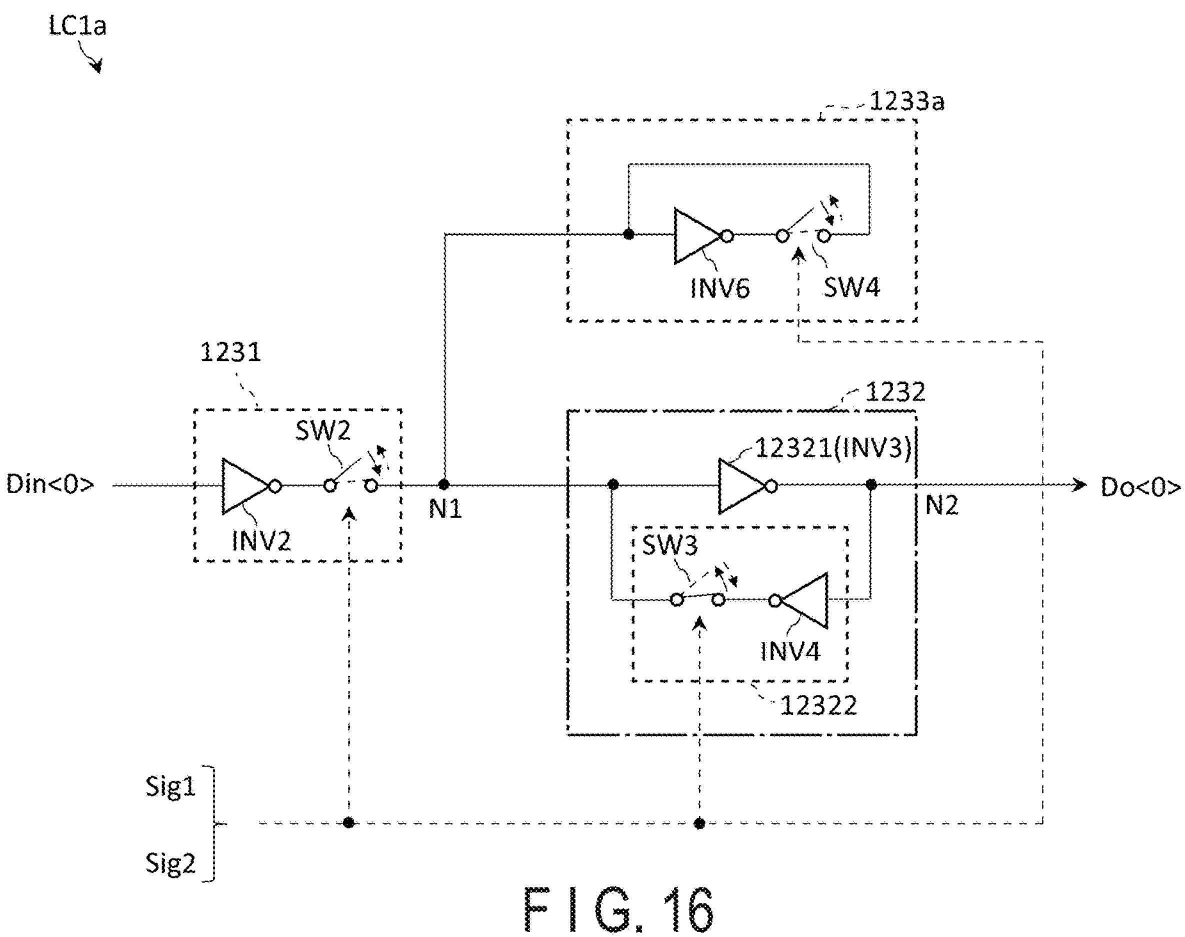
F I G. 16

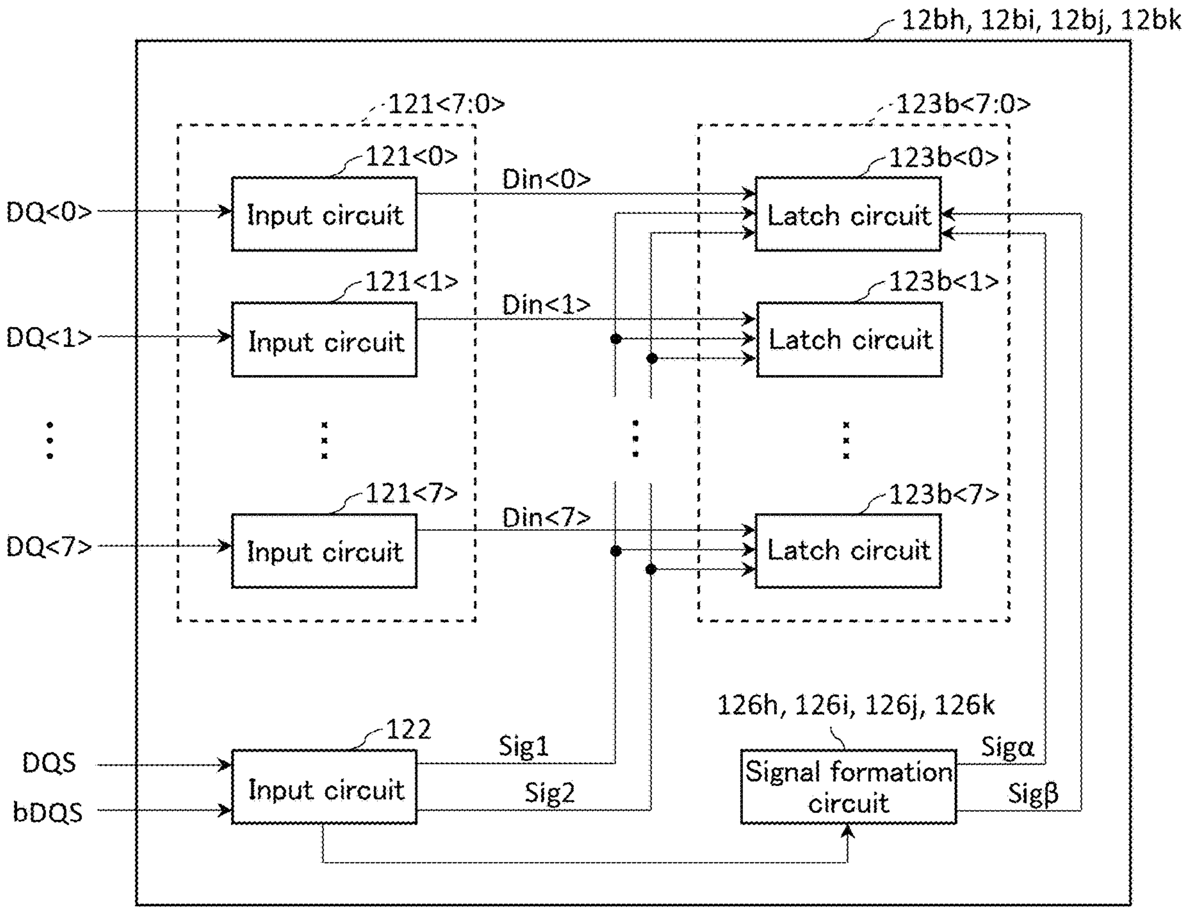
F I G. 22

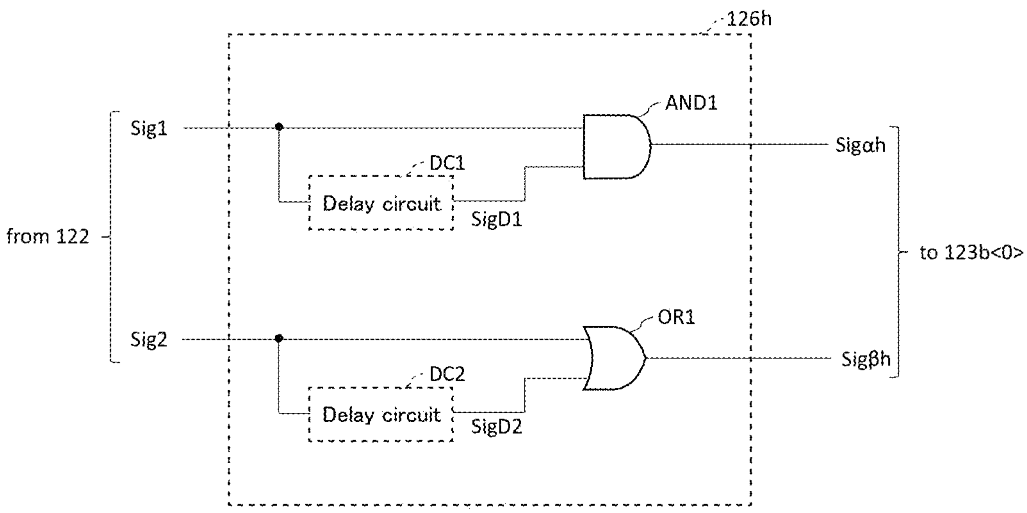
F I G. 23

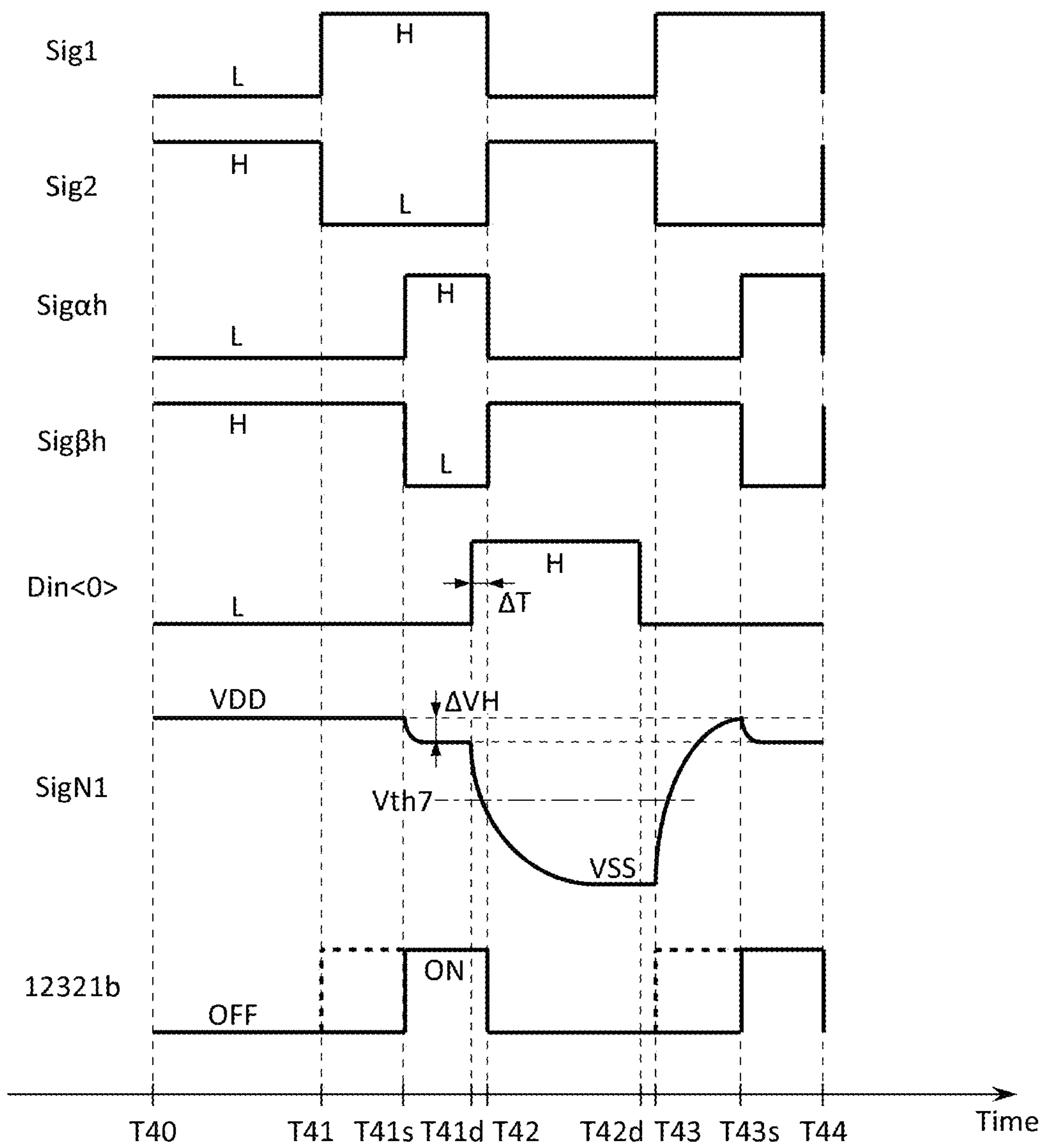
F I G. 26

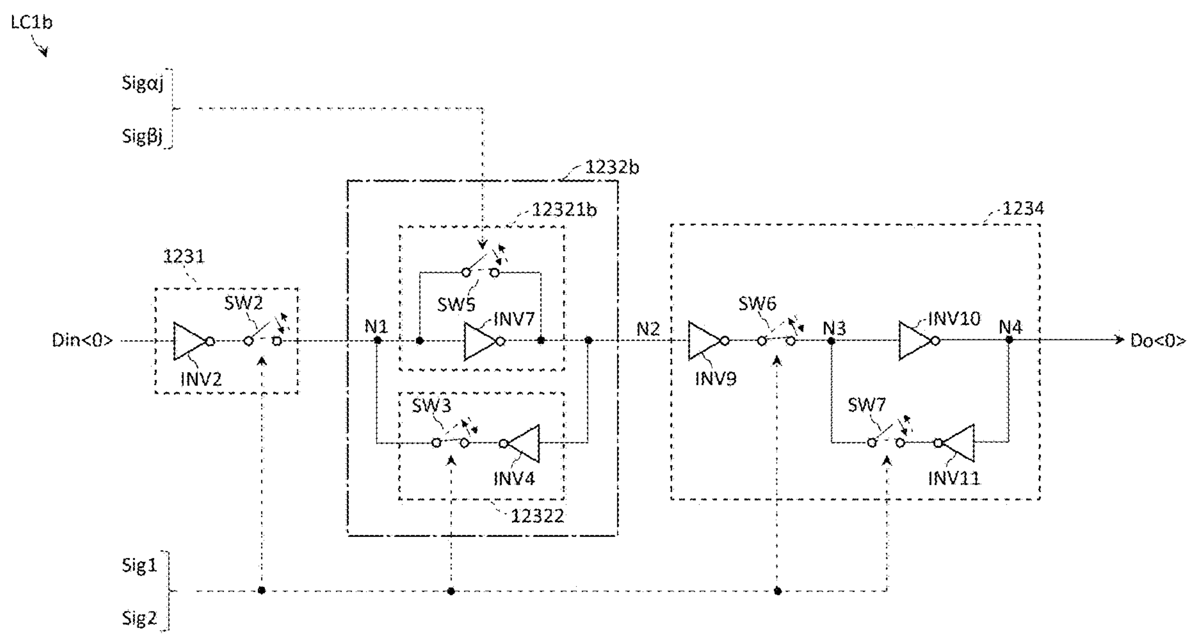
F I G. 29

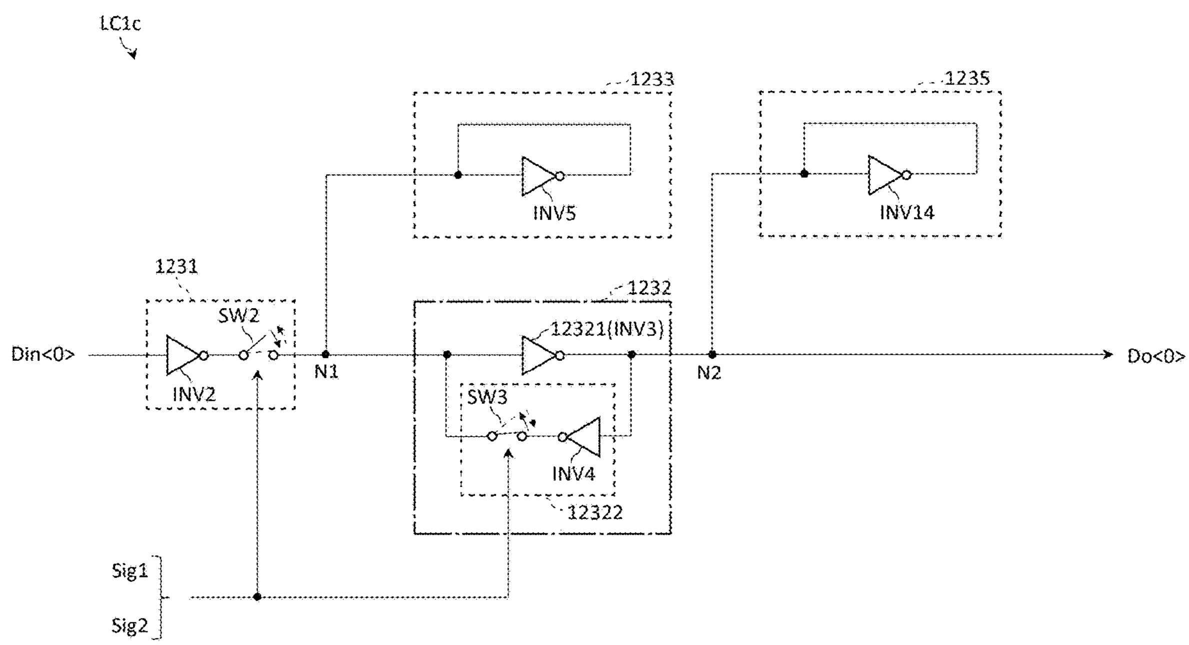
F I G. 35

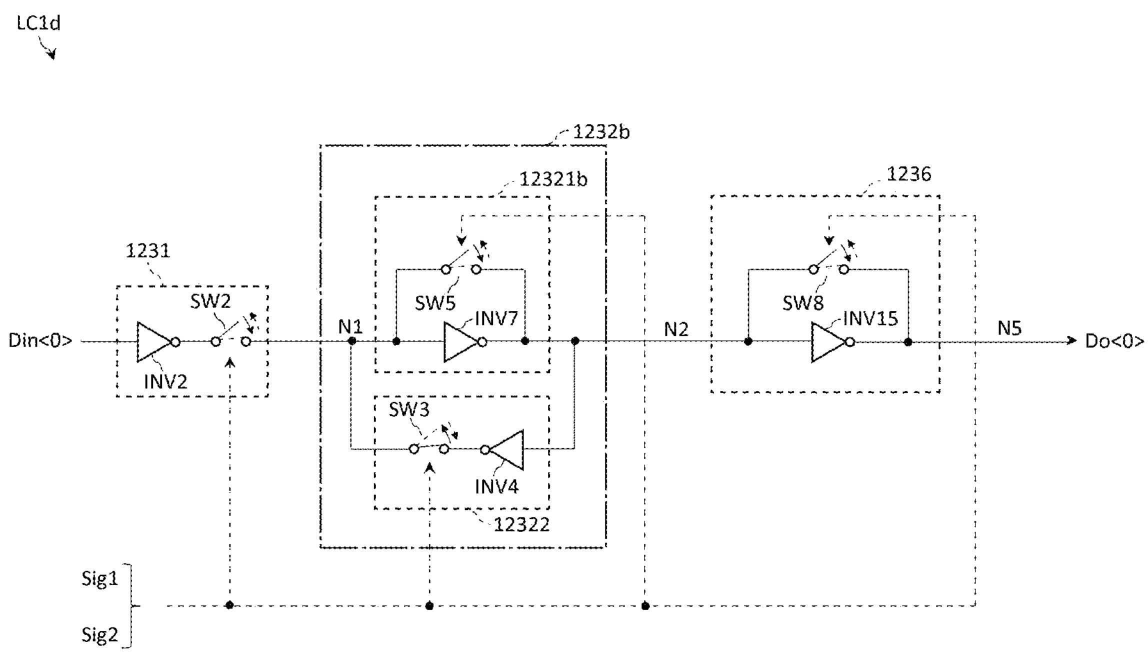
F I G. 36

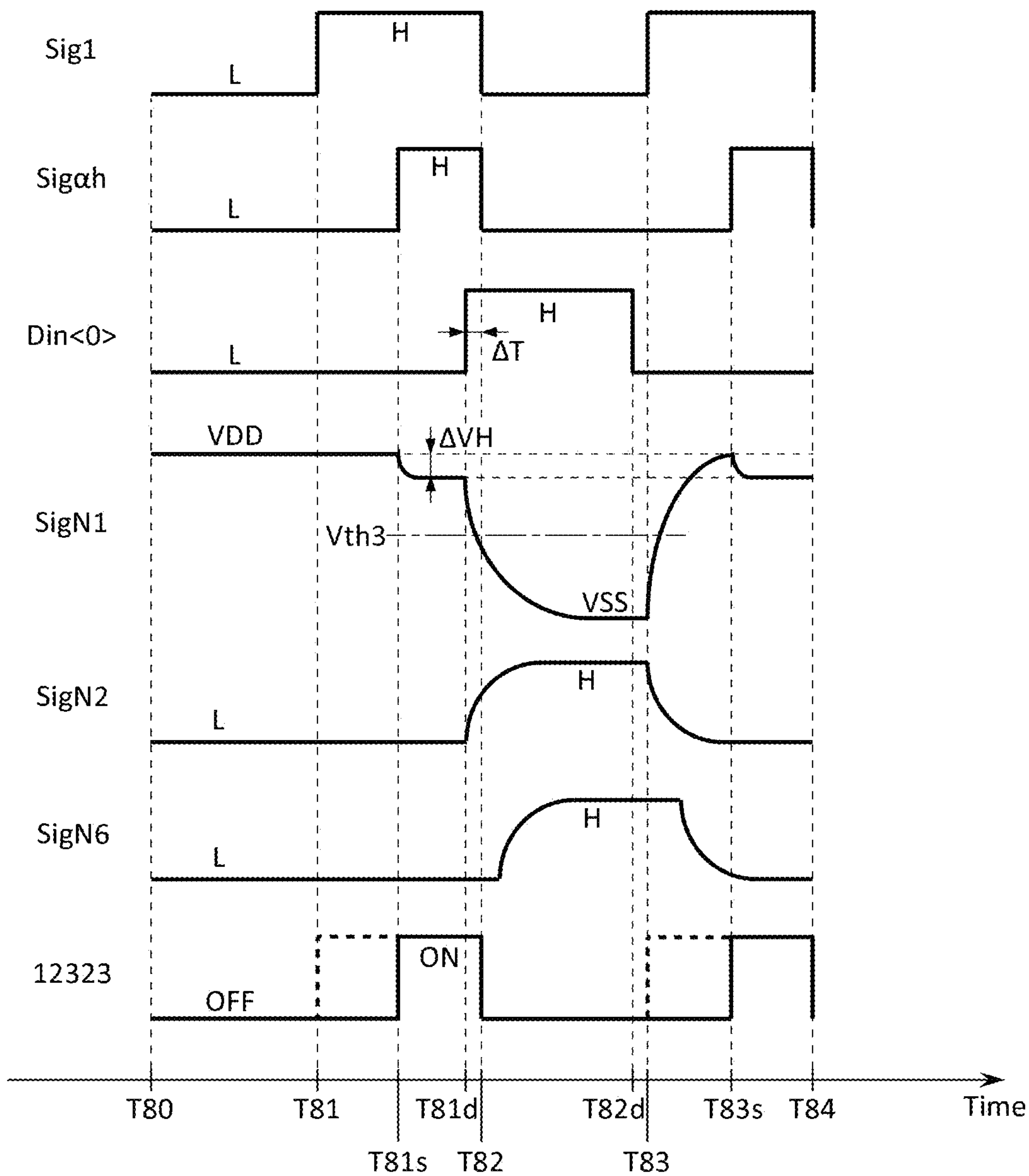
F I G. 41

SEMICONDUCTOR DEVICE INCLUDING INVERTER CIRCUIT

CROSS-REFERENCE TO RELATED APPLICATIONS

This application is a Continuation application of U.S. application Ser. No. 17/952,659, filed Sep. 26, 2022, which is a Continuation application of U.S. application Ser. No. 17/202,661, filed on Mar. 16, 2021, issued as U.S. Pat. No. 11,495,308 on Nov. 8, 2022, which is based upon and claims the benefit of priority from Japanese Patent Application No. 2020-157763, filed Sep. 18, 2020, the entire contents of all of which are incorporated herein by reference.

FIELD

Embodiments described herein relate generally to a semiconductor device.

BACKGROUND

As a semiconductor memory device, a NAND flash memory is known.

BRIEF DESCRIPTION OF THE DRAWINGS

FIG. 1 is a block diagram showing an example of a configuration of a memory system including a semiconductor memory device according to a first embodiment.

FIG. 4 shows an example of a circuit configuration of a memory cell array of the semiconductor memory device according to the first embodiment.

FIG. 7 is a block diagram showing an example of a configuration of an input/output circuit of the semiconductor memory device according to the first embodiment.

FIG. 10 shows an example of a configuration of a partial latch circuit in the latch circuit of the semiconductor memory device according to the first embodiment.

FIG. 15 shows an example of a timing chart showing temporal changes of various signals when a partial latch circuit of a semiconductor memory device according to a comparative example of the first embodiment latches data of a bit sent by a signal.

FIG. 16 shows an example of a configuration of a partial latch circuit of a semiconductor memory device according to a second embodiment.

FIG. 22 is a block diagram showing an example of a configuration of an input/output circuit of a semiconductor memory device according to a fourth embodiment.

FIG. 23 shows an example of a circuit configuration of a signal formation circuit in the input/output circuit of the semiconductor memory device according to the fourth embodiment.

FIG. 26 shows an example of a timing chart showing temporal changes of various signals when the partial latch circuit of the semiconductor memory device according to the fourth embodiment latches data of a bit sent via a signal.

FIG. 29 shows an example of a configuration of a partial latch circuit of a semiconductor memory device according to a sixth embodiment.

FIG. 35 shows an example of a configuration of a partial latch circuit of a semiconductor memory device according to an eighth embodiment.

FIG. 36 shows an example of a configuration of a partial latch circuit of a semiconductor memory device according to a ninth embodiment.

FIG. 41 shows an example of a timing chart showing temporal changes of various signals when the partial latch circuit of the semiconductor memory device according to the tenth embodiment latches data of a bit sent via a signal.

DETAILED DESCRIPTION

Figure 2:
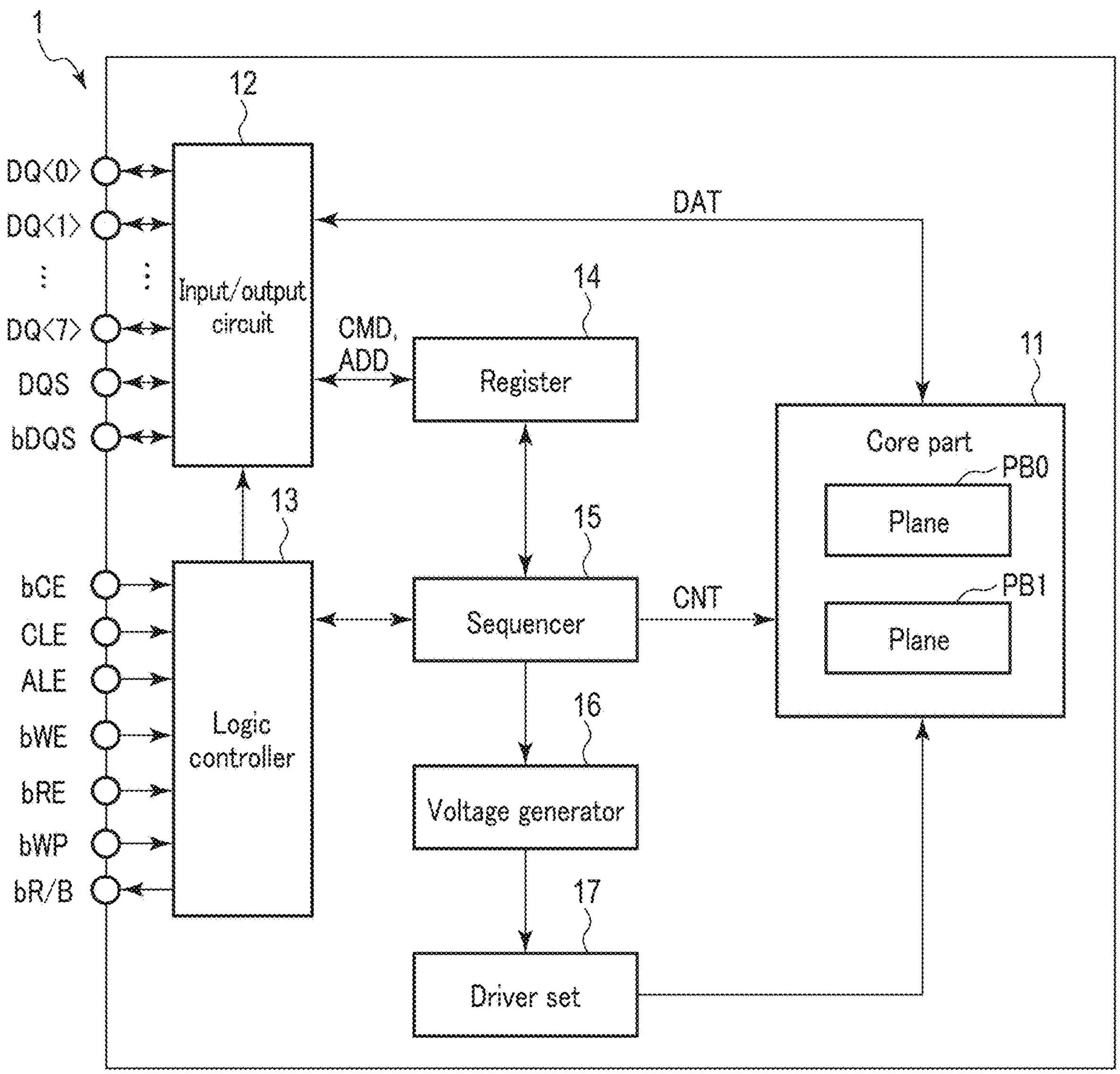
FIG. 2 is a block diagram showing an example of a configuration of the semiconductor memory device according to the first embodiment.

In general, according to an embodiment, a semiconductor device includes a first circuit, a second circuit, and a third circuit. The first circuit is configured to receive a first signal, a voltage of which changes between a first level and a second level, and output a first voltage to a first node in accordance with the voltage of the first signal being at the first level and output a second voltage to the first node in accordance with the voltage of the first signal being at the second level. The first voltage is higher than the second voltage. The second circuit is coupled to the first node and configured to latch data based on a voltage of the first node. The third circuit includes a first inverter. The first inverter includes a first input terminal coupled to the first node and a first output terminal coupled to the first node.

Hereinafter, embodiments will be described with reference to the accompanying drawings. In the following description, constituent elements having the same function and configuration will be assigned a common reference symbol. When multiple constituent elements with a common reference symbol need to be distinguished from one another, suffixes are added after the common reference symbol for distinction. When the constituent elements need not be particularly distinguished from one another, the constituent elements are assigned only the common reference symbol without suffixes.

Each function block can be implemented in the form of hardware, software, or a combination thereof. The function blocks need not necessarily be distinguished from one another as described below. For example, a function may be partly executed by a function block different from the function block described as an example. In addition, the function block described as an example may be divided into smaller function sub-blocks. The names of the function blocks and constituent elements in the following description are assigned for convenience, and do not limit the configurations or operations of the function blocks and constituent elements.

First Embodiment

Hereinafter, a semiconductor memory device 1 according to a first embodiment will be described.

Configuration Example (1) Memory System

FIG. 1 is a block diagram showing an example of a configuration of a memory system 3 including the semiconductor memory device 1 according to the first embodiment.

The memory system 3 includes a memory controller 2, as well as the semiconductor memory device 1, and is controlled by a host device 4. The memory system 3 is, for example, a solid state drive (SSD) or an SD™ card.

The semiconductor memory device 1 is controlled by the memory controller 2. The memory controller 2 receives a host command from the host device 4, and controls the semiconductor memory device 1 based on the host command.

The memory controller 2 includes a host interface circuit 21, a central processing unit (CPU) 22, a random access memory (RAM) 23, a read only memory (ROM) 24, and a memory interface circuit 25. The memory controller 2 is configured as, for example, a system-on-a-chip (SoC).

The ROM 24 stores firmware (a program). The RAM 23 can retain the firmware and is used as a work area of the CPU 22. The RAM 23 also temporarily retains data and functions as a buffer and a cache. The firmware stored in the ROM 24 and loaded into the RAM 23 is executed by the CPU 22. The memory controller 2 thereby executes various operations including a write operation, a read operation, and the like, as well as some functions of the host interface circuit 21 and the memory interface circuit 25.

The host interface circuit 21 is coupled to the host device 4 via a host interface, and controls communication between the memory controller 2 and the host device 4. For example, the host interface circuit 21 receives a host command sent from the host device 4 to the memory controller 2. The memory interface circuit 25 is coupled to the semiconductor memory device 1 via a memory interface, and controls communication between the memory controller 2 and the semiconductor memory device 1. The memory interface transfers, for example, a chip enable signal bCE, a command latch enable signal CLE, an address latch enable signal ALE, a write enable signal bWE, a read enable signal bRE, a write protect signal bWP, a ready/busy signal bR/B, input/output timing control signals DOS and bDQS, and signals DQ<0> to DQ<7>. Hereinafter, the signals DQ<0> to DQ<7> will be referred to as signals DQ<7:0>. The same applies to similar representations below. The memory interface circuit 25 generates, based on a host command from the host device 4 for example, a command set including a command and address information, and transmits the command set to the semiconductor memory device 1 via the signals DQ<7:0>.

(2) Semiconductor Memory Device

FIG. 2 is a block diagram showing an example of a configuration of the semiconductor memory device 1 according to the first embodiment. The semiconductor memory device 1 according to the first embodiment is, for example, a NAND flash memory capable of nonvolatilely storing data.

The semiconductor memory device 1 includes a core part 11, an input/output circuit 12, a logic controller 13, a register 14, a sequencer 15, a voltage generator 16, and a driver set 17.

The core part 11 includes a plurality of planes PB (planes PB0 and PB1 are shown as an example in FIG. 2). Each plane PB includes a memory cell array. In the semiconductor memory device 1, various operations are performed, such as a write operation to store write data DAT in a memory cell array of a plane, and a read operation to read read data DAT from a memory cell array of a plane.

The input/output circuit 12 controls input and output of the signals DQ<7:0> and the signals DOS and bDQS to and from the memory controller 2. The signals DQ<7:0> include a command CMD, data DAT, and address information ADD. The command CMD includes, for example, a command for causing the semiconductor memory device 1 to execute processing corresponding to the host command from the host device 4. The data DAT includes write data or read data (hereinafter, a reference symbol DAT will be used for both of the write data and the read data). The address information ADD includes, for example, a column address and a block address. The block address includes, for example, a plane address. Hereinafter, let us assume that the block address includes a plane address. The signals DOS and bDQS are signals used for enabling input and output of the signals DQ<7:0> by the input/output circuit 12. The voltages of the signals DOS and bDQS are periodically toggled to be alternately at a high (H) level and a low (L) level while data DAT is being sent via the signals DQ<7:0>, for example. While the voltage of the signal DQS is at the H level, the voltage of the signal bDQS is at the L level, and while the voltage of the signal DQS is at the L level, the voltage of the signal bDQS is at the H level. When two signals have such a relationship, each signal is also called a complementary signal of the other signal. Hereinafter, when the term "level" is used, the "level" refers a voltage level as in the above case, as long as there is no special description to the contrary.

The input and output of the signals DQ<7:0> by the input/output circuit 12 will be specifically described. The input/output circuit 12 receives write data DAT, a command CMD, and address information ADD from the memory controller 2, transfers the received write data DAT to the core part 11, and transfers the received address information ADD and command CMD to the register 14. The input/output circuit 12 receives read data DAT from the core part 11, and transmits the read data DAT to the memory controller 2.

The logic controller 13 receives from the memory controller 2, for example, a chip enable signal bCE, a command latch enable signal CLE, an address latch enable signal ALE, a write enable signal bWE, a read enable signal bRE, and a write protect signal bWP. The logic controller 13 controls the input/output circuit 12 and the sequencer 15 based on the received signal.

The chip enable signal bCE is a signal used for enabling the semiconductor memory device 1. The command latch enable signal CLE is a signal used for notifying the input/output circuit 12 that a command CMD is being sent via signals DQ<7:0> being input to the semiconductor memory device 1. The address latch enable signal ALE is a signal used for notifying the input/output circuit 12 that address information ADD is being sent via signals DQ<7:0> being input to the semiconductor memory device 1. The write enable signal bWE is a signal used for enabling input of the signals DQ<7:0> by the input/output circuit 12. The write enable signal bWE is toggled, for example while a command CMD or address information ADD is being sent via the signals DQ<7:0>. The read enable signal bRE is a signal used for enabling output of the signals DQ<7:0> by the input/output circuit 12. The write protect signal bWP is a signal used for prohibiting data writing and erasure in the semiconductor memory device 1.

The logic controller 13 generates a ready/busy signal bR/B in accordance with control by the sequencer 15, and transmits the generated ready/busy signal bR/B to the memory controller 2. The ready/busy signal bR/B is a signal used for notifying the memory controller 2 of whether the semiconductor memory device 1 is in a ready state or in a busy state. In the ready state, the semiconductor memory device 1 accepts a command from the memory controller 2. In the busy state, the semiconductor memory device 1 does not accept a command from the memory controller 2, with some exceptions.

The register 14 retains a command CMD and address information ADD transferred from the input/output circuit 12. The register 14 transfers, for example, the command CMD and address information ADD to the sequencer 15.

The sequencer 15 controls the operation of the entire semiconductor memory device 1 based on the command CMD retained in the register 14. The sequencer 15 generates a control signal CNT based on the address information ADD retained in the register 14 for example, and outputs the generated control signal CNT to the core part 11. The control signal CNT includes, for example, a block address. The control signal CNT enables control of a target plane PB of a plurality of planes PB included in the core part 11. The sequencer 15 controls the voltage generator 16, the driver set 17, and the target plane PB to execute various operations, such as a data write operation, read operation, and erase operation, on the target plane PB.

Based on the control by the sequencer 15, the voltage generator 16 generates various voltages used for, for example, a write operation, read operation, and erase operation, and supplies the generated voltages to the driver set 17.

The driver set 17 transfers, to the core part 11, various voltages used in, for example, a write operation and read operation among the voltages supplied from the voltage generator 16, and the like.

(3) Plane

Figure 3:
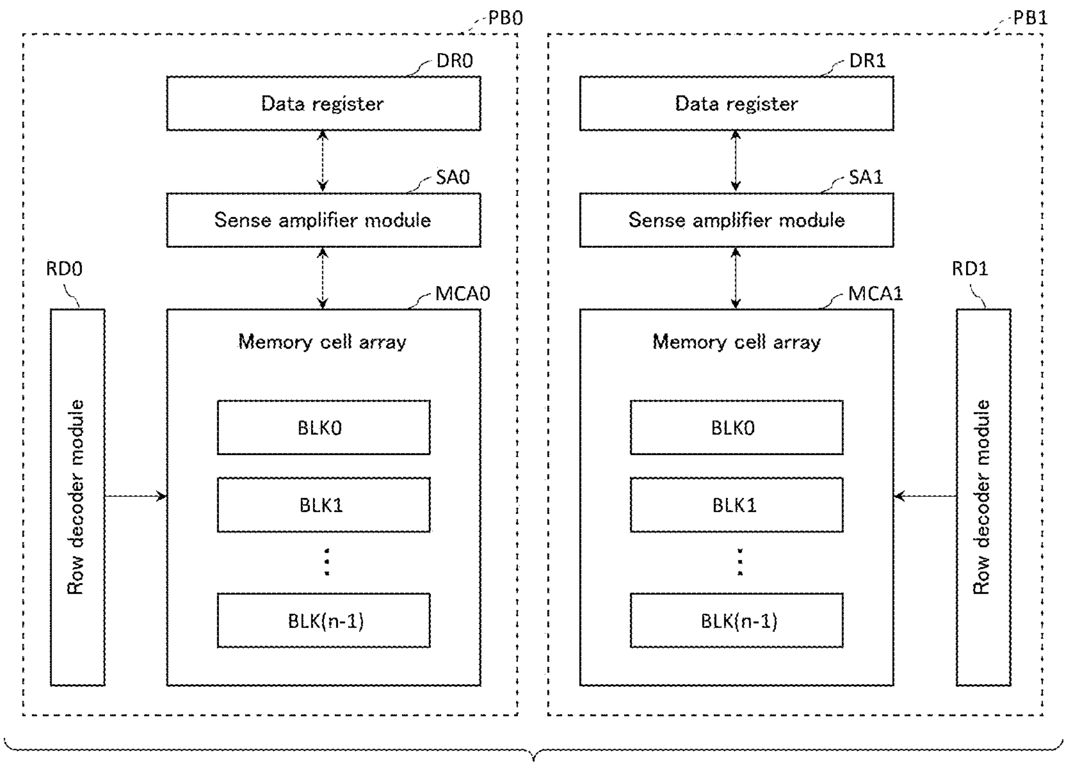
FIG. 3 is a block diagram showing an example of a configuration of a plane of the semiconductor memory device according to the first embodiment.

FIG. 3 is a block diagram showing an example of a configuration of each of the planes PB0 and PB1 of the semiconductor memory device 1 according to the first embodiment.

The plane PB0 includes a memory cell array MCA0, a row decoder module RD0, a data register DR0, and a sense amplifier module SA0.

The plane PB1 includes a memory cell array MCA1, a row decoder module RD1, a data register DR1, and a sense amplifier module SA1.

A configuration of the plane PB0 will be described on the assumption that the control signal CNT designates the plane PB0 as a target plane.

The memory cell array MCA0 includes blocks BLK0 to BLK(n−1) (where n is an integer not less than 1). Each block BLK includes a plurality of non-volatile memory cells each associated with a bit line and a word line, and corresponds to a data erase unit, for example. For example, a single-level cell (SLC) mode, multi-level cell (MLC) mode, three-level cell (TLC) mode, and quad-level cell (QLC) mode can be applied to the semiconductor memory device 1. Each memory cell retains 1-bit data in the SLC mode, 2-bit data in the MLC mode, 3-bit data in the TLC mode, and 4-bit data in the QLC mode. Each memory cell may be configured to retain 5-or-more-bit data.

The row decoder module RD0 receives a block address in the address information ADD retained in the register 14, and selects a target block BLK and the like, on which various operations, such as a read operation and a write operation, are executed, based on the block address. The row decoder module RD0 can transfer various voltages supplied from the driver set 17 to the selected block BLK.

The data register DR0 is coupled to the input/output circuit 12 via a data bus. The data bus consists of, for example, eight data lines, which correspond to the signals DQ<7:0>, respectively. The data register DR0 includes a plurality of latch circuits. The data register DR0 receives write data DAT from the input/output circuit 12, temporarily retains the write data DAT in a plurality of latch circuits, and transfers the retained write data DAT to the sense amplifier module SA0. The data register DR0 receives read data DAT from the sense amplifier module SA0 and temporarily retains the read data DAT in a plurality of latch circuits. The data register DR0 receives, for example, a column address in the address information ADD retained in the register 14, and transfers the retained read data DAT to the input/output circuit 12, based on the column address.

The sense amplifier module SA0 receives write data DAT from the data register DR0, and transfers the write data DAT to the memory cell array MCA0. The sense amplifier module SA0 senses the threshold voltages of a plurality of memory cell transistors in the memory cell array MCA0 to generate read data DAT, and outputs the read data DAT to the data register DR0.

The same description as the above description for the plane PB0 applies to the plane PB1. For example, the plane PB0, memory cell array MCA0, row decoder module RD0, data register DR0, and sense amplifier module SA0 in the above description may be replaced with the plane PB1, memory cell array MCA1, row decoder module RD1, data register DR1, and sense amplifier module SA1, respectively. Accordingly, each plane PB included in the core part 11 may have the same configuration as the configuration described for the plane PB0.

(4) Memory Cell Array

Hereinafter, details of the configuration of the memory cell array MCA0 of the plane PB0 will be described. The memory cell array MCA of each plane PB included in the core part 11 may have the same configuration as the configuration to be described below.

FIG. 4 shows an example of a circuit configuration of the memory cell array MCA0 of the semiconductor memory device 1 according to the first embodiment. As an example of the circuit configuration of the memory cell array MCA0, FIG. 4 shows an example of a circuit configuration of a block BLK included in the memory cell array MCA0. Each of the blocks BLK included in the memory cell array MCA0 may have the same circuit configuration as that shown in FIG. 4.

The block BLK includes, for example, four string units SU0 to SU3. Each string unit SU includes a plurality of NAND strings NS. The NAND strings NS are in one-to-one correspondence with respective m bit lines BL0 to BL(m−1) (where m is an integer not less than 1). Each NAND string NS is coupled to a corresponding bit line BL, and includes, for example, memory cell transistors MT0 to MT7 and select transistors ST1 and ST2. Each memory cell transistor MT includes a control gate (hereinafter also referred to as a "gate") and a charge storage layer, and nonvolatilely stores data. The select transistors ST1 and ST2 are used in various operations to select the NAND string NS including the select transistors ST1 and ST2.

The drain of the select transistor ST1 is coupled to a bit line BL corresponding to the NAND string NS including the select transistor ST1. Memory cell transistors MT0 to MT7 are coupled in series between the source of the select transistor ST1 and the drain of the select transistor ST2 of the NAND string NS. The source of the select transistor ST2 is coupled to a source line SL.

In the example of FIG. 4, the following description applies to each of the cases where p is an integer from 0 to 3, and each of the cases where q is an integer from 0 to 7. The gates of the select transistors ST1 of the NAND strings NS included in a string unit SUp are coupled in common to a select gate line SGDp. The gates of the select transistors ST2 of the NAND strings NS included in the string unit SUp are coupled in common to a select gate line SGSp. The gates of the memory cell transistors MTq of the NAND strings NS included in the same block BLK are coupled in common to a word line WLq.

Each bit line BL is coupled to the drains of the select transistors ST1 of the corresponding NAND strings NS included in the respective string units SU of the same block BLK. The source line SL is shared by a plurality of string units SU.

A set of memory cell transistors MT coupled in common to one word line WL in one string unit SU is called, for example, a "cell unit CU". A set of 1-bit data of the same order retained in the memory cell transistors MT in a cell unit CU is referred to as, for example, "1-page data". Each cell unit CU may retain a plurality of "1-page data" items.

A circuit configuration of the memory cell array MCA0 is described above; however, the circuit configuration of the memory cell array MCA0 is not limited thereto. For example, the number of string units SU included in each block BLK may be any number. The number of memory cell transistors MT, the number of select transistors ST1, and the number of select transistors ST2 in each NAND string NS may also be any number. The number of word lines WL, the number of select gate lines SGD, and the number of select gate lines SGS are changed based on the number of memory cell transistors MT, the number of select transistors ST1, and the number of select transistors ST2 in each NAND string NS.

Figure 5:
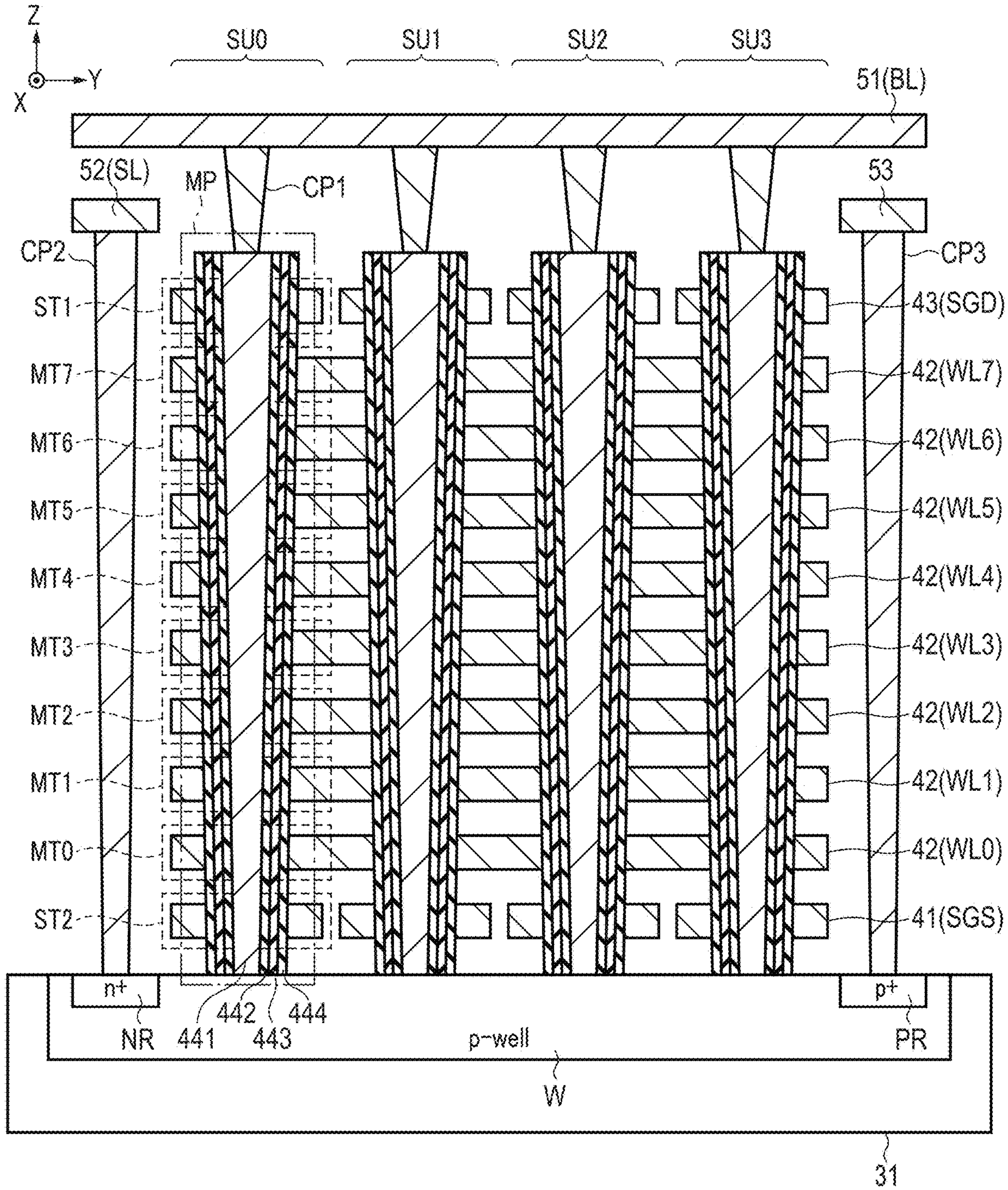
FIG. 5 is a cross-sectional view showing an example of a cross-sectional structure of a part of the semiconductor memory device according to the first embodiment.

FIG. 5 is a cross-sectional view showing an example of a cross-sectional structure of a part of the semiconductor memory device 1 according to the first embodiment. In the example of FIG. 5, interlayer insulators are omitted. The cross-sectional structure shown in FIG. 5 is merely an example, and the cross-sectional structure of the semiconductor memory device 1 is not limited thereto.

Hereinafter, a structure of a block BLK of the memory cell array MCA0 will be described with reference to FIG. 5. Each of the blocks BLK included in the memory cell array MCA0 may be implemented by the same structure as that shown in FIG. 5.

The semiconductor memory device 1 includes a semiconductor substrate 31. Two directions parallel to the surface of the semiconductor substrate 31 and intersecting each other are defined as an X direction and a Y direction. A direction intersecting the surface, in which the memory cell array MCA0 is formed, is defined as a Z direction. Descriptions will be provided on the assumption that the X direction is orthogonal to the Y direction, and the Z direction is orthogonal to the X direction and the Y direction; however, the relationship between the three directions is not limited thereto. Hereinafter, the Z direction will be taken as "upward" and the direction opposite to the Z direction will be taken as "downward"; however, this perception is merely for convenience and is irrelevant to, for example, the direction of gravitational force.

A p-type well region W is provided in the semiconductor substrate 31. The p-type well region W reaches the upper surface of the semiconductor substrate 31. The p-type well region W is a region of the semiconductor substrate 31 doped with, for example, boron (B).

Above the p-type well region W, a region in which the memory cell transistors MT0 to MT7 and select transistors ST1 and ST2 of the string unit SU0 are positioned, a similar region of the string unit SU1, a similar region of the string unit SU2, and a similar region of the string unit SU3 are provided in order along, for example, the Y direction. Details will be described below.

A conductor 41 is provided above the p-type well region W with an insulator interposed therebetween. The conductor 41 functions as one select gate line SGS. For each string unit SU, a conductor 41 corresponding to the string unit SU is provided. The conductors 41 are provided at intervals along, for example, the Y direction. The conductors 41 are formed by, for example, dividing a conductor expanding in the X direction and the Y direction. Each conductor 41 extends in, for example, the X direction.

Above the conductors 41, eight layers of conductors 42 are sequentially stacked with an insulator interposed between adjacent conductors. The conductors 42 function as, for example, in order of decreasing proximity to the semiconductor substrate 31, a word line WL0, a word line WL1, a word line WL2, . . . , and a word line WL7. Each conductor 42 expands in, for example, the X direction and the Y direction.

A conductor 43 is provided above the uppermost conductor 42 with an insulator interposed therebetween. The conductor 43 functions as one select gate line SGD. For each string unit SU, a conductor 43 corresponding to the string unit SU is provided. The conductors 43 are provided at intervals along, for example, the Y direction. The conductors 43 are formed by, for example, dividing a conductor expanding in the X direction and the Y direction. Each conductor 43 extends in, for example, the X direction.

A memory pillar MP is provided in the conductor 41, conductor 43, and eight layers of conductors 42 corresponding to the string unit SU0. The memory pillar MP corresponds to a region in which memory cell transistors MT0 to MT7 and select transistors ST1 and ST2 included in one NAND string NS of the string unit SU0 are positioned. The memory pillar MP extends in, for example, the Z direction. For example, the upper end of the memory pillar MP is positioned above the upper surface of the conductor 43, and the lower end of the memory pillar MP reaches the p-type well region W. Hereinafter, such a memory pillar MP will also be referred to as a memory pillar corresponding to the string unit SU0. The same applies to similar representations below.

The memory pillar MP includes, for example, a semiconductor 441 and insulating films 442, 443, and 444. The semiconductor 441 is pillar-shaped, and the upper end of the semiconductor 441 reaches the upper end of the memory pillar MP, whereas the lower end of the semiconductor 441 reaches the p-type well region W. The insulating films 442, 443, and 444 are provided on the side surface of the semiconductor 441 in order of appearance. The semiconductor 441 functions as a channel of the memory cell transistors MT and select transistors ST. The insulating film 442 functions as a tunnel oxide film of the memory cell transistors MT and select transistors ST. The insulating film 443 functions as a charge storage layer of the memory cell transistors MT. The insulating film 444 functions as a block insulating film of the memory cell transistors MT and select transistors ST. A portion of the memory pillar MP intersecting the conductor 41 functions as, for example, the select transistor ST2. Portions of the memory pillar MP intersecting the conductors 42 function as, in order of decreasing proximity to the semiconductor substrate 31, the memory cell transistor MT0, the memory cell transistor MT1, . . . , and the memory cell transistor MT7, for example. A portion of the memory pillar MP intersecting the conductor 43 functions as, for example, the select transistor ST1.

A pillar-shaped contact plug CP1 is provided on the upper surface of the semiconductor 441. The upper surface of the contact plug CP1 is in contact with a conductor 51 in a layer in which bit lines are provided. The conductor 51 functions as a bit line BL. The conductor 51 extends in, for example, the Y direction.

For each of the other three string units SU, a memory pillar MP corresponding to the string unit SU is provided in a similar manner. Each of these memory pillars MP is connected to the conductor 51 via a contact plug CP1.

A plurality of conductors 51 are provided at intervals along, for example, the X direction. The conductors 51 each extend in, for example, the Y direction. For each conductor 51, a structure of four memory pillars MP corresponding to the string units SU0, SU1, SU2, and SU3, which is connected to the conductor 51, as described above, is provided.

An $n^+$ impurity diffusion region NR and a $p^+$ impurity diffusion region PR are provided in the p-type well region W. The $n^+$ impurity diffusion region NR and the $p^+$ impurity diffusion region PR each reach the upper surface of the semiconductor substrate 31. The $n^+$ impurity diffusion region NR is a region of the semiconductor substrate 31 doped with, for example, phosphorus (P). The $p^+$ impurity diffusion region PR is a region of the semiconductor substrate 31 further doped with, for example, boron (B).

A pillar-shaped contact plug CP2 is provided on the $n^+$ impurity diffusion region NR. The upper surface of the contact plug CP2 is in contact with a conductor 52. The conductor 52 functions as a source line. A pillar-shaped contact plug CP3 is provided on the $p^+$ impurity diffusion region PR. The upper surface of the contact plug CP3 is in contact with a conductor 53. The voltage of the p-type well region W can be controlled via the conductor 53.

Shown in FIGS. 4 and 5 is an example in which four select gate lines SGS and four conductors 41 are provided respectively for four string units SU included in a block BLK; however, the embodiment is not limited thereto. Only one select gate line SGS and one conductor 41 may be provided for four string units SU included in a block BLK. The gates of the select transistors ST2 in the four string units SU0 to SU3 may be electrically coupled to one another.

(5) Threshold Voltage Distribution of Memory Cell Transistors

Figure 6:
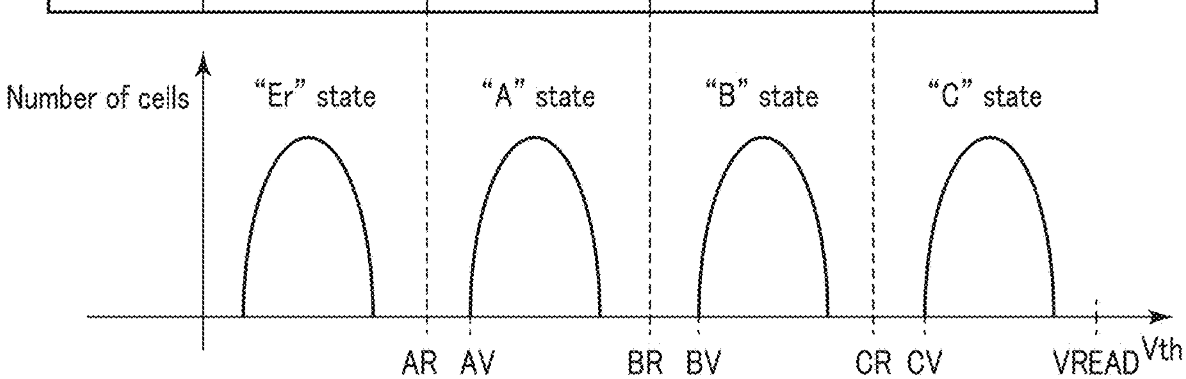
FIG. 6 shows an example of a threshold voltage distribution formed by memory cell transistors of the semiconductor memory device according to the first embodiment.

FIG. 6 shows an example of a threshold voltage distribution, data allocation, read voltages, and verify voltages in the case where each memory cell transistor MT in the memory cell array MCA0 shown in FIG. 4 retains 2-bit data. The following description is applicable to the memory cell array MCA of each plane PB included in the core part 11.

The memory cell transistors MT each retain the 2-bit data based on the minimum voltage difference (hereinafter referred to as a "threshold voltage") between the gate and source, which enables switching of the memory cell transistor MT from OFF to ON. In a write operation, a program operation to raise the threshold voltage of a memory cell transistor MT by injecting electrons into the charge storage layer of the memory cell transistor MT is performed.

As an example of four threshold voltage distribution lobes formed as a result of such threshold voltage control, FIG. 6 schematically shows an example of a graph in which the number of memory cell transistors MT whose threshold voltages take a particular value is plotted by using that value as a variable. The horizontal axis indicates values of threshold voltages of memory cell transistors MT. The vertical axis indicates the number of memory cell transistors MT.

The four threshold voltage distribution lobes correspond to, for example, an "Er" state, "A" state, "B" state, and "C" state, respectively. Accordingly, the memory cell transistors MT are distinguished as being in the "Er" state, "A" state, "B" state, and "C" state in accordance with the threshold voltages of the memory cell transistors MT. The threshold voltages of the memory cell transistors MT increase in the order of the "Er" state, "A" state, "B" state, and "C" state. For example, data "11" ("upper bit/lower bit") is allocated to the "Er" state, data "01" is allocated to the "A" state, data "00" is allocated to the "B" state, and data "10" is allocated to the "C" state. The data allocated to each state is the data stored in a memory cell transistor MT in the state.

In a write operation, a verify operation to verify whether or not the threshold voltage of a memory cell transistor MT has exceeded a predetermined voltage is performed. Verify voltages for use in the verify operation are set. Specifically, a verify voltage AV is set for the "A" state, a verify voltage BV is set for the "B" state, and a verify voltage CV is set for the "C" state.

The case where the verify voltage AV is applied between the gate and source of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be verified whether or not the threshold voltage of a write-target memory cell transistor MT has been included in the threshold voltage distribution lobe of one of the "A" state, "B" state, and "C" state as a result of, for example, a write operation to write data "01". The same applies to the other verify voltages BV and CV.

In a read operation, which state each memory cell transistor MT is in is judged. Read voltages for use in a read operation are set. Specifically, a read voltage AR is set for the "A" state, a read voltage BR is set for the "B" state, and a read voltage CR is set for the "C" state.

The case where the read voltage AR is applied between the gate and source of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be judged whether the memory cell transistor MT is in the "Er" state or in one of the "A" state, "B" state, and "C" state. The same applies to the read voltages BR and CR.

Before a read operation is executed, some of the electrons stored in the charge storage layer of a memory cell transistor MT may escape from the charge storage layer with the passage of time, causing a drop in the threshold voltage of the memory cell transistor MT. To cope with such a drop in the threshold voltage, each read voltage is set to be lower than the verify voltage set for the same state as the read voltage. That is, the read voltage AR is lower than the verify voltage AV, the read voltage BR is lower than the verify voltage BV, and the read voltage CR is lower than the verify voltage CV.

In addition, a read pass voltage VREAD is set to be always larger than the threshold voltages of the memory cell transistors MT in the "C" state, which is the highest-voltage state. When the read pass voltage VREAD is applied between the gate and source of a memory cell transistor MT, the memory cell transistor MT is turned on regardless of data stored therein.

The above-described number of bits of data stored in one memory cell transistor MT and allocation of data to the threshold voltage distribution lobes are mere examples, and the embodiment is not limited thereto.

(6) Input/Output Circuit

Details of a configuration of the input/output circuit 12 will be described below. Hereinafter, the case where data DAT is sent via signals DQ<7:0> will be described as an example. The following description applies to each of the cases where r is an integer from 0 to 7.

While data DAT is being sent via signals DQ<7:0>, a signal DQ<r> is either at the H level or at the L level every period of time having a given length. The period of time is a unit of time in which, for example, 1-bit data is sent.

FIG. 7 is a block diagram showing an example of a configuration of the input/output circuit 12 of the semiconductor memory device 1 according to the first embodiment.

The input/output circuit 12 includes input circuits 121<7:0>, an input circuit 122, and latch circuits 123<7:0>.

An input circuit 121<r> receives a signal DQ<r>, generates a signal Din<r> based on the signal DQ<r>, and outputs the signal Din<r> to a latch circuit 123<r>. The signal Din<r> corresponds to, for example, a signal obtained by amplifying the voltage of the signal DQ<r>. Part of the data DAT sent via the signal DQ<r> is sent via the signal Din<r>.

The input circuit 122 receives the signal DOS and signal bDQS, generates a signal Sig1 and signal Sig2 based on the signal DOS and signal bDQS, and outputs the signal Sig1 and signal Sig2 to each of the latch circuits 123<7:0>. The signal Sig1 corresponds to, for example, a signal obtained by amplifying the voltage of the signal DOS. The signal Sig2 is a complementary signal of the signal Sig1.

Figure 8:
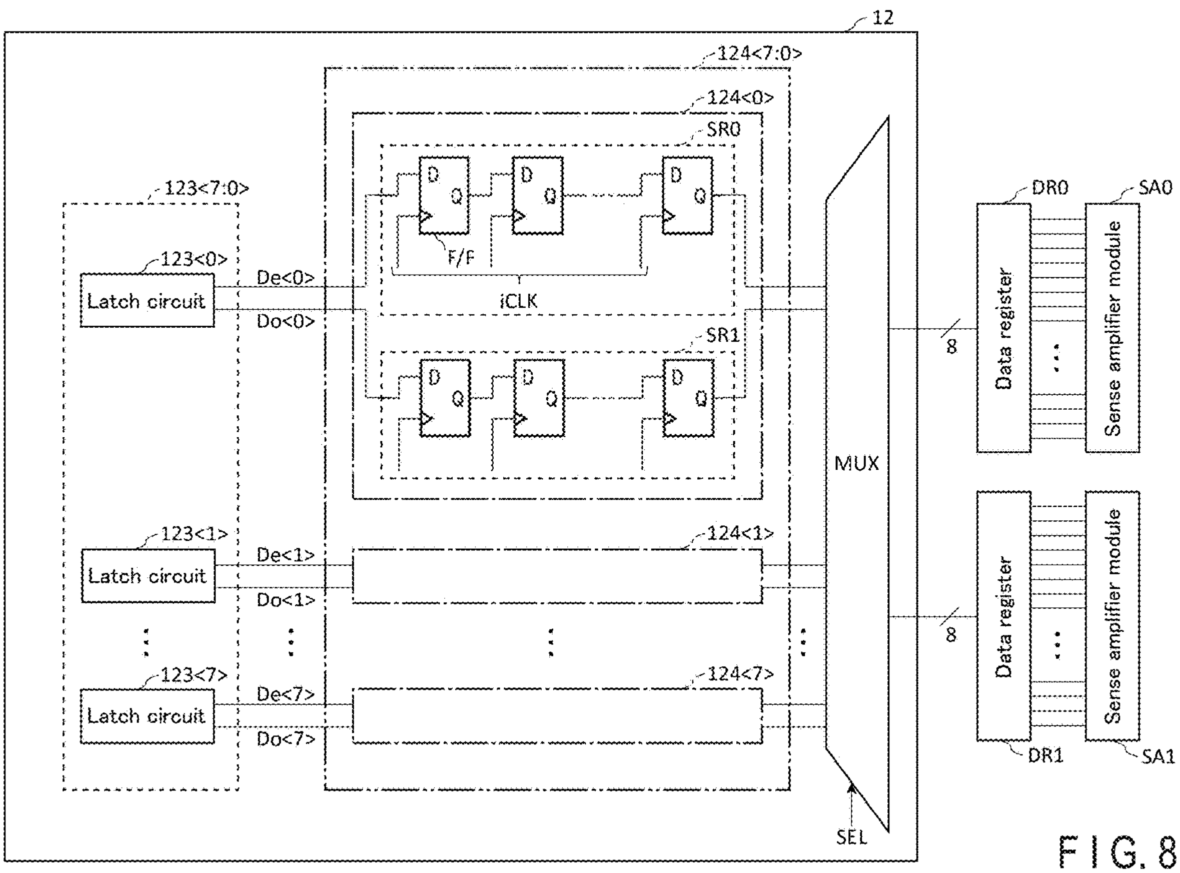
FIG. 8 is a block diagram showing an example of a further configuration of the input/output circuit of the semiconductor memory device according to the first embodiment.

The latch circuit 123<r> receives the signal Din<r> from the input circuit 121<r>, and receives the signals Sig1 and Sig2 from the input circuit 122. Based on, for example, the signal Din<r>, signal Sig1, and signal Sig2, the latch circuit 123<r> latches part of the data DAT sent via the signal DQ<r> in order of data of the 0-th bit, data of the first bit, data of the second bit, FIG. 8 is a block diagram showing an example of a further configuration of the input/output circuit 12 of the semiconductor memory device 1 according to the first embodiment.

The input/output circuit 12 further includes shift register circuits 124<7:0> and a multiplexer MUX.

The latch circuit 123<r> outputs latched data of each bit to a shift register circuit 124<r>. Specifically, the latch circuit 123<r> outputs a signal De<r> and a signal DQ<r> to the shift register circuit 124<r>. The data of the 0-th bit, data of the second bit, data of the fourth bit, . . . (hereinafter those bits are also referred to as even-numbered bits of the signal DQ<r>), which are latched by the latch circuit 123<r>, are sent via the signal De<r> in order of appearance. The data of the first bit, data of the third bit, data of the fifth bit, . . . (hereinafter those bits are also referred to as odd-numbered bits of the signal DQ<r>), which are latched by the latch circuit 123<r>, are sent via the signal DQ<r> in order of appearance.

A shift register circuit 124<0> includes shift registers SR0 and SR1. The same applies to the other shift register circuits 124. Hereinafter, the shift register circuit 124<0> will be described as an example; however, the other shift register circuits 124<7:1> have the same configuration as that to be described for the shift register circuit 124<0>.

The shift register SR0 includes a plurality of flip-flop circuits F/F. Each flip-flop circuit F/F is, for example, a D flip-flop circuit. The flip-flop circuits F/F are coupled in series in such a manner that a coupling relationship in which the output terminal of a flip-flop circuit F/F is coupled to the input terminal of another flip-flop circuit F/F is repeated. The number of flip-flop circuits F/F constituting the shift register SR0 is designed as appropriate in accordance with timing control, and is, for example, eight. An internal clock signal iCLK supplied from, for example, the sequencer 15 is input to the clock terminal of each flip-flop circuit F/F. The cycles of the internal clock signals iCLK supplied to the respective flip-flop circuits F/F need not necessarily match one another.

The shift register SR0 receives the signal De<0>. The data of the even-numbered bits of the signal DQ<0> is thereby sequentially input to the input terminal of the first-stage flip-flop circuit F/F of the shift register SR0. Each flip-flop circuit F/F latches data input to the input terminal of the flip-flop circuit F/F at, for example, a time when the internal clock signal iCLK rises from the L level to the H level, and outputs the latched data on the output terminal. The output data is input to the input terminal of the subsequent-stage flip-flop circuit F/F. The shift register SR0 transfers data of the even-numbered bits of the signal DQ<0> in this manner, and outputs the data of the 0-th bit, data of the second bit, data of the fourth bit, . . . of the signal DQ<0> on the output terminal of the final-stage flip-flop circuit F/F of the shift register SR0 in order of appearance.

The shift register SR1 has the same configuration as the shift register SR0. The shift register SR1 receives the signal DQ<0>, and similarly transfers data of the odd-numbered bits of the signal DQ<0> and outputs the data of the first bit, data of the third bit, data of the fifth bit, . . . of the signal DQ<0> on the output terminal of the last-stage flip-flop circuit F/F of the shift register SR1 in order of appearance.

The multiplexer MUX has, for example, a first input terminal, a second input terminal, . . . , and a sixteenth input terminal. The first input terminal of the multiplexer MUX is coupled to the output terminal of the final-stage flip-flop circuit F/F of the shift register SR0 of the shift register circuit 124<0>. The data of the even-numbered bits of the signal DQ<0> is input to the first input terminal in order of the data of the 0-th bit, the data of the second bit, the data of the fourth bit, . . . . The second input terminal of the multiplexer MUX is coupled to the output terminal of the final-stage flip-flop circuit F/F of the shift register SR1 of the shift register circuit 124<0>. The data of the odd-numbered bits of the signal DQ<0> is input to the second input terminal in order of the data of the first bit, the data of the third bit, the data of the fifth bit, . . . . The same applies to the relationship between the multiplexer MUX and each of the other shift register circuits <7:1>. Namely, the (2r+1)-th input terminal and (2r+2)-th input terminal of the multiplexer MUX are coupled to the shift register circuit 124<r>, and the data of the even-numbered bits of the signal DQ<r> is input to the (2r+1)-th input terminal in order of the data of the 0-th bit, the data of the second bit, and the data of the fourth bit, . . . , whereas the data of the odd-numbered bits of the signal DQ<r> is input to the (2r+2)-th input terminal in order of the data of the first bit, the data of the third bit, the data of the fifth bit, . . . .

The multiplexer MUX has, for example, eight output terminals for each plane PB. Eight output terminals of the multiplexer MUX are coupled to the data register DR0 via eight data lines, and eight other output terminals of the multiplexer MUX are coupled to the data register DR1 via eight other data lines.

The multiplexer MUX is supplied with a control signal SEL by, for example, the sequencer 15. The control signal SEL is a signal relating to selection of a plane PB, and may be based on, for example, a block address. The multiplexer MUX transfers the data DAT received on the sixteen input terminals to the data register DR of a target plane PB, based on the control signal SEL. Specifically, the multiplexer MUX transfers, to the data register DR via the eight data lines, the data of the 0-th bits of the respective signals DQ<7:0>, then the data of the first bits of the respective signals DQ<7:0>, then the data of the second bits of the respective signals DQ<7:0>, and so on. The data register DR receives the data DAT, and transfers the data DAT to the sense amplifier module SA of the target plane PB.

(7) Latch Circuit

Hereinafter, the configuration of the latch circuit 123<0> will be described in more detail. The configurations of the input circuit 121<0> and the input circuit 122 will also be described in more detail. The latch circuit 123<0> will be taken as an example; however, the configuration to be described below may be applied to each of the latch circuits 123<7:0>. In addition, the other input circuits 121<7:1> may each have the same configuration as the configuration of the input circuit 121<0> to be described below. The same applies to the other embodiments.

Figure 9:
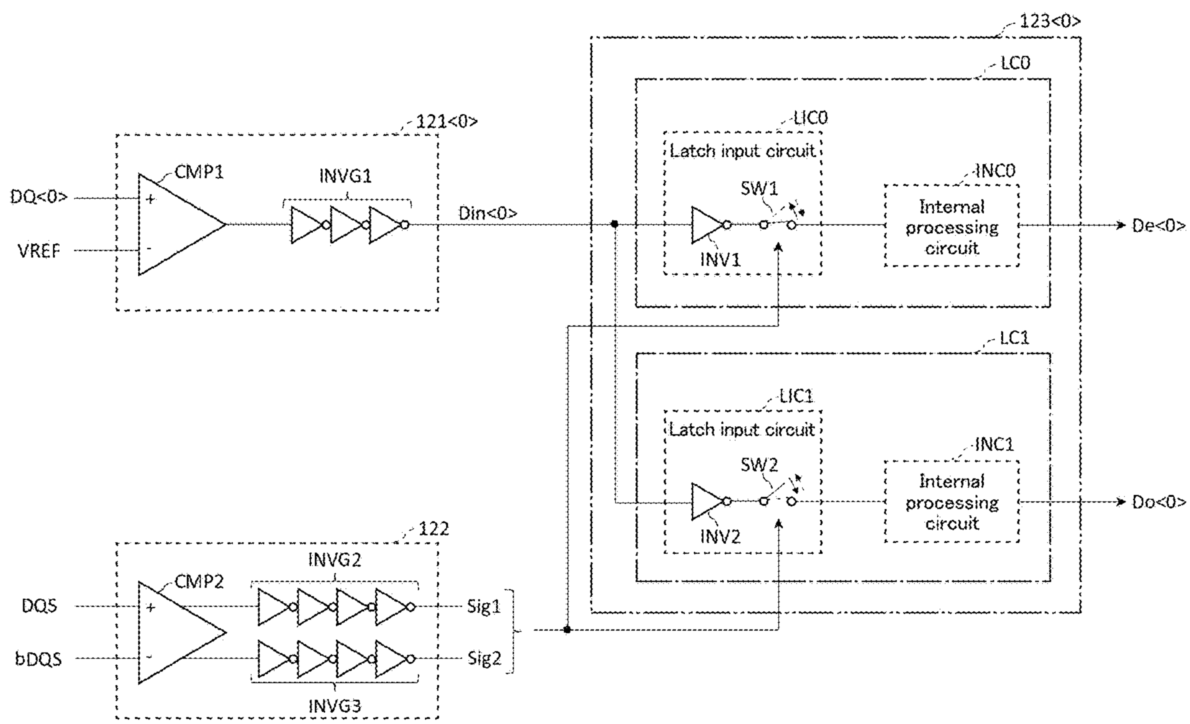
FIG. 9 shows an example of configurations of two input circuits and one latch circuit in the input/output circuit of the semiconductor memory device according to the first embodiment.

FIG. 9 shows an example of more detailed configurations of the input circuit 121<0>, input circuit 122, and latch circuit 123<0> of the semiconductor memory device 1 according to the first embodiment.

The input circuit 121<0> includes a comparator CMP1 and an inverter group INVG1. The signal DQ<0> is processed in the input circuit 121<0> as follows.

For example, the signal DQ<0> is input to a non-inversion input terminal of the comparator CMP1, and a voltage VREF is applied to an inversion input terminal of the comparator CMP1. The voltage VREF is, for example, a substantially constant reference voltage, and may be an average voltage of the H-level voltage and L-level voltage of the signal DQ<0>. The comparator CMP1 amplifies the voltage of the signal DQ<0> with reference to the voltage VREF, and outputs a signal obtained as a result of the amplification.

The inverter group INVG1 is constituted by a plurality of inverters. The inverters are coupled in series in such a manner that a coupling relationship in which the output terminal of an inverter is coupled to the input terminal of another inverter is repeated. The same applies to the other inverter groups INVG. FIG. 9 shows an example of the case where the inverter group INVG1 is constituted by three inverters. The inverter group INVG1 receives a signal output from the comparator CMP1, and outputs a signal obtained as a result of forwarding the signal through the inverters of the inverter group INVG1. The signal is output from the input circuit 121<0> as the signal Din<0>.

The input circuit 122 includes a comparator CMP2, an inverter group INVG2, and an inverter group INVG3. The signal DQS and signal bDQS are processed in the input circuit 122 as follows.

The comparator CMP2 has a first output terminal and a second output terminal. For example, the signal DOS is input to a non-inversion input terminal of the comparator CMP2, and the signal bDQS is input to an inversion input terminal of the comparator CMP2. The comparator CMP2 amplifies the voltage of the signal DQS with reference to the voltage of the signal bDQS, outputs a signal obtained as a result of the amplification on the first output terminal, and outputs a complimentary signal of the signal obtained as a result of the amplification on the second output terminal. The signal output on the first output terminal substantially corresponds to a signal obtained by amplifying the voltage of the signal DOS, and the signal output on the second output terminal substantially corresponds to a signal obtained by amplifying the voltage of the signal bDQS. By amplifying the signal DOS while using the signal bDQS as a reference, electrical noise that may ride on the signal DOS and signal bDQS is alleviated (common mode noise is removed) in the signals output from the comparator CMP2.

FIG. 9 shows an example of the case where the inverter groups INVG2 and INVG3 are each constituted by four inverters. The inverter group INVG2 receives the signal output on the first output terminal of the comparator CMP2, and outputs a signal obtained as a result of forwarding the signal through the inverters of the inverter group INVG2. The signal is output from the input circuit 122 as the signal Sig1. The inverter group INVG3 receives the signal output on the second output terminal of the comparator CMP2, and outputs a signal obtained as a result of forwarding the signal through the inverters of the inverter group INVG3. The signal is output from the input circuit 122 as the signal Sig2.

Regarding the three inverter groups INVG shown in FIG. 9, the delay amounts of the three signals forwarded by the respective three inverter groups INVG can be adjusted by adjusting the number of inverters constituting each inverter group INVG.

Next, the latch circuit 123<0> will be described. The latch circuit 123<0> includes a partial latch circuit LC0 and a partial latch circuit LC1. The signal Din<0>, signal Sig1, and signal Sig2 are processed in the latch circuit 123<0> as follows.

The partial latch circuit LC0 includes a latch input circuit LIC0 and an internal processing circuit INC0. The latch input circuit LIC0 includes, for example, an inverter INV1 and a switch SW1.

The latch input circuit LIC0 receives the signal Din<0>. The inverter INV1 receives the signal Din<0> and outputs a voltage at the level obtained by inverting the level of the signal Din<0>. Specifically, the inverter INV1 outputs the L-level voltage while the signal Din<0> is at the H level, and outputs the H-level voltage while the signal Din<0> is at the L level. The latch input circuit LIC0 outputs the voltage accordingly output from the inverter INV1 while the switch SW1 is ON. The switch SW1 is, for example, ON while the signal Sig1 is at the L level and the signal Sig2 is at the H level, and OFF while the signal Sig1 is at the H level and the signal Sig2 is at the L level. In this manner, the switch SW1 alternately switches between ON and OFF in accordance with the toggling of the signal DOS and the signal bDQS. The same applies to the other switches SW which switch between ON and OFF based on the signals Sig1 and Sig2.

The internal processing circuit INC0 receives a signal of the voltage output from the latch input circuit LIC0 and latches the data of the even-numbered bits of the signal DQ<0> in order of the 0-th bit, the second bit, the fourth bit, . . . . The internal processing circuit INC0 outputs the latched data of the even-numbered bits in latched order. The output corresponds to the output of the signal De<0> shown in FIG. 8.

The partial latch circuit LC1 includes a latch input circuit LIC1 and an internal processing circuit INC1. The latch input circuit LIC1 includes, for example, an inverter INV2 and a switch SW2.

The latch input circuit LIC1 receives the signal Din<0>. The inverter INV2 receives the signal Din<0> and outputs a voltage at the level obtained by inverting the level of the signal Din<0>. The latch input circuit LIC1 outputs the voltage accordingly output from the inverter INV2 while the switch SW2 is ON. The switch SW2 is, for example, OFF while the signal Sig1 is at the L level and the signal Sig2 is at the H level, and ON while the signal Sig1 is at the H level and the signal Sig2 is at the L level. Accordingly, the switch SW2 is OFF while the switch SW1 is ON, and the switch SW2 is ON while the switch SW1 is OFF.

The internal processing circuit INC1 receives a signal of the voltage output from the latch input circuit LIC1 and latches the data of the odd-numbered bits of the signal DQ<0> in order of the first bit, the third bit, the fifth bit, . . . . The internal processing circuit INC1 outputs the latched data of the odd-numbered bits in latched order. The output corresponds to the output of the signal DQ<0> shown in FIG. 8.

Described above is an example of the configuration of each of the latch input circuits LIC0 and LIC1; however, the present embodiment is not limited thereto. The latch input circuits LIC0 and LIC1 each may have another configuration capable of outputting a voltage based on the signal Din<0> and signals Sig1 and Sig2 as described above. The same applies to the other circuits shown in drawings to be referred to below as including an inverter INV and a switch SW.

Hereinafter, when a latch input circuit LIC can output a voltage, such as when the switch SW included in the latch input circuit LIC is ON, the latch input circuit LIC will also be described as being ON. In the other cases, the latch input circuit LIC will also be referred to as being OFF. The same applies to the other circuits shown in drawings to be referred to below, which are controlled as to whether or not the circuit can output a voltage based on a switch SW.

(8) Partial Latch Circuit

Hereinafter, details of the configuration of the partial latch circuit LC1 of the latch circuit 123<0> will be described. The partial latch circuit LC1 will be taken as an example; however, the configuration to be described below may be applied to each of the partial latch circuits LC0 and LC1. The same applies to the other embodiments.

FIG. 10 shows an example of a more detailed configuration of the partial latch circuit LC1 of the semiconductor memory device 1 according to the first embodiment. Hereinafter, the latch input circuit LIC1 will also be referred to as a latch input circuit 1231.

The signal Din<0> is input to the input terminal of the inverter INV2, and the output terminal of the inverter INV2 is coupled to a first terminal of the switch SW2. A second terminal of the switch SW2 is coupled to a node N1. The switch SW2 is, for example, a switch element between two terminals, and can transfer a signal between the first terminal and the second terminal while the switch SW2 is ON. The same applies to the other switches SW below.

The inverter INV2 supplies a voltage at the level obtained by inverting the level of the signal Din<0> input to the input terminal to the first terminal of the switch SW2 coupled to the output terminal. The switch SW2 transfers the voltage accordingly supplied to the first terminal to the node N1 coupled to the second terminal while the switch SW2 is ON.

By the latch input circuit 1231 supplying the voltage to the node N1 in this manner, data of a bit being sent via the signal Din<0> is taken into the partial latch circuit LC1 as the voltage of the node N1.

The internal processing circuit INC1 includes a positive feedback circuit 1232 and a voltage adjustment circuit 1233.

The positive feedback circuit 1232 includes an inverter circuit 12321 and an inverter circuit 12322 with a function of turning off positive feedback. The inverter circuit 12321 will also be referred to as an inverter INV3. The inverter circuit 12322 includes, for example, an inverter INV4 and a switch SW3.

The input terminal of the inverter INV3 is coupled to the node N1, and the output terminal of the inverter INV3 is coupled to a node N2. The inverter INV3 supplies the node N2 coupled to the output terminal with, for example, the L-level voltage while the value of the voltage of the node N1 coupled to the input terminal is larger than or equal to a threshold Vth3, and the H-level voltage while the value is smaller than the threshold Vth3. Accordingly, the voltage of the node N2 may become the H level or the L level.

The input terminal of the inverter INV4 is coupled to the node N2, and the output terminal of the inverter INV4 is coupled to a first terminal of the switch SW3. A second terminal of the switch SW3 is coupled to the node N1.

The inverter circuit 12322 outputs a voltage based on the voltage of the node N2 as follows.

The inverter INV4 supplies the first terminal of the switch SW3 coupled to the output terminal with, for example, the L-level voltage while the value of the voltage of the node N2 coupled to the input terminal is larger than or equal to a threshold Vth4, and the H-level voltage while the value is smaller than the threshold Vth4. The switch SW3 transfers the voltage accordingly supplied to the first terminal to the node N1 coupled to the second terminal while the switch SW3 is ON. The switch SW3 is ON while the signal Sig1 is at the L level and the signal Sig2 is at the H level, and is OFF while the signal Sig1 is at the H level and the signal Sig2 is at the L level. Accordingly, the switch SW3 is OFF while the switch SW2 is ON, and the switch SW3 is ON while the switch SW2 is OFF.

By the inverter circuits 12321 and 12322 supplying voltages to the nodes N1 and N2 in this manner, the data of a bit taken as described above is latched in the partial latch circuit LC1 as the voltage of each of the nodes N1 and N2. The signal DQ<0> is based on the voltage of the node N2.

The H-level voltages supplied by the inverters INV2, INV3, and INV4 are, for example, substantially the same voltage, and the L-level voltages supplied by the inverters INV2, INV3, and INV4 are also, for example, substantially the same voltage. Each of the thresholds Vth3 and Vth4 is, for example, an average voltage of the H-level voltage and the L-level voltage. The same applies to the other inverters INV and the other thresholds Vth to be described below. The following description will be provided on the assumption that these conditions are satisfied.

Next, the voltage adjustment circuit 1233 will be described.

The voltage adjustment circuit 1233 includes an inverter INV5. The input terminal and output terminal of the inverter INV5 are coupled to the node N1. The inverter INV5 supplies the node N1 coupled to the output terminal with, for example, the L-level voltage while the value of the voltage of the node N1 coupled to the input terminal is larger than or equal to a threshold Vth5, and the H-level voltage while the value is smaller than the threshold Vth5.

The function of adjusting the voltage of the node N1, which is performed by the voltage adjustment circuit 1233 while the signal Sig1 is at the H level, will be described. During this period, the switch SW2 is ON and the switch SW3 is OFF, i.e., the latch input circuit 1231 is ON and the inverter circuit 12322 is OFF.

When the latch input circuit 1231 supplies the H-level voltage to the node N1, the voltage of the node N1 may thereby be caused to rise. When the value of the voltage is larger than or equal to the threshold Vth5, the voltage adjustment circuit 1233 supplies the node N1 with the L-level voltage in accordance with the value of the voltage of the node N1 being larger than or equal to the threshold Vth5. As a result of the latch input circuit 1231 supplying the H-level voltage and the voltage adjustment circuit 1233 supplying the L-level voltage, the voltage of the node N1 may be stabilized at the H level. The H-level voltage is lower than the voltage in the case where the voltage of the node N1 is stabilized based on the H-level voltage supplied from the latch input circuit 1231 with no voltage supply from the voltage adjustment circuit 1233. These are because, when the voltage of the node N1 is stable at the H level, a resistance R5L of the path from the source of the L-level voltage supplied by the voltage adjustment circuit 1233 to the node N1 is larger than a resistance R2H of the path from the source of the H-level voltage supplied by the latch input circuit 1231 to the node N1. Herein, the "source" of a voltage at a level means a node coupled to a circuit that supplies the voltage at that level, to which the voltage is applied. For example, when the voltage of the node N1 is stable at the H level, (magnitude of resistance R5L)/(magnitude of resistance R2H) is not less than 5/3 and not more than 3.

When the latch input circuit 1231 supplies the L-level voltage to the node N1, the voltage of the node N1 may thereby be lowered. When the value of the voltage becomes smaller than the threshold Vth5, the voltage adjustment circuit 1233 supplies the node N1 with the H-level voltage in accordance with the value of the voltage of the node N1 being smaller than the threshold Vth5. As a result of the latch input circuit 1231 supplying the L-level voltage and the voltage adjustment circuit 1233 supplying the H-level voltage, the voltage of the node N1 may be stabilized at the L level. The L-level voltage is higher than the voltage in the case where the voltage of the node N1 is stabilized based on the L-level voltage supplied from the latch input circuit 1231 with no voltage supply from the voltage adjustment circuit 1233. These are because, when the voltage of the node N1 is stable at the L level, a resistance R5H of the path from the source of the H-level voltage supplied by the voltage adjustment circuit 1233 to the node N1 is larger than a resistance R2L of the path from the source of the L-level voltage supplied by the latch input circuit 1231 to the node N1. For example, when the voltage of the node N1 is stable at the L level, (magnitude of resistance R5H)/(magnitude of resistance R2L) is not less than 5/3 and not more than 3.

The same applies to the function of adjusting the voltage of the node N1, which is performed by the voltage adjustment circuit 1233 while the signal Sig1 is at the L level. During this period, the switch SW2 is OFF and the switch SW3 is ON, i.e., the latch input circuit 1231 is OFF and the inverter circuit 12322 is ON. The latch input circuit 1231 in the above description may be replaced with the inverter circuit 12322.

Described above is a configuration of the partial latch circuit LC1. Hereinafter, the case where the same configuration is applied to the partial latch circuit LC0 will be described. For example, the partial latch circuit LC0 is configured by modifying the configuration of the partial latch circuit LC1 so that the condition for making each switch ON and the condition for making each switch OFF are reversed. The same applies to the other embodiments as long as there is no particular description to the contrary.

Figure 11:
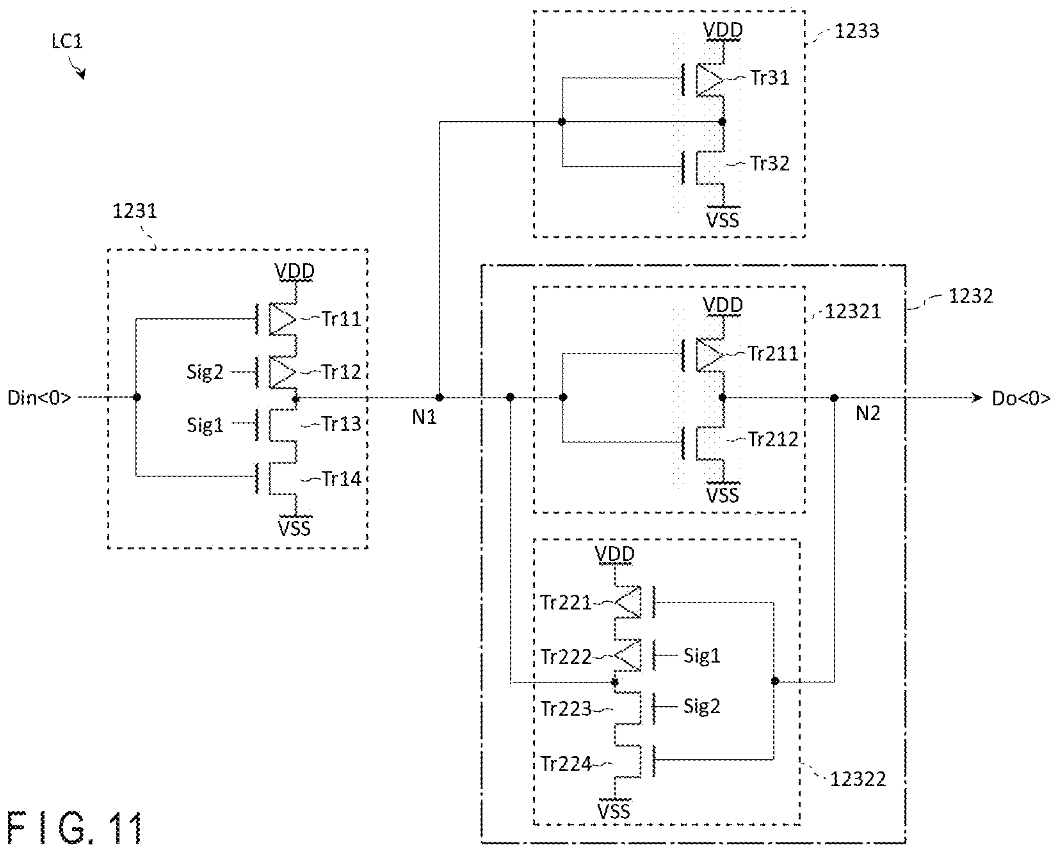
FIG. 11 shows an example of a circuit configuration of the partial latch circuit of the semiconductor memory device according to the first embodiment.

FIG. 11 shows an example of a circuit configuration of the partial latch circuit LC1 of the semiconductor memory device 1 according to the first embodiment. In FIG. 11, a configuration that implements a function equivalent to the function implemented by each inverter INV and switch SW described as a part of the partial latch circuit LC1 with reference to FIG. 10 is more concretely shown. The same applies to similar drawings to be referred to below.

First, a circuit configuration of the latch input circuit 1231 will be described. In the example of FIG. 11, the latch input circuit 1231 is implemented by a clocked inverter circuit. Specifically, the latch input circuit 1231 is implemented by a clock synchronization complementary metal oxide semiconductor (CMOS) inverter circuit. The clocked inverter circuit is switched between an inverter output state and an inverter output stop state. When the clocked inverter circuit is in the inverter output state, a signal at the logic level obtained by inverting the logic level of the signal input to the input terminal is output from the output terminal. When the clocked inverter circuit is in the inverter output stop state, no signal is output from the output terminal regardless of the logic level of the signal input to the input terminal.

The latch input circuit 1231 includes, for example, p-channel metal oxide semiconductor (MOS) transistors Tr11 and Tr12 and n-channel MOS transistors Tr13 and Tr14. For example, a voltage VDD is applied to a first terminal of the transistor Tr11. The voltage VDD is, for example, a power supply voltage, and is the aforementioned H-level voltage. A second terminal of the transistor Tr11 is coupled to a first terminal of the transistor Tr12, and a second terminal of the transistor Tr12 is coupled to the node N1. A first terminal of the transistor Tr13 is coupled to the node N1, and a second terminal of the transistor Tr13 is coupled to a first terminal of the transistor Tr14. For example, a voltage VSS is applied to a second terminal of the transistor Tr14. The voltage VSS is, for example, a reference voltage, such as a ground voltage, and is the aforementioned L-level voltage. The voltage VSS is lower than the voltage VDD. The signal Din<0> is input to each of the gates of the transistors Tr11 and Tr14. The signal Sig2 is input to the gate of the transistor Tr12. The signal Sig1 is input to the gate of the transistor Tr13.

While the signal Sig1 is at the L level, and the signal Sig2 is at the H level, the transistors Tr12 and Tr13 are OFF. Therefore, neither the voltage VDD applied to the first terminal of the transistor Tr11 nor the voltage VSS applied to the second terminal of the transistor Tr14 is supplied to the node N1.

While the signal Sig1 is at the H level, and the signal Sig2 is at the L level, the transistors Tr12 and Tr13 are ON. During this period, the latch input circuit 1231 supplies the node N1 with a voltage at the level obtained by inverting the level of the signal Din<0> as follows.

When the signal Din<0> is at the H level, the transistor Tr11 is OFF and the transistor Tr14 is ON. Therefore, in accordance with the signal Din<0> being at the H level, the voltage VSS applied to the second terminal of the transistor Tr14 is supplied to the node N1. In contrast, when the signal Din<0> is at the L level, the transistor Tr11 is ON and the transistor Tr14 is OFF. Therefore, in accordance with the signal Din<0> being at the L level, the voltage VDD applied to the first terminal of the transistor Tr11 is supplied to the node N1.

Next, a circuit configuration of the positive feedback circuit 1232 will be described. In the example of FIG. 11, the inverter circuit 12321 is implemented by a CMOS inverter circuit, and the inverter circuit 12322 is implemented by a clock synchronization CMOS inverter circuit.

The inverter circuit 12321 includes, for example, a p-channel MOS transistor Tr211 and an n-channel MOS transistor Tr212.

For example, the voltage VDD is applied to a first terminal of the transistor Tr211 and a second terminal of the transistor Tr211 is coupled to the node N2. A first terminal of the transistor Tr212 is coupled to the node N2 and, for example, the voltage VSS is applied to a second terminal of the transistor Tr212. The gate of each of the transistors Tr211 and Tr212 is coupled to the node N1.

When the value of the voltage of the node N1 is smaller than the threshold Vth3, the transistor Tr211 is ON and the transistor Tr212 is OFF, for example. Therefore, in accordance with the value of the voltage of the node N1 being smaller than the threshold Vth3, the voltage VDD applied to the first terminal of the transistor Tr211 is supplied to the node N2. In contrast, when the value of the voltage of the node N1 is larger than or equal to the threshold Vth3, the transistor Tr211 is OFF and the transistor Tr212 is ON, for example. Therefore, in accordance with the value of the voltage of the node N1 being larger than or equal to the threshold Vth3, the voltage VSS applied to the second terminal of the transistor Tr212 is supplied to the node N2.

The inverter circuit 12322 includes, for example, p-channel MOS transistors Tr221 and Tr222 and n-channel MOS transistors Tr223 and Tr224.

For example, the voltage VDD is applied to a first terminal of the transistor Tr221, a second terminal of the transistor Tr221 is coupled to a first terminal of the transistor Tr222, and a second terminal of the transistor Tr222 is coupled to the node N1. A first terminal of the transistor Tr223 is coupled to the node N1, a second terminal of the transistor Tr223 is coupled to a first terminal of the transistor Tr224, and for example the voltage VSS is applied to a second terminal of the transistor Tr224. The gate of each of the transistors Tr221 and Tr224 is coupled to the node N2. The signal Sig1 is input to the gate of the transistor Tr222. The signal Sig2 is input to the gate of the transistor Tr223.

While the signal Sig1 is at the H level, and the signal Sig2 is at the L level, the transistors Tr222 and Tr223 are OFF. Therefore, neither the voltage VDD applied to the first terminal of the transistor Tr221 nor the voltage VSS applied to the second terminal of the transistor Tr224 is supplied to the node N1.

While the signal Sig1 is at the L level, and the signal Sig2 is at the H level, the transistors Tr222 and Tr223 are ON. During this period, the inverter circuit 12322 supplies a voltage to the node N1 as follows.

When the value of the voltage of the node N2 is larger than or equal to the threshold Vth4, the transistor Tr221 is OFF and the transistor Tr224 is ON, for example. Therefore, in accordance with the value of the voltage of the node N2 being larger than or equal to the threshold Vth4, the voltage VSS applied to the second terminal of the transistor Tr224 is supplied to the node N1. In contrast, when the value of the voltage of the node N2 is smaller than the threshold Vth4, the transistor Tr221 is ON and the transistor Tr224 is OFF, for example. Therefore, in accordance with the value of the voltage of the node N2 being smaller than the threshold Vth4, the voltage VDD applied to the first terminal of the transistor Tr221 is supplied to the node N1.

Furthermore, a circuit configuration of the voltage adjustment circuit 1233 will be described. In the example of FIG. 11, the voltage adjustment circuit 1233 is implemented by a CMOS inverter circuit.

The voltage adjustment circuit 1233 includes, for example, a p-channel MOS transistor Tr31 and an n-channel MOS transistor Tr32.

For example, the voltage VDD is applied to a first terminal of the transistor Tr31, and a second terminal and gate of the transistor Tr31 is coupled to the node N1. A first terminal and gate of the transistor Tr32 are coupled to the node N1 and, for example, the voltage VSS is applied to a second terminal of the transistor Tr32.

When the value of the voltage of the node N1 is smaller than the threshold Vth5, the transistor Tr31 is ON and the transistor Tr32 is OFF, for example. Therefore, in accordance with the value of the voltage of the node N1 being smaller than the threshold Vth5, the voltage VDD applied to the first terminal of the transistor Tr31 is supplied to the node N1. In contrast, when the value of the voltage of the node N1 is larger than or equal to the threshold Vth5, the transistor Tr31 is OFF and the transistor Tr32 is ON, for example. Therefore, in accordance with the value of the voltage of the node N1 being larger than or equal to the threshold Vth5, the voltage VSS applied to the second terminal of the transistor Tr32 is supplied to the node N1.

For example, the p-channel MOS transistor Tr11 and n-channel MOS transistor Tr14 shown in FIG. 11 function as the inverter INV2 shown in FIG. 10. For example, the p-channel MOS transistor Tr12 and n-channel MOS transistor Tr13 shown in FIG. 11 function as the switch SW2 shown in FIG. 10. Similarly, for example, the p-channel MOS transistor Tr211 and n-channel MOS transistor Tr212 function as the inverter INV3, the p-channel MOS transistor Tr221 and n-channel MOS transistor Tr224 function as the inverter INV4, the p-channel MOS transistor Tr222 and n-channel MOS transistor Tr223 function as the switch SW3, and the p-channel MOS transistor Tr31 and n-channel MOS transistor Tr32 function as the inverter INV5.

When the voltage of the node N1 is stabilized at the L level by the latch input circuit 1231 supplying the node N1 with the L-level voltage as described with reference to FIG. 10, the on-resistance of the transistor Tr31 is larger than the sum of the on-resistances of the transistors Tr13 and Tr14. The transistors Tr are formed to satisfy such a relationship. The same applies to similar descriptions below. When the voltage of the node N1 is stabilized at the H level by the latch input circuit 1231 supplying the node N1 with the H-level voltage as described with reference to FIG. 10, the on-resistance of the transistor Tr32 is larger than the sum of the on-resistances of the transistors Tr11 and Tr12.

When the voltage of the node N1 is stabilized at the L level by the inverter circuit 12322 supplying the node N1 with the L-level voltage as described with reference to FIG. 10, the on-resistance of the transistor Tr31 is larger than the sum of the on-resistances of the transistors Tr223 and Tr224. When the voltage of the node N1 is stabilized at the H level by the inverter circuit 12322 supplying the node N1 with the H-level voltage as described with reference to FIG. 10, the on-resistance of the transistor Tr32 is larger than the sum of the on-resistances of the transistors Tr221 and Tr222.

Described above is a circuit configuration of the partial latch circuit LC1. Hereinafter, the case where the same circuit configuration is applied to the partial latch circuit LC0 will be described. The partial latch circuit LC0 is configured by modifying the above-described circuit configuration of the partial latch circuit LC1 so that, for example, the signal Sig2 is input to each gate described as receiving the signal Sig1, and the signal Sig1 is input to each gate described as receiving the signal Sig2. The same applies to the other embodiments as long as there is no particular description to the contrary.

Operation Example

Hereinafter, an operation example will be described in detail, in which data DAT sent via signals DQ<7:0> transmitted by the memory controller 2 is latched by the semiconductor memory device 1 according to the first embodiment.

(1) Latch Operation by Latch Circuit

Figure 12:
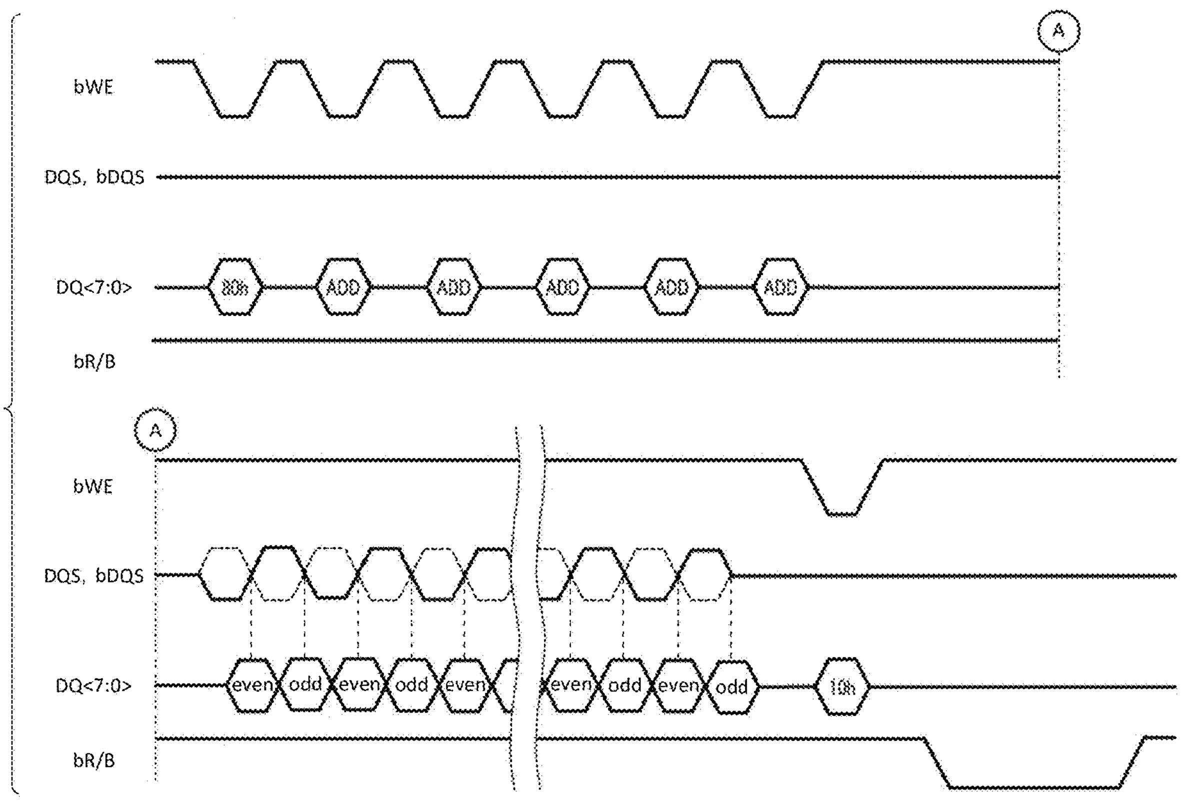
FIG. 12 shows an example of a timing chart showing a command set related to a write operation executed by the semiconductor memory device according to the first embodiment and temporal changes of other various signals.

FIG. 12 shows an example of a timing chart showing a command set related to a write operation executed by the semiconductor memory device 1 according to the first embodiment and temporal changes of other various signals. Regarding the signals DOS and bDQS, FIG. 12 indicates a temporal change of the signal DOS by a solid line, and indicates a temporal change of the signal bDQS by a broken line. Hereinafter, when a signal is described as being at a level, the signal should be regarded as remaining at the described level unless control to bring the signal to another level is explicitly described thereafter. The same applies to the descriptions of the other drawings.

While the memory controller 2 is receiving the ready/busy signal bR/B at the H level, i.e., while the semiconductor memory device 1 is in the ready state, the memory controller 2 generates a command set for causing the semiconductor memory device 1 to execute a write operation and sends the command set to the semiconductor memory device 1 via the signals DQ<7:0>. The command set includes a command "80h", address information ADD, write data DAT, and a command "10h". The semiconductor memory device 1 receives the command set and starts the write operation. Details will be described below.

First, the memory controller 2 generates a command "80h" and transmits the command "80h" to the semiconductor memory device 1 while toggling the write enable signal bWE. The command "80h" is a command used to cause the semiconductor memory device 1 to execute a write operation. Based on the toggling of the write enable signal bWE, the logic controller 13 enables the input/output circuit 12 to transfer the command "80h" to the register 14.

Then, the memory controller 2 generates address information ADD over, for example, five cycles, and transmits the address information ADD to the semiconductor memory device 1 while toggling the write enable signal bWE. The address information ADD generated over five cycles designates, for example, a write-target block BLK, and an area in the block BLK. Based on the address information ADD, the sequencer 15 identifies an area of a memory cell array MCA in which data is to be written, for example. The address information ADD need not necessarily be generated over five cycles, and may be generated over any number of cycles. Based on the toggling of the write enable signal bWE, the logic controller 13 enables the input/output circuit 12 to transfer the address information ADD to the register 14.

Then, the memory controller 2 transmits the data DAT to the semiconductor memory device 1 via the signals DQ<7:

0> in order of the 0-th bit, the first bit, the second bit, . . . for each of the signals DQ<7:0> while toggling the signal DQS and signal bDQS.

The toggling will be described. The signal DQS is brought to the L level, for example, before the data DAT is transmitted to the semiconductor memory device 1. Then, the signal DOS is raised from the L level to the H level while the data of the 0-th bit is being sent via each of the signals DQ<7:0>. Subsequently, the signal DOS is lowered from the H level to the L level while the data of the first bit is being sent via each of the signals DQ<7:0>. In this manner, the toggling to change the level of the signal DQS, which is performed once while data of one bit is being sent via each of the signals DQ<7:0>, is periodically repeated. This periodical toggling continues while data DAT is being sent via the signals DQ<7:0>. The signal bDQS is toggled to be a complimentary signal of the signal DQS.

The partial latch circuit LC0 of the latch circuit 123<0> latches data of a bit of the even-numbered bits of the signal DQ<0> when the signal DOS rises. The partial latch circuit LC1 of the latch circuit 123<0> latches data of a bit of the odd-numbered bits of the signal DQ<0> when the signal DOS falls. The same applies to the other latch circuits 123<7:1>. The sequencer 15 causes data of each bit of the data DAT accordingly latched to be input to the latch circuit of the data register DR corresponding to the area of the memory cell array MCA in which data is to be written.

The memory controller 2 also generates a command "10h" and transmits the command "10h" to the semiconductor memory device 1 while toggling the write enable signal bWE. The command "10h" is a command used to cause the semiconductor memory device 1 to execute a write operation, based on the address information ADD and data DAT received after the receipt of the command "80h". Based on the toggling of the write enable signal bWE, the logic controller 13 enables the input/output circuit 12 to transfer the command "10h" to the register 14.

In response to the receipt of the command "10h", the sequencer 15 causes the logic controller 13 to transmit the ready/busy signal bR/B to the memory controller 2 at the L level. The memory controller 2 is thereby notified that the semiconductor memory device 1 is in the busy state. In response to the receipt of the command "10h", the sequencer 15 controls the voltage generator 16, the driver set 17, and the target plane PB and starts the write operation.

After completion of the write operation, the sequencer 15 causes the logic controller 13 to transmit the ready/busy signal bR/B to the memory controller 2 at the H level. The memory controller 2 is thereby notified that the semiconductor memory device 1 is in the ready state.

(2) Latch Operation by Partial Latch Circuit

Figure 13:
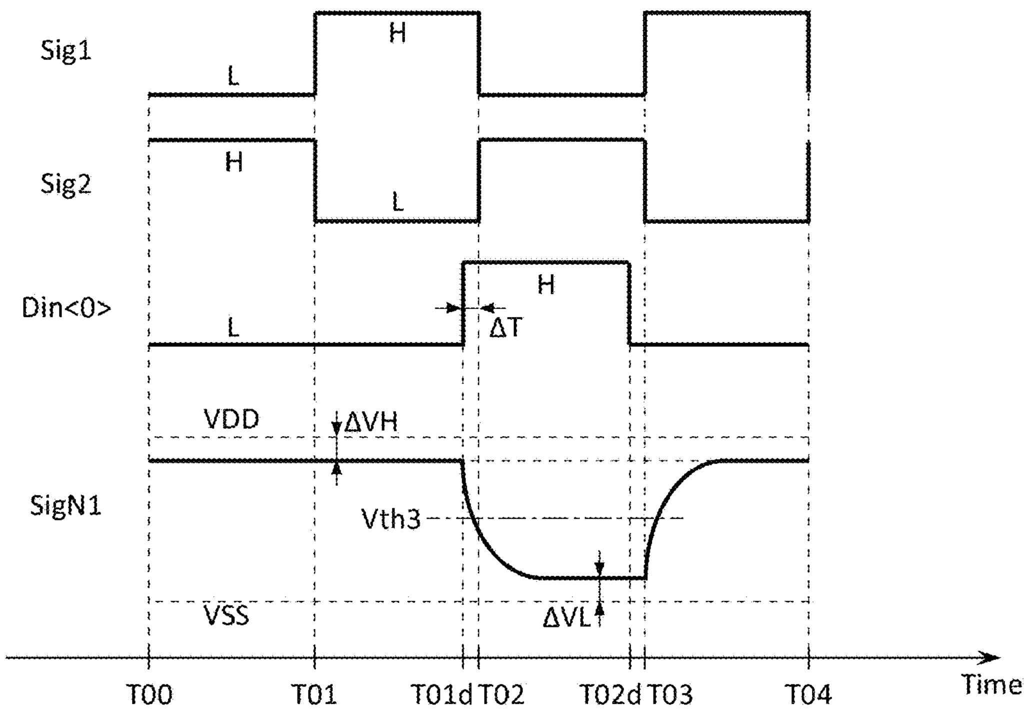
FIG. 13 shows an example of a timing chart showing temporal changes of various signals when the partial latch circuit of the semiconductor memory device according to the first embodiment latches data of a bit sent via a signal.

FIG. 13 shows an example of a timing chart showing temporal changes of various signals when the partial latch circuit LC1 of the semiconductor memory device 1 according to the first embodiment latches data of a bit sent via the signal DQ<0>. In FIG. 13, a signal transferred on the node N1 and indicating the voltage of the node N1 is shown as the signal SigN1. The same applies to the other drawings.

At a time T00, the signal Sig1 is at the L level, and the signal Sig2 is at the H level. These levels of the signals Sig1 and Sig2 are maintained until a time T01. Therefore, from the time T00 to the time T01, the latch input circuit 1231 is OFF, whereas the inverter circuit 12322 is ON.

From the time T00 to the time T01, the signal Din<0> is at the L level. For example, the L level of the signal Din<0> continues from before the time T00. Before the time T00, the latch input circuit 1231 supplies the node N1 with the H-level voltage such as the voltage VDD, which is a voltage at the level obtained by inverting the L-level of the signal Din<0>, and the voltage of the node N1 is stable at the H level at the time T00. From the time T00 to the time T01, the inverter circuit 12322 supplies the node N1 with the H-level voltage such as the voltage VDD. Therefore, the voltage of the node N1 is stable at the H level.

As described with reference to FIG. 10, the H-level voltage of the node N1 is a voltage lowered by the voltage adjustment circuit 1233 by the voltage difference ΔVH in comparison with the case without the voltage adjustment circuit 1233 where the voltage of the node N1 is stabilized based on, for example, the voltage VDD supplied from one of the latch input circuit 1231 and the inverter circuit 12322.

At the time T01, the signal Sig1 rises from the L level to the H level, and the signal Sig2 drops from the H level to the L level. These levels of the signals Sig1 and Sig2 are maintained until a time T02. Therefore, from the time T01 to the time T02, the latch input circuit 1231 is ON, whereas the inverter circuit 12322 is OFF.

From the time T01 to a time T01*d*, the signal Din<0> is at the L level. The time T01*d* is after the time T01 and before the time T02. From the time T01 to the time T01*d*, the latch input circuit 1231 supplies the node N1 with a voltage, such as the voltage VDD, at the level obtained by inverting the L-level of the signal Din<0>. Therefore, the voltage of the node N1 is stable at the H level.

At the time T01*d*, the signal Din<0> rises from the L level to the H level. The H-level of the signal Din<0> is maintained until a time T02*d*. The time T02*d* is after the time T02. From the time T01*d* to the time T02, the latch input circuit 1231 supplies the node N1 with a voltage, such as the voltage VSS, at the level obtained by inverting the H-level of the signal Din<0>. Accordingly, the voltage of the node N1 drops from the H level.

At the time T02, the signal Sig1 drops from the H level to the L level, and the signal Sig2 rises from the L level to the H level. The period of time from the time T01*d*, at which the signal Din<0> rises, to the time T02, at which the signal Sig1 drops, is a period of time ΔT. These levels of the signals Sig1 and Sig2 are maintained until a time T03. The time T03 is, for example, after the time T02*d*. Therefore, from the time T02 to the time T03, the latch input circuit 1231 is OFF, whereas the inverter circuit 12322 is ON.

At the time T02, the value of the voltage of the node N1 is smaller than the threshold Vth3; however, the voltage of the node N1 has not reached the L level. In accordance with the value of the voltage of the node N1 being smaller than the threshold Vth3, the inverter circuit 12321 supplies the node N2 with the H-level voltage. Accordingly, the value of the voltage of the node N2 is larger than or equal to the threshold Vth4. In accordance with the value of the voltage of the node N2 being larger than or equal to the threshold Vth4, the inverter circuit 12322 supplies the node N1 with the L-level voltage such as the voltage VSS. Accordingly, the voltage of the node N1 further drops. When the voltage of the node N1 drops in this manner, the value of the voltage is still smaller than the threshold Vth3 and the value of the voltage of the node N2 is still larger than or equal to the threshold Vth4. Therefore, from the time T02 to the time T03, the inverter circuit 12321 continues supplying the node N2 with the H-level voltage, and the inverter circuit 12322 continues supplying the node N1 with, for example, the voltage VSS. In this manner, the voltage of the node N1 reaches and is stabilized at the L level. The voltage of the node N2 is stabilized at the H level.

As described with reference to FIG. 10, the L-level voltage of the node N1 is a voltage raised by the voltage adjustment circuit 1233 by the voltage difference ΔVL in comparison with the case without the voltage adjustment circuit 1233 where the voltage of the node N1 is stabilized based on, for example, the voltage VSS supplied from one of the latch input circuit 1231 and the inverter circuit 12322.

In this manner, the H level of the signal Din<0> immediately before the time T02, at which the signal Sig1 drops, is reflected in the voltage of each of the node N1 and the node N2. Specifically, the node N1 is stabilized at the L level, which is a result of inversion of the H level of the signal Din<0> by the latch input circuit 1231, and the node N2 is stabilized at the H level, which is a result of inversion of the L level by the inverter circuit 12321. Accordingly, data of a bit of the odd-numbered bits being sent via the signal DQ<0> when the signal DOS drops is latched by the partial latch circuit LC1 as described with reference to FIG. 12.

At the time T02d, the signal Din<0> drops from the H level to the L level. From the time T02d to the time T03, the latch input circuit 1231 in the OFF state supplies the node N1 with no voltage. Accordingly, even when the voltage of the signal Din<0> changes at this time, the latch input circuit 1231 does not immediately change the voltage of the node N1.

At the time T03, the signal Sig1 rises from the L level to the H level, and the signal Sig2 drops from the H level to the L level. These levels of the signals Sig1 and Sig2 are maintained until a time T04. Therefore, from the time T03 to the time T04, the latch input circuit 1231 is ON, whereas the inverter circuit 12322 is OFF. At the time T04, the signal Sig1 drops from the H level to the L level, and the signal Sig2 rises from the L level to the H level. From the time T02d to the time T04, the signal Din<0> is at the L level. From the time T03 to the time T04, the latch input circuit 1231 supplies the node N1 with a voltage, such as the voltage VDD, at the level obtained by inverting the L-level of the signal Din<0>. Accordingly, the voltage of the node N1 rises from the L level to the aforementioned H level.

Figure 14:
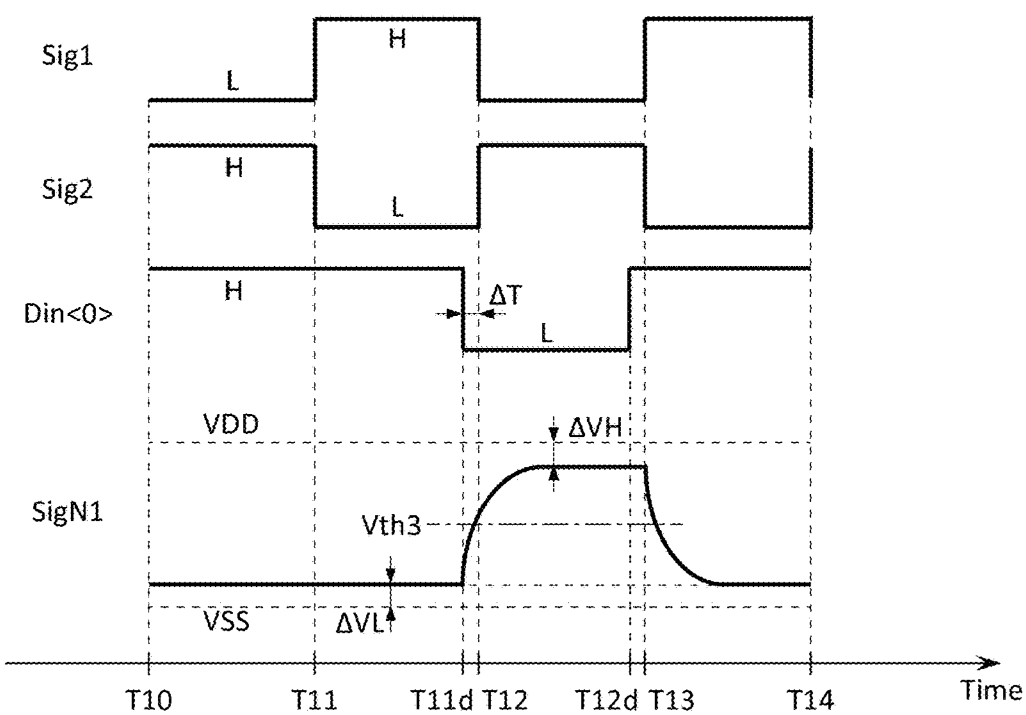
FIG. 14 shows another example of a timing chart showing temporal changes of various signals when the partial latch circuit of the semiconductor memory device according to the first embodiment latches data of a bit sent via a signal.

FIG. 14 shows another example of a timing chart showing temporal changes of various signals when the partial latch circuit LC1 of the semiconductor memory device 1 according to the first embodiment latches data of a bit sent via the signal DQ<0>.

Regarding the temporal changes of the signal Sig1, signal Sig2, and signal Din<0>, the description of FIG. 13 applies, except that the time T00 is replaced with a time T10, the time T01 is replaced with a time T11, the time T02 is replaced with a time T12, the time T03 is replaced with a time T13, the time T04 is replaced with a time T14, the time T01d is replaced with a time T11d, the time T02d is replaced with a time T12d, and the H level and L level of the signal Din<0> are reversed. The period of time from the time T11d to the time T12 is the same as the period of time ΔT from the time T01d to the time T02. Regarding whether each of the latch input circuit 1231 and the inverter circuit 12322 is ON or OFF, the description of FIG. 13 applies, except that the times in the description of FIG. 13 are replaced as described above.

Hereinafter, the voltage of the node N1 will be described.

At the time T10, the voltage of the node N1 is stable at the L level. From the time T10 to the time T11, the inverter circuit 12322 supplies the node N1 with the L-level voltage, such as the voltage VSS. Accordingly, the voltage of the node N1 is stable at the L level.

As in the example of FIG. 13, the L-level voltage of the node N1 is a voltage raised by the voltage adjustment circuit 1233 by the voltage difference ΔVL in comparison with the case without the voltage adjustment circuit 1233 where the voltage of the node N1 is stabilized based on, for example, the voltage VSS supplied from one of the latch input circuit 1231 and the inverter circuit 12322.

From the time T11 to the time T11d, the latch input circuit 1231 supplies the node N1 with a voltage, such as the voltage VSS, at the level obtained by inverting the H-level of the signal Din<0>. Accordingly, the voltage of the node N1 is stable at the L level.

From the time T11d to the time T12, the latch input circuit 1231 supplies the node N1 with a voltage, such as the voltage VDD, at the level obtained by inverting the L-level of the signal Din<0>. Accordingly, the voltage of the node N1 rises from the L level.

At the time T12, the value of the voltage of the node N1 is larger than or equal to the threshold Vth3; however, the voltage of the node N1 has not reached the H level.

In accordance with the value of the voltage of the node N1 being larger than or equal to the threshold Vth3, the inverter circuit 12321 supplies the node N2 with the L-level voltage. Accordingly, the value of the voltage of the node N2 is smaller than the threshold Vth4. In accordance with the value of the voltage of the node N2 being smaller than the threshold Vth4, the inverter circuit 12322 supplies the node N1 with the H-level voltage, such as the voltage VDD. Accordingly, the voltage of the node N1 further rises. When the voltage of the node N1 rises in this manner, the value of the voltage is still larger than or equal to the threshold Vth3 and the value of the voltage of the node N2 is still smaller than the threshold Vth4. Therefore, from the time T12 to the time T13, the inverter circuit 12321 continues supplying the node N2 with the L-level voltage, and the inverter circuit 12322 continues supplying the node N1 with, for example, the voltage VDD. In this manner, the voltage of the node N1 reaches and is stabilized at the H level. The voltage of the node N2 is stabilized at the L level.

As in the example of FIG. 13, the H-level voltage of the node N1 is a voltage lowered by the voltage adjustment circuit 1233 by the voltage difference ΔVH in comparison with the case without the voltage adjustment circuit 1233 where the voltage of the node N1 is stabilized based on, for example, the voltage VDD supplied from one of the latch input circuit 1231 and the inverter circuit 12322.

In this manner, the L level of the signal Din<0> immediately before the time T12, at which the signal Sig1 drops, is reflected in the voltage of each of the node N1 and the node N2. Accordingly, data of a bit of the odd-numbered bits being sent via the signal DQ<0> when the signal DQS drops is latched by the partial latch circuit LC1 as described with reference to FIG. 12.

From the time T13 to the time T14, the latch input circuit 1231 supplies the node N1 with a voltage, such as the voltage VSS, at the level obtained by inverting the H-level of the signal Din<0>. Accordingly, the voltage of the node N1 drops from the H level to the L level.

Advantageous Effects

FIG. 15 shows an example of a timing chart showing temporal changes of various signals when a partial latch circuit of a semiconductor memory device according to a comparative example of the first embodiment latches data of a bit sent via a signal DQ<0>. In the timing chart, while a temporal change of the signal Sig1 is shown, a temporal change of the signal Sig2 is omitted. This is because the signal Sig2 is merely a complementary signal of the signal Sig1.

The partial latch circuit of the semiconductor memory device according to the comparative example is different from the partial latch circuit LC1 of the semiconductor memory device 1 of the first embodiment in that the voltage adjustment circuit 1233 is omitted. In the following description, when constituents in the partial latch circuit are described, the constituents are accompanied by the same reference symbols as those used in the first embodiment.

The timing charts indicated by solid lines in FIG. 15 show temporal changes of various signals in the partial latch circuit of the comparative example under the same condition as that of the example of FIG. 13. Regarding the temporal changes of the signal Sig1 and signal Din<0>, the description of FIG. 13 applies, except that the time T00 is replaced with a time T0, the time T01 is replaced with a time T1, the time T02 is replaced with a time T2, the time T03 is replaced with a time T3, the time T04 is replaced with a time T4, the time T01*d* is replaced with a time T1*d*, and the time T02*d* is replaced with a time T2*d*. The period of time from the time T1*d* to the time T2 is the same as the period of time ΔT from the time T01*d* to the time T02. Regarding whether each of the latch input circuit 1231 and the inverter circuit 12322 is ON or OFF, the description of FIG. 13 applies, except that the times are replaced as described above.

Hereinafter, the voltage of the node N1 will be described.

From the time T0 to the time T1*d* in FIG. 15, the voltage of the node N1 is stable at the H level as in the period from the time T00 to the time T01*d* in the example of FIG. 13. Since the partial latch circuit does not include the voltage adjustment circuit 1233, the H-level voltage is not a lowered voltage, unlike in the case of the example of FIG. 13.

From the time T1*d* to the time T2 in FIG. 15, the voltage of the node N1 drops from the H level as in the period from the time T01*d* to the time T02 in the example of FIG. 13.

At the time T2 in FIG. 15, the value of the voltage of the node N1 is still larger than or equal to the threshold Vth3, unlike at the time T02 in the example of FIG. 13. Therefore, from the time T2 to the time T3, the inverter circuit 12321 and the inverter circuit 12322 each output a voltage at the level opposite to that from the time T02 to the time T03 in the example of FIG. 13; consequently, each of the node N1 and the node N2 is stabilized at the level which is opposite to that in the example of FIG. 13.

Next, the case where the temporal change of the signal Sig1 is the same as above, but the signal Din<0> rises from the L level to the H level earlier than in the above-described case, will be described. In this case, the temporal change of the signal Din<0> and the change in the voltage of the node N1 are as follows. The changes are indicated by broken lines in FIG. 15.

At the time T1*e* in FIG. 15, the signal Din<0> rises from the L level to the H level. The time T1*e* is after the time T1 and before the time T1*d*. The period of time from the time T1*e* to the time T2 is a period of time ΔTa, and is longer than the period of time ΔT. From the time T1*e* to the time T2, the L-level voltage, such as the voltage VSS, is supplied to the node N1 as in the period from the time T01*d* to the time T02 in the example of FIG. 13. Accordingly, the voltage of the node N1 drops from the H level.

At the time T2 in FIG. 15, the value of the voltage of the node N1 is smaller than the threshold Vth3, like at the time T02 in the example of FIG. 13. As in the example of FIG. 13, the value of the voltage of the node N2 becomes larger than or equal to the threshold Vth4 immediately after the value of the voltage of the node N1 becomes smaller than the threshold Vth3. Therefore, from the time T2 to the time T3, the inverter circuit 12321 and the inverter circuit 12322 each output a voltage at the same level as in the period from the time T02 to the time T03 in the example of FIG. 13. Consequently, as in the example of FIG. 13, the voltage of the node N1 reaches and is stabilized at the L level, and the voltage of the node N2 is stabilized at the H level. Since the partial latch circuit does not include the voltage adjustment circuit 1233, the L-level voltage of the node N1 is not a raised voltage, unlike in the case of the example of FIG. 13.

In either one of the above-described cases of the comparative example, the signal Din<0> rises while the signal Sig1 is at the H level. Nevertheless, in the first case (the waveform indicated by the solid line in FIG. 15), the H level of the signal Din<0> immediately before the time T2, at which the signal Sig1 drops, is not reflected in the voltage of each of the node N1 and the node N2, unlike in the latter case (the waveform indicated by the broken line in FIG. 15). This means that data of a bit being sent via the signal Din<0> during a period in which the signal Din<0> is at the H level is not correctly latched by the partial latch circuit. This may lead to a malfunction.

When the period of time ΔT from the change of the level of the signal Din<0> to the drop of the signal Sig1 is short as in the first case (the waveform indicated by the solid line in FIG. 15), the period of time allowed for the latch input circuit 1231 changing the voltage of the node N1 in accordance with the change of the level of the signal Din<0> is short. Therefore, as described above, data of a bit being sent to the node N1 via the signal Din<0> when the signal Sig1 drops may not be correctly latched.

As described with reference to FIG. 13, even when the period of time from the rise of the signal Din<0> to the drop of the signal Sig1 is such a short time as the period of time ΔT, the partial latch circuit LC1 of the semiconductor memory device 1 of the first embodiment can correctly latch data of a bit being sent via the signal Din<0> at the time of the drop. This is because, in the semiconductor memory device 1 of the first embodiment, the H-level voltage of the node N1 is a voltage lowered by the voltage adjustment circuit 1233 by the voltage difference ΔVH; therefore, the voltage of the node N1 can be lowered by the latch input circuit 1231 from the H level to take a value smaller than the threshold Vth3 in such a short period of time as the period of time ΔT.

Such a short period of time from the rise of the signal Din<0> to the drop of the signal Sig1 may occur, for example when the semiconductor memory device 1 operates at a high speed. Therefore, the partial latch circuit LC1 of the semiconductor memory device 1 of the first embodiment can correctly latch data of each of the odd-numbered bits of the signal Din<0> even when the semiconductor memory device 1 operates at a high speed.

Described above is a comparison between the partial latch circuit of the semiconductor memory device of the comparative example of the first embodiment and the partial latch circuit LC1 of the semiconductor memory device 1 of the first embodiment, with the cases of FIGS. 13 and 15 taken as examples. The same applies to the case where the partial latch circuit LC1 of the semiconductor memory device 1 according to the first embodiment operates based on the signal Sig1, signal Sig2, and signal Din<0> shown in FIG. 14. Even when the period of time from the drop of the signal Din<0> to the drop of the signal Sig1 is short, the partial latch circuit LC1 of the semiconductor memory device 1 of the first embodiment can correctly latch data of a bit being sent via the signal Din<0> at the time of the drop of the signal Sig1. This is because, in the semiconductor memory device 1 of the first embodiment, the L-level voltage of the node N1 is a voltage raised by the voltage adjustment circuit 1233 by the voltage difference ΔVL; therefore, the voltage of the node N1 can be raised by the latch input circuit 1231 from the L level to take a value larger than or equal to the threshold Vth3 in such a short period of time.

Second Embodiment

Hereinafter, a semiconductor memory device 1*a* according to a second embodiment will be described.

Configuration Example

A configuration of the semiconductor memory device 1*a* according to the second embodiment will be described, focusing on differences from the configuration of the semiconductor memory device 1 according to the first embodiment.

The semiconductor memory device 1*a* according to the second embodiment is different from the configuration of the semiconductor memory device 1 according to the first embodiment in that it includes a partial latch circuit LC1*a* instead of the partial latch circuit LC1. When a constituent of the semiconductor memory device 1*a* according to the second embodiment which includes the partial latch circuit LC1*a* is referred to, the constituent will be accompanied by the same reference symbol as that used in the first embodiment with a suffix a added thereto. For example, the semiconductor memory device according to the second embodiment will be referred to as a "semiconductor memory device 1*a*".

FIG. 16 shows an example of a configuration of the partial latch circuit LC1*a* of the semiconductor memory device 1*a* according to the second embodiment.

The partial latch circuit LC1*a* shown in FIG. 16 is different from the partial latch circuit LC1 shown in FIG. 10 in that it includes a voltage adjustment circuit 1233*a* instead of the voltage adjustment circuit 1233. The voltage adjustment circuit 1233*a* is also included in the internal processing circuit INC1*a*, although it is not shown. Also, in the other drawings showing a configuration of a partial latch circuit to be referred to below, the circuits other than the latch input circuit 1231 are included in the internal processing circuit.

The voltage adjustment circuit 1233*a* includes, for example, an inverter INV6 and a switch SW4.

The input terminal of the inverter INV6 is coupled to the node N1, and the output terminal of the inverter INV6 is coupled to a first terminal of the switch SW4. A second terminal of the switch SW4 is coupled to the node N1.

The voltage adjustment circuit 1233*a* outputs a voltage based on the voltage of the node N1 as follows.

The inverter INV6 supplies the first terminal of the switch SW4 coupled to the output terminal with, for example, the L-level voltage while the value of the voltage of the node N1 coupled to the input terminal is larger than or equal to a threshold Vth6, and the H-level voltage while the value is smaller than the threshold Vth6. The switch SW4 transfers the voltage accordingly supplied to the first terminal to the node N1 coupled to the second terminal while the switch SW4 is ON. The switch SW4 is OFF while the signal Sig1 is at the L level and the signal Sig2 is at the H level and is ON while the signal Sig1 is at the H level and the signal Sig2 is at the L level. Accordingly, the switch SW4 is ON while the switch SW2 is ON, and the switch SW4 is OFF while the switch SW2 is OFF.

The function of adjusting the voltage of the node N1, which is performed by the voltage adjustment circuit 1233*a* while the signal Sig1 is at the H level, will be described. During this period, the switches SW2 and SW4 are ON and the switch SW3 is OFF, i.e., the latch input circuit 1231 and voltage adjustment circuit 1233*a* are ON and the inverter circuit 12322 is OFF.

When the latch input circuit 1231 supplies the node N1 with the H-level voltage, the voltage of the node N1 may thereby be caused to rise. When the value of the voltage becomes larger than or equal to the threshold Vth6, the voltage adjustment circuit 1233*a* supplies the node N1 with the L-level voltage in accordance with the value of the voltage of the node N1 being larger than or equal to the threshold Vth6. As a result, the voltage of the node N1 may be stabilized at the H level. The H-level voltage is lower than the voltage in the case where the voltage of the node N1 is stabilized based on the H-level voltage supplied from the latch input circuit 1231 with no voltage supply from the voltage adjustment circuit 1233*a*. These are because, when the voltage of the node N1 is stable at the H level, a resistance R6L of the path from the source of the L-level voltage supplied by the voltage adjustment circuit 1233*a* to the node N1 is larger than the resistance R2H of the path from the source of the H-level voltage supplied by the latch input circuit 1231 to the node N1. For example, when the voltage of the node N1 is stable at the H level, (magnitude of resistance R6L)/(magnitude of resistance R2H) is not less than 5/3 and not more than 3.

When the latch input circuit 1231 supplies the node N1 with the L-level voltage, the voltage of the node N1 may thereby be lowered. When the value of the voltage becomes smaller than the threshold Vth6, the voltage adjustment circuit 1233*a* supplies the node N1 with the H-level voltage in accordance with the value of the voltage of the node N1 being smaller than the threshold Vth6. As a result, the voltage of the node N1 may be stabilized at the L level. The L-level voltage is higher than the voltage in the case where the voltage of the node N1 is stabilized based on the L-level voltage supplied from the latch input circuit 1231 with no voltage supply from the voltage adjustment circuit 1233*a*. These are because, when the voltage of the node N1 is stable at the L level, a resistance R6H of the path from the source of the H-level voltage supplied by the voltage adjustment circuit 1233*a* to the node N1 is larger than the resistance R2L of the path from the source of the L-level voltage supplied by the latch input circuit 1231 to the node N1. For example, when the voltage of the node N1 is stable at the L level, (magnitude of resistance R6H)/(magnitude of resistance R2L) is not less than 5/3 and not more than 3.

The period in which the signal Sig1 is at the L level will be described. During this period, the switches SW2 and SW4 are OFF and the switch SW3 is ON, i.e., the latch input circuit 1231 and voltage adjustment circuit 1233*a* are OFF and the inverter circuit 12322 is ON. Therefore, even when the voltage of the node N1 is stable at the H level or the L level, the voltage adjustment circuit 1233*a* does not perform the above-described voltage lowering or voltage raising on the voltage of the node N1.

Figure 17:
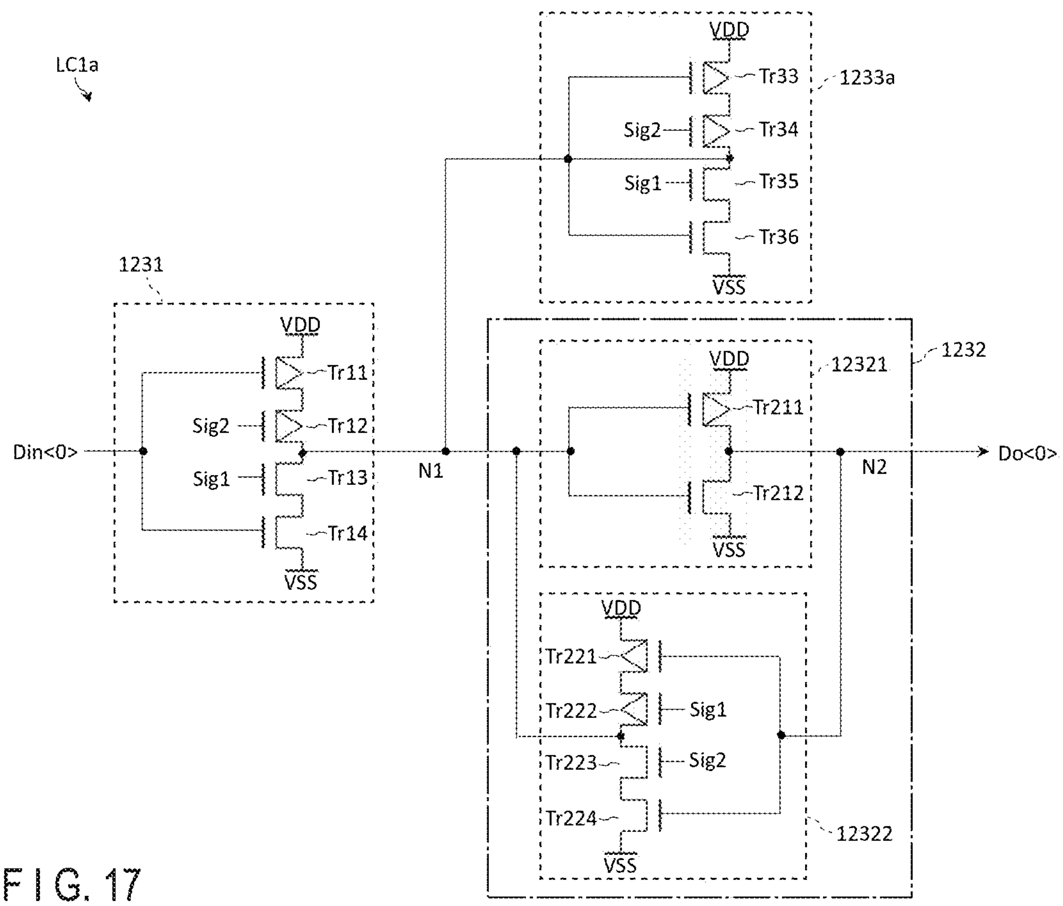
FIG. 17 shows an example of a circuit configuration of the partial latch circuit of the semiconductor memory device according to the second embodiment.

FIG. 17 shows an example of a circuit configuration of the partial latch circuit LC1*a* of the semiconductor memory device 1*a* according to the second embodiment.

The circuit configurations of the latch input circuit 1231 and positive feedback circuit 1232 shown in FIG. 17 are the same as those in the example of FIG. 11. A circuit configuration of the voltage adjustment circuit 1233*a* will be described. In the example of FIG. 17, the voltage adjustment circuit 1233*a* is implemented by a clock synchronization CMOS inverter circuit.

The voltage adjustment circuit 1233*a* includes, for example, p-channel MOS transistors Tr33 and Tr34 and n-channel MOS transistors Tr35 and Tr36.

For example, the voltage VDD is applied to a first terminal of the transistor Tr33, a second terminal of the transistor Tr33 is coupled to a first terminal of the transistor Tr34, and a second terminal of the transistor Tr34 is coupled to the node N1. A first terminal of the transistor Tr35 is coupled to the node N1, a second terminal of the transistor Tr35 is coupled to a first terminal of the transistor Tr36, and for example the voltage VSS is applied to a second terminal of the transistor Tr36. The gate of each of the transistors Tr33 and Tr36 is coupled to the node N1. The signal Sig2 is input to the gate of the transistor Tr34. The signal Sig1 is input to the gate of the transistor Tr35.

While the signal Sig1 is at the L level and the signal Sig2 is at the H level, the transistors Tr34 and Tr35 are OFF. Therefore, neither the voltage VDD applied to the first terminal of the transistor Tr33 nor the voltage VSS applied to the second terminal of the transistor Tr36 is supplied to the node N1.

While the signal Sig1 is at the H level and the signal Sig2 is at the L level, the transistors Tr34 and Tr35 are ON. During this period, the voltage adjustment circuit 1233*a* supplies a voltage to the node N1 as follows.

When the value of the voltage of the node N1 is smaller than the threshold Vth6, the transistor Tr33 is ON and the transistor Tr36 is OFF. Therefore, in accordance with the value of the voltage of the node N1 being smaller than the threshold Vth6, the voltage VDD applied to the first terminal of the transistor Tr33 is supplied to the node N1. In contrast, when the value of the voltage of the node N1 is larger than or equal to the threshold Vth6, the transistor Tr33 is OFF and the transistor Tr36 is ON. Therefore, in accordance with the value of the voltage of the node N1 being larger than or equal to the threshold Vth6, the voltage VSS applied to the second terminal of the transistor Tr36 is supplied to the node N1.

When the voltage of the node N1 is stabilized at the H level by the latch input circuit 1231 supplying the node N1 with the H-level voltage and the voltage adjustment circuit 1233*a* supplying the node N1 with the L-level voltage as described with reference to FIG. 16, the sum of the on-resistances of the transistors Tr35 and Tr36 is larger than the sum of the on-resistances of the transistors Tr11 and Tr12. For this purpose, for example the sizes of those transistors Tr, which are defined by (gate width of transistor Tr)/(gate length of transistor Tr), have the following relationship: The size of the transistor Tr35 is the smallest, and the sizes of the transistors Tr11, Tr12, and Tr36 are substantially the same. To achieve this, it is possible to, for example, make the gate lengths of the transistors Tr substantially the same, and make the gate widths of the transistors Tr have the following relationship: The gate width of the transistor Tr35 is the smallest, and the gate widths of the transistors Tr11, Tr12, and Tr36 are substantially the same.

When the voltage of the node N1 is stabilized at the L level by the latch input circuit 1231 supplying the node N1 with the L-level voltage and the voltage adjustment circuit 1233*a* supplying the node N1 with the H-level voltage as described with reference to FIG. 16, the sum of the on-resistances of the transistors Tr33 and Tr34 is larger than the sum of the on-resistances of the transistors Tr13 and Tr14. For this purpose, for example the aforementioned sizes of the transistors Tr have the following relationship: The size of the transistor Tr34 is the smallest, and the sizes of the transistors Tr13, Tr14, and Tr33 are substantially the same. To achieve this, it is possible to, for example, make the gate lengths of the transistors Tr substantially the same, and make the gate widths of the transistors Tr have the following relationship: The gate width of the transistor Tr34 is the smallest, and the gate widths of the transistors Tr13, Tr14, and Tr33 are substantially the same.

Operation Example

Figure 18:
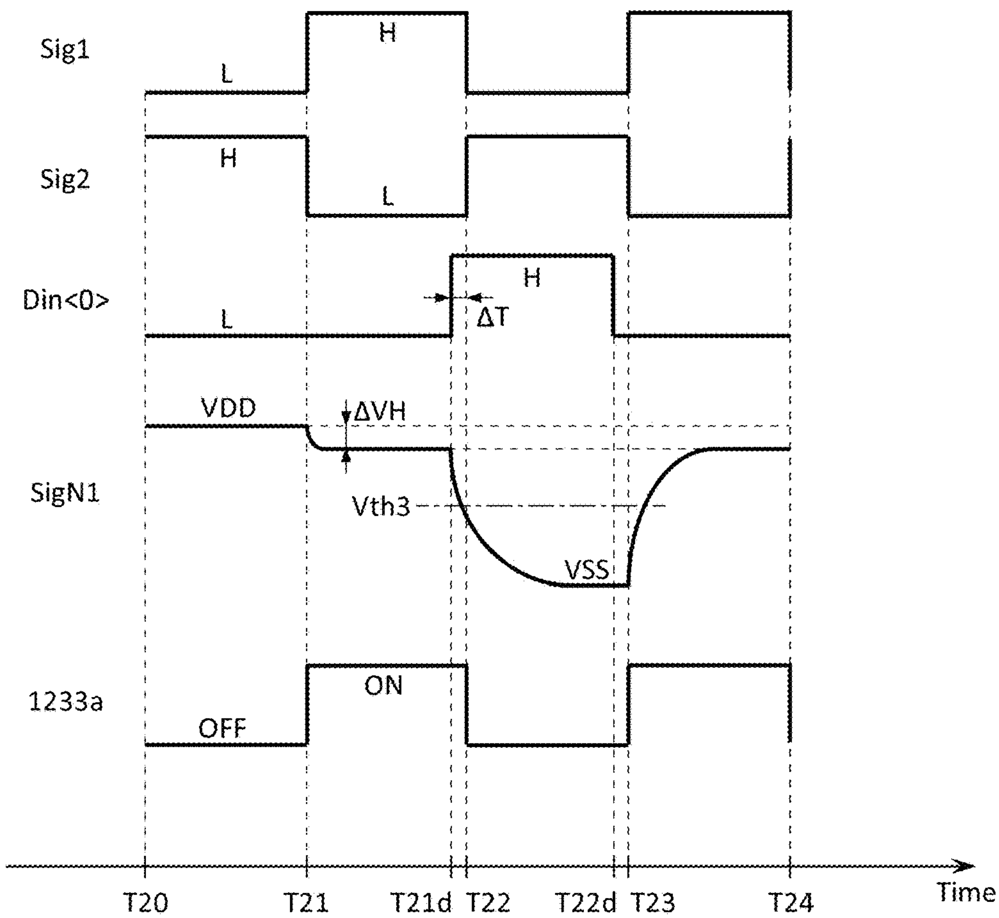
FIG. 18 shows an example of a timing chart showing temporal changes of various signals when the partial latch circuit of the semiconductor memory device according to the second embodiment latches data of a bit sent via a signal.

FIG. 18 shows an example of a timing chart showing temporal changes of various signals when the partial latch circuit LC1*a* of the semiconductor memory device 1*a* according to the second embodiment latches data of a bit sent via the signal DQ<0>.

Regarding the temporal changes of the signal Sig1, signal Sig2, and signal Din<0>, the description of FIG. 13 applies, except that the time T00 is replaced with a time T20, the time T01 is replaced with a time T21, the time T02 is replaced with a time T22, the time T03 is replaced with a time T23, the time T04 is replaced with a time T24, the time T01*d* is replaced with a time T21*d*, and the time T02*d* is replaced with a time T22*d*. The period of time from the time T21*d* to the time T22 is the same as the period of time ΔT from the time T01*d* to the time T02. Regarding whether each of the latch input circuit 1231 and the inverter circuit 12322 is ON or OFF, the description of FIG. 13 applies, except that the times are replaced as described above.

Like the latch input circuit 1231, the voltage adjustment circuit 1233*a* is OFF while the signal Sig1 is at the L level and is ON while the signal Sig1 is at the H level. Therefore, the voltage adjustment circuit 1233*a* is OFF from the time T20 to the time T21 and from the time T22 to the time T23, and is ON from the time T21 to the time T22 and from the time T23 to the time T24.

Hereinafter, the voltage of the node N1 will be described.

From the time T20 to the time T21*d*, the voltage of the node N1 is at the H level as in the period from the time T00 to the time T01*d* in the example of FIG. 13. However, from the time T20 to the time T21, since the voltage adjustment circuit 1233*a* is OFF, the H-level voltage is not a lowered voltage, as in the case of the comparative example in FIG. 15. From the time T21, at which the voltage adjustment circuit 1233*a* is turned on, control by the voltage adjustment circuit 1233*a* works. As a result, the voltage of the node N1 is stabilized at the H level lowered by the voltage difference ΔVH as in the example of FIG. 13, and is stable at the H level until the time T21*d*.

From the time T21*d* to the time T22, the voltage of the node N1 drops from the H level as in the period from the time T01*d* to the time T02 in the example of FIG. 13. In this period, the voltage adjustment circuit 1233*a* is still ON.

At the time T22, the value of the voltage of the node N1 is smaller than the threshold Vth3, like the time T02 in the example of FIG. 13. As in the example of FIG. 13, the value of the voltage of the node N2 becomes larger than or equal to the threshold Vth4 immediately after the value of the voltage of the node N1 becomes smaller than the threshold Vth3. Therefore, from the time T22 to the time T23, the H-level voltage is supplied to the node N2 and the L-level voltage is supplied to the node N1 as in the period from the time T02 to the time T03 in the example of FIG. 13. Consequently, as in the example of FIG. 13, the voltage of the node N1 reaches and is stabilized at the L level, and the voltage of the node N2 is stabilized at the H level. However, since the voltage adjustment circuit 1233a is OFF during this period, the L-level voltage of the node N1 is not a raised voltage, as in the case of the comparative example in FIG. 15.

In this manner, the H level of the signal Din<0> immediately before the time T22, at which the signal Sig1 drops, is reflected in the voltage of each of the node N1 and the node N2, as in the example of FIG. 13. Accordingly, data of a bit of the odd-numbered bits being sent via the signal DQ<0> when the signal DOS drops is latched by the partial latch circuit LC1a as described with reference to FIG. 12.

From the time T23 to the time T24, the H-level voltage is supplied to the node N1 as in the period from the time T03 to the time T04 in the example of FIG. 13. Accordingly, the voltage of the node N1 rises from the L level, and reaches and is stabilized at the H level. During this period, the voltage adjustment circuit 1233a is ON. Therefore, the H-level voltage of the node N1 is a voltage lowered by the voltage adjustment circuit 1233a by the voltage difference ΔVH, as in the example of FIG. 13.

Advantageous Effects

The partial latch circuit LC1a of the semiconductor memory device 1a according to the second embodiment produces the following advantageous effects in addition to the advantageous effects described in the first embodiment. First, of the power consumption of the partial latch circuit LC1 of the semiconductor memory device 1 according to the first embodiment, power consumption attributed to the voltage adjustment circuit 1233 will be described. The period in which the signal Sig1 is at the H level and the period in which the signal Sig1 is at the L level, which come alternately, will be separately described.

The period in which the signal Sig1 is at the H level will be described. During this period, the latch input circuit 1231 is ON and the inverter circuit 12322 is OFF. There is a case where, while being supplied with the H-level or L-level voltage by the latch input circuit 1231, the node N1 is also supplied, by the voltage adjustment circuit 1233, with a voltage at an opposite level to the voltage supplied by the latch input circuit 1231. During this period, a current flows from the source of the H-level voltage to the source of the L-level voltage. The current occurs due to the control by the voltage adjustment circuit 1233, and power based on the current is consumed by the partial latch circuit LC1.

The period in which the signal Sig1 is at the L level will be described. During this period, the latch input circuit 1231 is OFF and the inverter circuit 12322 is ON. The above description as to the period in which the signal Sig1 is at the H level applies, except that the latch input circuit 1231 is replaced with the inverter circuit 12322.

The partial latch circuit LC1a of the semiconductor memory device 1a according to the second embodiment is different from the partial latch circuit LC1 in that it includes a voltage adjustment circuit 1233a instead of the voltage adjustment circuit 1233. Like the latch input circuit 1231, the voltage adjustment circuit 1233a is OFF while the signal Sig1 is at the L level and is ON while the signal Sig1 is at the H level. Therefore, of the power consumption of the partial latch circuit LC1a of the semiconductor memory device 1a according to the second embodiment, power consumption attributed to the voltage adjustment circuit 1233a is as follows.

During the period in which the signal Sig1 is at the H level, the voltage adjustment circuit 1233a is ON; therefore, power at substantially the same level as that described in connection with the semiconductor memory device 1 according to the first embodiment is consumed by the partial latch circuit LC1a. During the period in which the signal Sig1 is at the L level, the voltage adjustment circuit 1233a is OFF; therefore, the above-described current does not flow. Consequently, there is no such power consumption as that described in connection with the semiconductor memory device 1 according to the first embodiment. Therefore, the partial latch circuit LC1a of the semiconductor memory device 1a according to the second embodiment can reduce power consumption.

[Modifications]

The circuit configuration of the voltage adjustment circuit 1233a is not limited to the one shown in FIG. 17. Hereinafter, another example of the circuit configuration of the voltage adjustment circuit 1233a will be described.

Figure 19:
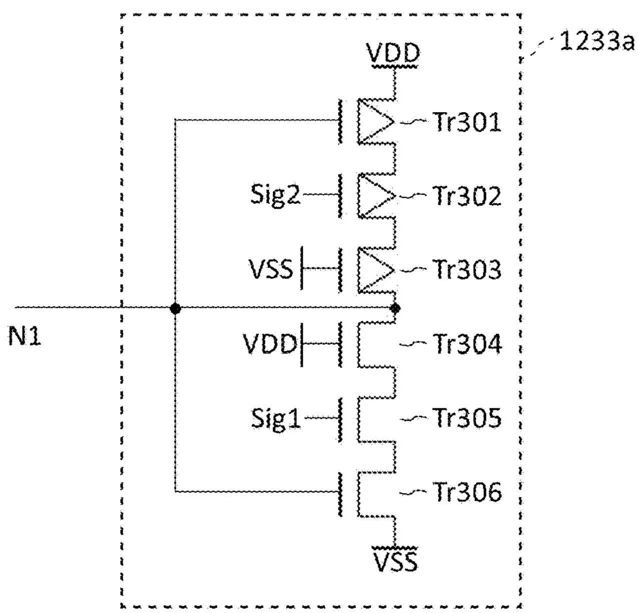
FIG. 19 shows an example of a circuit configuration of a voltage adjustment circuit of the partial latch circuit of the semiconductor memory device according to the second embodiment.

FIG. 19 shows another example of the circuit configuration of the voltage adjustment circuit 1233a of the partial latch circuit LC1a of the semiconductor memory device 1a according to the second embodiment.

The voltage adjustment circuit 1233a includes, for example, p-channel MOS transistors Tr301, Tr302, and Tr303 and n-channel MOS transistors Tr304, Tr305, and Tr306.

For example, the voltage VDD is applied to a first terminal of the transistor Tr301, and a second terminal of the transistor Tr301 is coupled to a first terminal of the transistor Tr302. A second terminal of the transistor Tr302 is coupled to a first terminal of the transistor Tr303, and a second terminal of the transistor Tr303 is coupled to the node N1. A first terminal of the transistor Tr304 is coupled to the node N1, and a second terminal of the transistor Tr304 is coupled to a first terminal of the transistor Tr305. A second terminal of the transistor Tr305 is coupled to a first terminal of the transistor Tr306 and, for example, the voltage VSS is applied to a second terminal of the transistor Tr306. The gate of each of the transistors Tr301 and Tr306 is coupled to the node N1. The signal Sig2 is input to the gate of the transistor Tr302, and the signal Sig1 is input to the gate of the transistor Tr305. For example, the voltage VSS is applied to the gate of the transistor Tr303 and, for example, the voltage VDD is applied to the gate of the transistor Tr304.

Since, for example, the voltage VSS is applied to the gate of the transistor Tr303, the transistor Tr303 is ON. Since, for example, the voltage VDD is applied to the gate of the transistor Tr304, the transistor Tr304 is ON.

Regarding the supply of a voltage to the node N1 by the voltage adjustment circuit 1233a based on the signals Sig1 and Sig2 and the voltage of the node N1, the description of FIG. 17 applies, except that the transistor Tr33 is replaced with the transistor Tr301, the transistor Tr34 is replaced with the transistor Tr302, the transistor Tr35 is replaced with the transistor Tr305, and the transistor Tr36 is replaced with the transistor Tr306.

When the voltage of the node N1 is stabilized at the H level by the latch input circuit 1231 supplying the node N1 with the H-level voltage and the voltage adjustment circuit 1233a supplying the node N1 with the L-level voltage as described with reference to FIG. 16, the sum of the on-resistances of the transistors Tr304, Tr305, and Tr306 is larger than the sum of the on-resistances of the transistors Tr11 and Tr12. When the voltage of the node N1 is stabilized at the L level by the latch input circuit 1231 supplying the node N1 with the L-level voltage and the voltage adjustment circuit 1233*a* supplying the node N1 with the H-level voltage as described with reference to FIG. 16, the sum of the on-resistances of the transistors Tr301, Tr302, and Tr303 is larger than the sum of the on-resistances of the transistors Tr13 and Tr14.

A contact plug is used for each of the input of the signal Sig2 to the gate of the transistor Tr302 and the coupling of the second terminal of the transistor Tr303 and the first terminal of the transistor Tr304 to the node N1 in the example of FIG. 19. Similarly, a contact plug is used for each of the input of the signal Sig2 to the gate of the transistor Tr34 and the coupling of the second terminal of the transistor Tr34 and the first terminal of the transistor Tr35 to the node N1 in the example of FIG. 17. The distance between the two contact plugs in the example of FIG. 19 is larger than that in the example of FIG. 17. Therefore, the capacitive coupling between the contact plugs in the example of FIG. 19 is smaller than that in the example of FIG. 17. The same applies to the relationship between the contact plug used for the input of the signal Sig1 to the gate of the transistor Tr305 and the contact plug used for the coupling of the second terminal of the transistor Tr303 and the first terminal of the transistor Tr304 to the node N1 in the example of FIG. 19. Therefore, in the case of the example of FIG. 19, an influence between the voltage of the node N1 and each of the signals Sig1 and Sig2 input to the voltage adjustment circuit 1233*a* is smaller than in the case of the example of FIG. 17. Consequently, in the case of the example of FIG. 19, the partial latch circuit LC1*a* of the semiconductor memory device 1*a* according to the second embodiment can operate more accurately than in the case of the example of FIG. 17.

The same circuit configuration as that shown in FIG. 19 may be provided in the other circuit configurations disclosed herein for the purpose of decreasing the capacitive coupling between a contact plug used for coupling to a node and a contact plug used for inputting a signal such as the signal Sig1 or Sig2 to the gate of a transistor Tr.

Third Embodiment

Hereinafter, a semiconductor memory device 1*b* according to a third embodiment will be described.

Configuration Example

A configuration of the semiconductor memory device 1*b* according to the third embodiment will be described, focusing on differences from the configuration of the semiconductor memory device 1 according to the first embodiment.

The semiconductor memory device 1*b* according to the third embodiment is different from the semiconductor memory device 1 according to the first embodiment in that it includes a partial latch circuit LC1*b* instead of the partial latch circuit LC1. When a constituent of the semiconductor memory device 1*b* according to the third embodiment which includes the partial latch circuit LC1*b* or which may have the same configuration as the partial latch circuit LC1*b* is referred to, the constituent will be accompanied by the same reference symbol as that used in the first embodiment with a suffix b added thereto.

Figure 20:
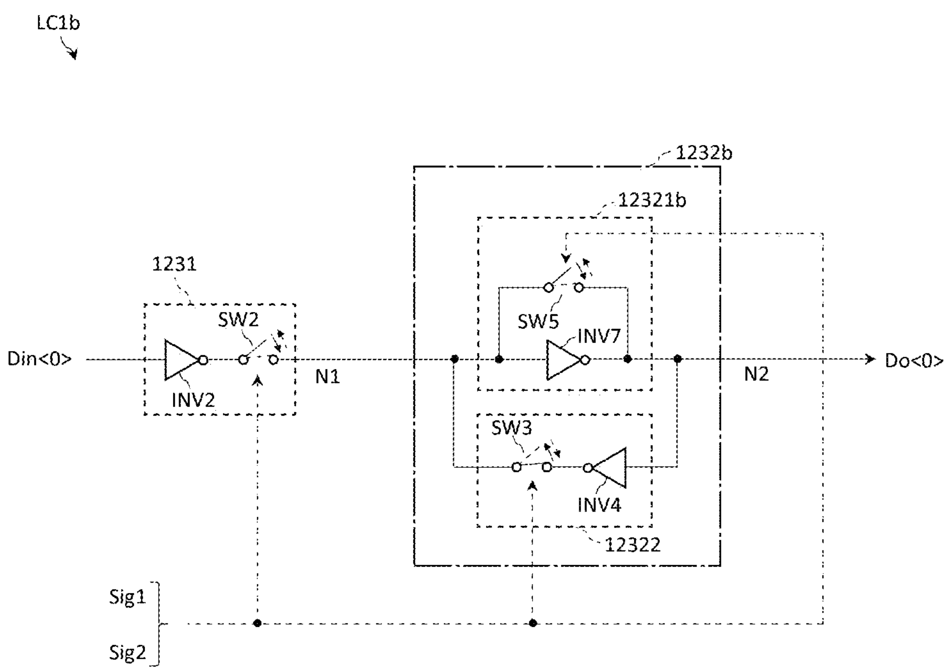
FIG. 20 shows an example of a configuration of a partial latch circuit of a semiconductor memory device according to a third embodiment.

FIG. 20 shows an example of a configuration of the partial latch circuit LClb of the semiconductor memory device 1*b* according to the third embodiment.

The partial latch circuit LClb shown in FIG. 20 is different from the partial latch circuit LC1 shown in FIG. 10 in that it includes a positive feedback circuit 1232*b* instead of the positive feedback circuit 1232 and the voltage adjustment circuit 1233. The positive feedback circuit 1232*b* is different from the positive feedback circuit 1232 in that it includes an inverter circuit 12321*b* instead of the inverter circuit 12321. The configuration of the inverter circuit 12322 of the positive feedback circuit 1232*b* is as described with reference to FIG. 10.

The inverter circuit 12321*b* includes, for example, an inverter INV7 and a switch SW5.

The input terminal of the inverter INV7 is coupled to the node N1, and the output terminal of the inverter INV7 is coupled to the node N2. A first terminal of the switch SW5 is coupled to the node N2, and a second terminal of the switch SW5 is coupled to the node N1.

The inverter circuit 12321*b* outputs a voltage based on the voltage of the node N1 as follows.

Like the inverter INV3 in the example of FIG. 10, the inverter INV7 supplies the node N2 coupled to the output terminal with, for example, the L-level voltage while the value of the voltage of the node N1 coupled to the input terminal is larger than or equal to a threshold Vth7, and the H-level voltage while the value is smaller than the threshold Vth7. The switch SW5 transfers the voltage accordingly supplied to the node N2 coupled to the first terminal to the node N1 coupled to the second terminal while the switch SW5 is ON. The switch SW5 is OFF while the signal Sig1 is at the L level and the signal Sig2 is at the H level, and is ON while the signal Sig1 is at the H level and the signal Sig2 is at the L level. Accordingly, the switch SW5 is ON while the switch SW2 is ON, and the switch SW5 is OFF while the switch SW2 is OFF.

Hereinafter, when the inverter circuit 12321*b* can transfer the voltage output by the inverter circuit 12321*b* to the node N1, such as while the switch SW5 is ON, the inverter circuit 12321*b* will also be referred to as being in an adjustable state. In the other cases, the inverter circuit 12321*b* will also be referred to as being in a non-adjustable state.

The function of adjusting the voltage of the node N1, which is performed by the inverter circuit 12321*b* while the signal Sig1 is at the H level, will be described. During this period, the switches SW2 and SW5 are ON and the switch SW3 is OFF, i.e., the latch input circuit 1231 is ON, the inverter circuit 12321*b* is in the adjustable state, and the inverter circuit 12322 is OFF.

When the latch input circuit 1231 supplies the node N1 with the H-level voltage, the voltage of the node N1 may thereby be caused to rise. When the value of the voltage becomes larger than or equal to the threshold Vth7, the inverter circuit 12321*b* supplies the node N1 with the L-level voltage in accordance with the value of the voltage of the node N1 being larger than or equal to the threshold Vth7. As a result, the voltage of the node N1 may be stabilized at the H level. The H-level voltage is lower than the voltage in the case where the voltage of the node N1 is stabilized based on the H-level voltage supplied from the latch input circuit 1231 with no voltage supply from the inverter circuit 12321*b*. These are because, when the voltage of the node N1 is stable at the H level, a resistance R7L of the path from the source of the L-level voltage supplied by the inverter circuit 12321*b* to the node N1 is larger than the resistance R2H of the path from the source of the H-level voltage supplied by the latch input circuit 1231 to the node N1. For example, when the voltage of the node N1 is stable at the H level, (magnitude of resistance R7L)/(magnitude of resistance R2H) is not less than 5/3 and not more than 3.

When the latch input circuit 1231 supplies the node N1 with the L-level voltage, the voltage of the node N1 may thereby be lowered. When the value of the voltage becomes smaller than the threshold Vth7, the inverter circuit 12321*b* supplies the node N1 with the H-level voltage in accordance with the value of the voltage of the node N1 being smaller than the threshold Vth7. As a result, the voltage of the node N1 may be stabilized at the L level. The L-level voltage is higher than the voltage in the case where the voltage of the node N1 is stabilized based on the L-level voltage supplied from the latch input circuit 1231 with no voltage supply from the inverter circuit 12321*b*. These are because, when the voltage of the node N1 is stable at the L level, a resistance R7H of the path from the source of the H-level voltage supplied by the inverter circuit 12321*b* to the node N1 is larger than the resistance R2L of the path from the source of the L-level voltage supplied by the latch input circuit 1231 to the node N1. For example, when the voltage of the node N1 is stable at the L level, (magnitude of resistance R7H)/(magnitude of resistance R2L) is not less than 5/3 and not more than 3.

The period in which the signal Sig1 is at the L level will be described. During this period, the switches SW2 and SW5 are OFF and the switch SW3 is ON, i.e., the latch input circuit 1231 is OFF, the inverter circuit 12321*b* is in the non-adjustable state, and the inverter circuit 12322 is ON. Therefore, even when the voltage of the node N1 is stable at the H level or the L level, the inverter circuit 12321*b* does not perform the above-described voltage lowering or voltage raising on the voltage of the node N1.

Figure 21:
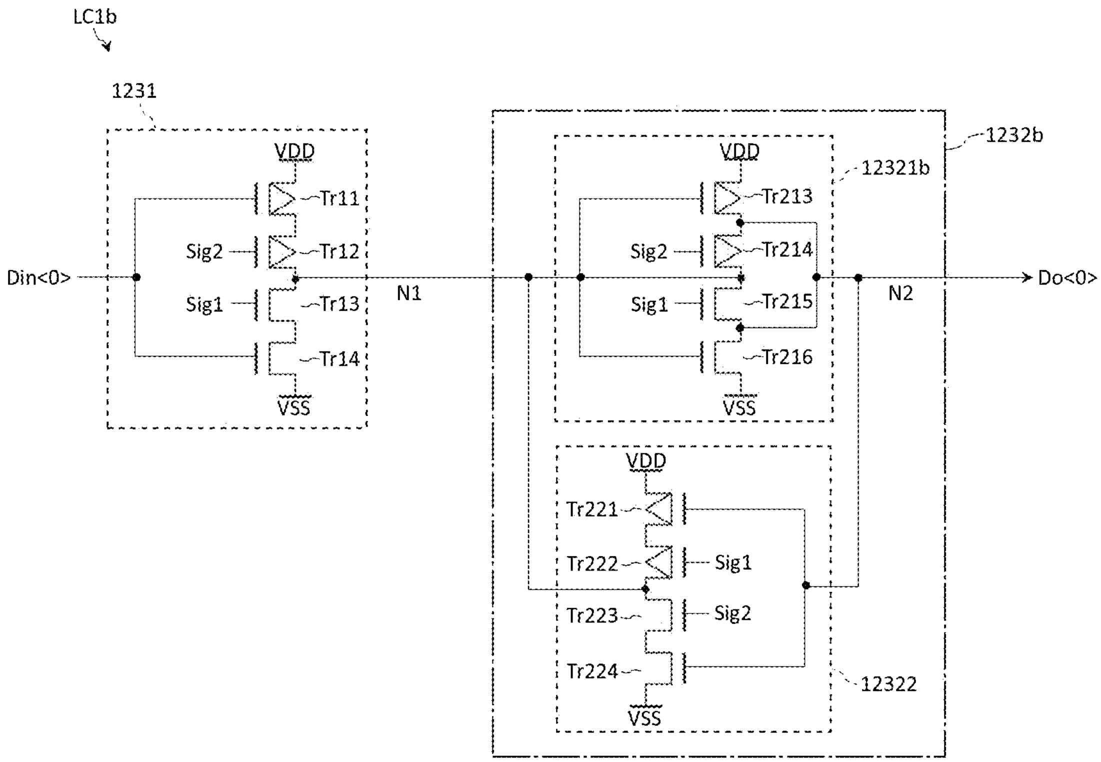
FIG. 21 shows an example of a circuit configuration of the partial latch circuit of the semiconductor memory device according to the third embodiment.

FIG. 21 shows an example of a circuit configuration of the partial latch circuit LC1*b* of the semiconductor memory device 1*b* according to the third embodiment.

The circuit configurations of the latch input circuit 1231 and inverter circuit 12322 shown in FIG. 21 are the same as those in the example of FIG. 11. A circuit configuration of the inverter circuit 12321*b* will be described.

The inverter circuit 12321*b* includes, for example, p-channel MOS transistors Tr213 and Tr214 and n-channel MOS transistors Tr215 and Tr216.

For example, the voltage VDD is applied to a first terminal of the transistor Tr213, and a second terminal of the transistor Tr213 is coupled to the node N2. A first terminal of the transistor Tr214 is coupled to the node N2, and a second terminal of the transistor Tr214 is coupled to the node N1. A first terminal of the transistor Tr215 is coupled to the node N1, and a second terminal of the transistor Tr215 is coupled to the node N2. A first terminal of the transistor Tr216 is coupled to the node N2 and, for example, the voltage VSS is applied to a second terminal of the transistor Tr216. The gate of each of the transistors Tr213 and Tr216 is coupled to the node N1. The signal Sig2 is input to the gate of the transistor Tr214. The signal Sig1 is input to the gate of the transistor Tr215.

While the signal Sig1 is at the L level and the signal Sig2 is at the H level, the transistors Tr214 and Tr215 are OFF. Therefore, neither the voltage VDD applied to the first terminal of the transistor Tr213 nor the voltage VSS applied to the second terminal of the transistor Tr216 is supplied to the node N1.

While the signal Sig1 is at the H level and the signal Sig2 is at the L level, the transistors Tr214 and Tr215 are ON. During this period, the inverter circuit 12321*b* supplies a voltage to the node N1 as follows.

When the value of the voltage of the node N1 is smaller than the threshold Vth7, the transistor Tr213 is ON and the transistor Tr216 is OFF. Therefore, in accordance with the value of the voltage of the node N1 being smaller than the threshold Vth7, the voltage VDD applied to the first terminal of the transistor Tr213 is supplied to the node N1. In contrast, when the value of the voltage of the node N1 is larger than or equal to the threshold Vth7, the transistor Tr213 is OFF and the transistor Tr216 is ON. Therefore, in accordance with the value of the voltage of the node N1 being larger than or equal to the threshold Vth7, the voltage VSS applied to the second terminal of the transistor Tr216 is supplied to the node N1.

For example, the p-channel MOS transistor Tr11 and n-channel MOS transistor Tr14 shown in FIG. 21 function as the inverter INV2 shown in FIG. 20. The p-channel MOS transistor Tr12 and n-channel MOS transistor Tr13 shown in FIG. 21 function as the switch SW2 shown in FIG. 20. Similarly, for example, the p-channel MOS transistor Tr213 and n-channel MOS transistor Tr216 function as the inverter INV7, the p-channel MOS transistor Tr214 and n-channel MOS transistor Tr215 function as the switch SW5, the p-channel MOS transistor Tr221 and n-channel MOS transistor Tr224 function as the inverter INV4, and the p-channel MOS transistor Tr222 and n-channel MOS transistor Tr223 function as the switch SW3.

When the voltage of the node N1 is stabilized at the H level by the latch input circuit 1231 supplying the node N1 with the H-level voltage and the inverter circuit 12321*b* supplying the node N1 with the L-level voltage as described with reference to FIG. 20, the sum of the on-resistances of the transistors Tr215 and Tr216 is larger than the sum of the on-resistances of the transistors Tr11 and Tr12. For this purpose, for example the aforementioned sizes of the transistors Tr have the following relationship: The size of the transistor Tr215 is the smallest, and the sizes of the transistors Tr11, Tr12, and Tr216 are substantially the same. To achieve this, it is possible to, for example, make the gate lengths of the transistors Tr substantially the same, and make the gate widths of the transistors Tr have the following relationship: The gate width of the transistor Tr215 is the smallest, and the gate widths of the transistors Tr11, Tr12, and Tr216 are substantially the same.

When the voltage of the node N1 is stabilized at the L level by the latch input circuit 1231 supplying the node N1 with the L-level voltage and the inverter circuit 12321*b* supplying the node N1 with the H-level voltage as described with reference to FIG. 20, the sum of the on-resistances of the transistors Tr213 and Tr214 is larger than the sum of the on-resistances of the transistors Tr13 and Tr14. For this purpose, for example the aforementioned sizes of the transistors Tr have the following relationship: The size of the transistor Tr214 is the smallest, and the sizes of the transistors Tr13, Tr14, and Tr213 are substantially the same. To achieve this, it is possible to, for example, make the gate lengths of the transistors Tr substantially the same, and make the gate widths of the transistors Tr have the following relationship: The gate width of the transistor Tr214 is the smallest, and the gate widths of the transistors Tr13, Tr14, and Tr213 are substantially the same.

The inverter circuit 12321*b* described above in detail can implement a function equivalent to that of the voltage adjustment circuit 1233*a* of the second embodiment; however, the configuration of the inverter circuit 12321*b* of the partial latch circuit LC1*b* of the semiconductor memory device 1*b* according to the present embodiment is not limited thereto. The inverter circuit 12321*b* may be configured to be able to, for example, implement a function equivalent to that of the voltage adjustment circuit 1233 of the first embodiment. To achieve the configuration, when the circuit configuration shown in FIG. 21 is taken as an example, it is possible to, for example, omit the transistors Tr214 and Tr215 in the circuit configuration, and adjust the sizes of the transistors Tr213 and Tr216. Alternatively, voltages may be applied to the respective gates of the transistors Tr214 and Tr215 in such a manner as to make the transistors Tr214 and Tr215 always ON.

Operation Example

The semiconductor memory device 1*b* according to the third embodiment executes an operation similar to that executed in the example of FIG. 18 described in connection with the semiconductor memory device 1*a* according to the second embodiment. Specifically, the description of the example of FIG. 18 applies, except that the partial latch circuit LC1*a* is replaced with the partial latch circuit LC1*b*, the inverter circuit 12321 and the voltage adjustment circuit 1233*a* are replaced with the inverter circuit 12321*b*, the threshold Vth3 is replaced with the threshold Vth7, and the ON and OFF of the voltage adjustment circuit 1233*a* are replaced with the adjustable state and non-adjustable state of the inverter circuit 12321*b*.

Advantageous Effects

The partial latch circuit LClb of the semiconductor memory device 1*b* according to the third embodiment produces the following advantageous effects in addition to the advantageous effects described in the first and second embodiments.

The inverter circuit 12321*b* of the partial latch circuit LC1*b* implements the functions of the inverter circuit 12321 and voltage adjustment circuit 1233*a* of the partial latch circuit LC1*a* with a smaller number of transistors Tr than the number of those used in the circuits 12321 and 1233*a*. Accordingly, the partial latch circuit LC1*b* produces the following advantageous effects: The circuit area of the partial latch circuit LClb of the semiconductor memory device 1*b* according to the third embodiment may be smaller than the circuit area of the partial latch circuit LC1*a* of the semiconductor memory device 1*a* according to the second embodiment. In addition, the partial latch circuit LClb of the semiconductor memory device 1*b* according to the third embodiment may enable further reduction in power consumption in comparison with the partial latch circuit LC1*a* of the semiconductor memory device 1*a* according to the second embodiment.

Fourth Embodiment

Hereinafter, a semiconductor memory device 1*bh* according to a fourth embodiment will be described.

Configuration Example

A configuration of the semiconductor memory device 1*bh* according to the fourth embodiment will be described, focusing on differences from the configuration of the semiconductor memory device 1*b* according to the third embodiment.

The semiconductor memory device 1*bh* according to the fourth embodiment is different from the semiconductor memory device 1*b* according to the third embodiment in that it includes an input/output circuit 12*bh* instead of the input/output circuit 12*b*. When a constituent of the semiconductor memory device 1*bh* according to the fourth embodiment which includes the input/output circuit 12*bh* is referred to, the constituent will be accompanied by the same reference symbol as that used in the third embodiment with a suffix h added thereto.

FIG. 22 is a block diagram showing an example of a configuration of the input/output circuit 12*bh* of the semiconductor memory device 1*bh* according to the fourth embodiment. The reference symbols 12*bi*, 12*bj*, 12*bk*, 126*i*, 126*j*, and 126*k* shown in FIG. 22 will be described in the subsequent embodiments.

The input/output circuit 12*bh* includes a signal formation circuit 126*h* in addition to the constituents of the input/output circuit 12*b* of the semiconductor memory device 1*b* according to the third embodiment. The signal formation circuit 126*h* may be provided in the input circuit 122, or in another part of the semiconductor memory device 1*bh*, such as in the sequencer 15. The same applies to the other embodiments.

The input circuit 122 outputs, for example, the signal Sig1 and the signal Sig2 to the signal formation circuit 126*h*.

The signal formation circuit 126*h*, for example, receives the signals Sig1 and Sig2 from the input circuit 122, generates signals Sigαh and Sigβh based on the signals Sig1 and Sig2, and outputs the signals Sigαh and Sigβh to the latch circuit 123*b*<0>. The signal formation circuit 126*h* may output the signals Sigαh and Sigβh to one of the latch circuits 123*b*<7:1>. The signal Sigαh is a signal into which the signal Sig1 is formed so as to be at the L level in a part of the period in which the signal Sig1 is at the H level. The signal Sigβh is a complementary signal of the signal Sigαh. The same applies to signals Sigα and Sigβ in the other embodiments.

The latch circuit 123*b*<0> receives the signals Sigαh and Sigβh from the signal formation circuit 126*h*. The partial latch circuit LClb of the latch circuit 123*b*<0> sequentially latches data of the odd-numbered bits of the signal DQ<0> also based on the signals Sigαh and Sigβh, for example. The same applies to the other embodiments in which signals Sigα and Sigβ are described as being output to the latch circuit 123*b*<0>.

FIG. 23 shows an example of a circuit configuration of the signal formation circuit 126*h* of the semiconductor memory device 1*bh* according to the fourth embodiment. The circuit configuration of the signal formation circuit 126*h* to be described below is merely an example. Other circuit configurations that can generate the signals Sigαh and Sigβh in a similar manner are applicable to the signal formation circuit 126*h*. The same applies to similar drawings to be referred to below.

The signal formation circuit 126*h* includes, for example, a delay circuit DC1, an AND gate AND1, a delay circuit DC2, and an OR gate OR1.

The signals Sig1 and Sig2 are processed in the signal formation circuit 126*h* as follows. Operations such as an AND operation to be described below are performed under the condition that the H level is 1 and the L level is 0.

The delay circuit DC1 receives the signal Sig1, generates a signal SigD1 based on the signal Sig1, and outputs the signal SigD1. The signal SigD1 is a signal obtained by delaying the signal Sig1. For example, the phase of the signal SigD1 lags the phase of the signal Sig1 by $\pi/2$ radians. The signal SigD1 rises later than the signal Sig1, and is at the H level together with the signal Sig1 until the signal Sig1 drops, and drops later than the signal Sig1.

The AND gate AND receives the signal Sig1 on a first input terminal and receives the signal SigD1 on a second input terminal. The AND gate AND1 performs an AND operation on the two received signals and outputs a signal of a result of the operation. The output signal corresponds to the signal Sigαh shown in FIG. 22. The signal Sigh rises later than the signal Sig1, and is at the H level together with the signal Sig1 until the signal Sig1 drops, and drops at substantially the same time as the signal Sig1.

The delay circuit DC2 receives the signal Sig2, generates a signal SigD2 based on the signal Sig2, and outputs the signal SigD2. The signal SigD2 is a signal obtained by delaying the signal Sig2. The amount of delay provided by the delay circuit DC2 is substantially the same as that provided by the delay circuit DC1. The signal SigD2 drops later than the signal Sig2, and is at the L level together with the signal Sig2 until the signal Sig2 rises, and rises later than the signal Sig2.

The OR gate OR1 receives the signal Sig2 on a first input terminal and receives the signal SigD2 on a second input terminal. The OR gate OR1 performs an OR operation on the two received signals and outputs a signal of a result of the operation. The output signal corresponds to the signal Sigβh shown in FIG. 22. The signal Sigβh drops later than the signal Sig2, and is at the L level together with the signal Sig2 until the signal Sig2 rises, and rises at substantially the same time as the signal Sig2.

Described above is a circuit configuration of the signal formation circuit 126*h* which generates signals Sigαh and Sigβh used by the partial latch circuit LC1*b*. The case where the same circuit configuration is applied to a signal formation circuit that generates two similar signals usable by the partial latch circuit LC0*b* will be described. In this case, a circuit configuration by which the signal Sig2 is formed in a similar manner to the above-described manner for forming the signal Sig1, and the signal Sig1 is formed in a similar manner to the above-described manner for forming the signal Sig2 may be used as a circuit configuration of the signal formation circuit. The same applies to the signal formation circuits 126 which generate signals Sigα and Sigβ in the other embodiments as long as there is no particular description to the contrary.

Figure 24:
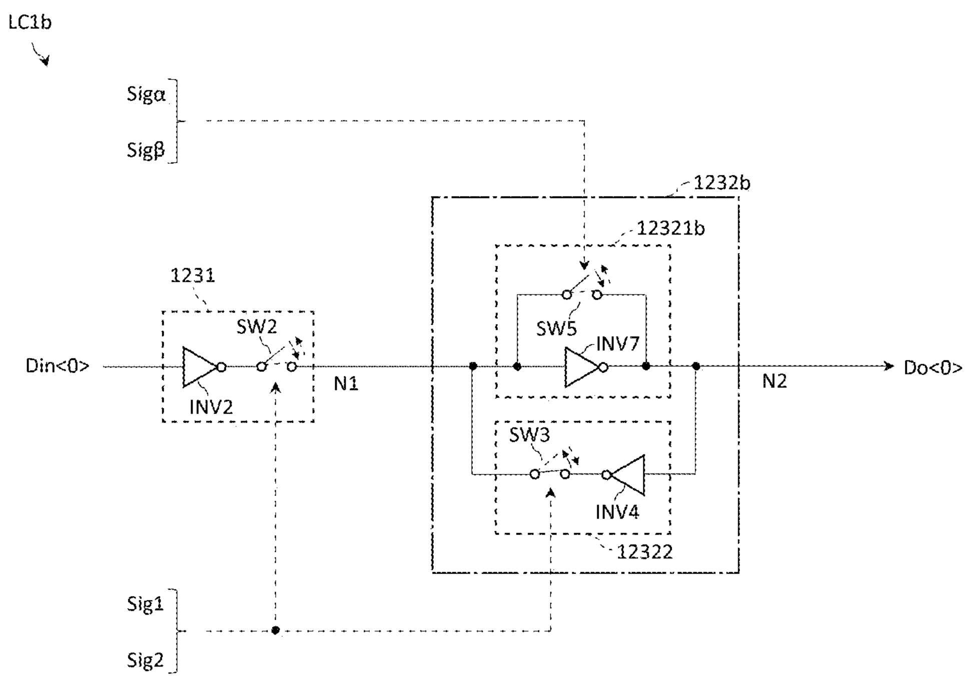
FIG. 24 shows an example of a configuration of a partial latch circuit of the semiconductor memory device according to the fourth embodiment.

FIG. 24 shows an example of a configuration of the partial latch circuit LC1*b* of the semiconductor memory device 1*bh* according to the fourth embodiment. The configuration of the partial latch circuit LClb is the same as that in the example of FIG. 20, except for the point to be described below.

The switch SW5 is OFF while the signal Sigαh is at the L level and the signal Sigβh is at the H level, and is ON while the signal Sigαh is at the H level and the signal Sigβh is at the L level.

Described above is a configuration of the partial latch circuit LC1*b*. Hereinafter, the case where the same configuration is applied to the partial latch circuit LC0*b* will be described. In this case, the above description of the configuration of the partial latch circuit LClb may be applied to the configuration of the partial latch circuit LC0*b*, except that, for example, the signal Sigαh is replaced with a signal into which the signal Sig2 is formed as described with reference to FIG. 23, and the signal Sigβh is replaced with a signal into which the signal Sig1 is formed as described with reference to FIG. 23. The same applies to the partial latch circuits LC1*b* which use signals Sigα and Sigβ in other embodiments.

Figure 25:
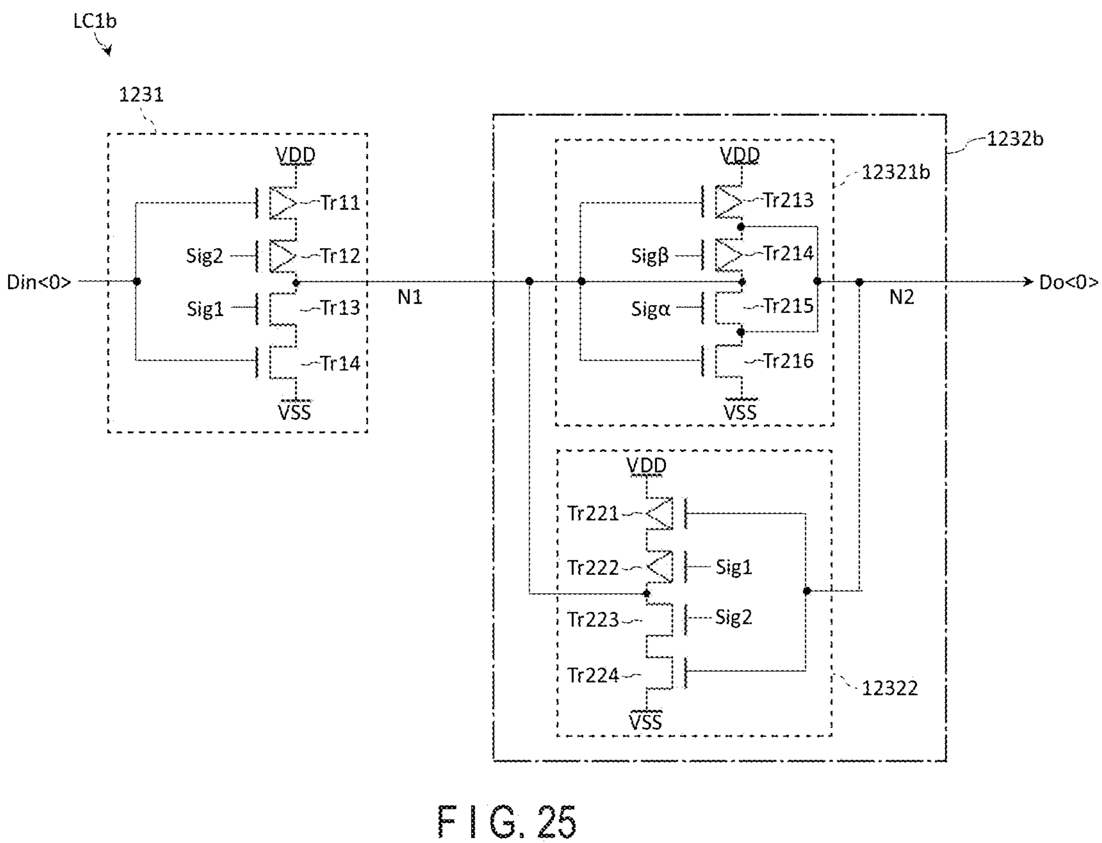
FIG. 25 shows an example of a circuit configuration of the partial latch circuit of the semiconductor memory device according to the fourth embodiment.

FIG. 25 shows an example of a circuit configuration of the partial latch circuit LClb of the semiconductor memory device 1*bh* according to the fourth embodiment. The circuit configuration of the partial latch circuit LC1*b* is the same as that in the example of FIG. 21, except for the points to be described below.

Instead of the signal Sig2, the signal Sigβh is input to the gate of the transistor Tr214. Instead of the signal Sig1, the signal Sigαh is input to the gate of the transistor Tr215.

While the signal Sigαh is at the L level and the signal Sigh is at the H level, the transistors Tr214 and Tr215 are OFF. Therefore, neither the voltage VDD applied to the first terminal of the transistor Tr213 nor the voltage VSS applied to the second terminal of the transistor Tr216 is supplied to the node N1.

While the signal Sigαh is at the H level and the signal Sigβh is at the L level, the transistors Tr214 and Tr215 are ON. During this period, the inverter circuit 12321*b* supplies a voltage to the node N1 as in the example of FIG. 21.

Described above is a circuit configuration of the partial latch circuit LC1*b*. Hereinafter, the case where the same circuit configuration is applied to the partial latch circuit LC0*b* will be described. In this case, the above description of the circuit configuration of the partial latch circuit LC1*b* may be applied to the configuration of the partial latch circuit LC0*b*, except that, for example, a signal into which the signal Sig2 is formed as described with reference to FIG. 23 is input to the gate to which the signal Sigαh is described as being input, and a signal into which the signal Sig1 is formed as described with reference to FIG. 23 is input to the gate to which the signal Sigβh is described as being input. The same applies to the partial latch circuits LC1*b* which use signals Sigα and Sigβ in other embodiments.

Described above is the case where the partial latch circuit LC1*b* which has a configuration equivalent to that described in the third embodiment is configured to operate based on the signals Sigαh and Sigβh generated by the signal formation circuit 126*h*; however, the present embodiment is not limited thereto. For example, a partial latch circuit having a configuration equivalent to that described in the second embodiment may be configured to operate based on the signals Sigαh and Sigβh generated by the signal formation circuit 126*h*. The same applies to the other embodiments in which the partial latch circuit LC1*b* which has a configuration equivalent to that described in the third embodiment is configured to operate based on signals Sigα and Sigβ.

Operation Example

FIG. 26 shows an example of a timing chart showing temporal changes of various signals when the partial latch circuit LC1*b* of the semiconductor memory device 1*bh* according to the fourth embodiment latches data of a bit sent via the signal DQ<0>.

Regarding the temporal changes of the signal Sig1, signal Sig2, and signal Din<0>, the description of FIG. 13 applies, except that the time T00 is replaced with a time T40, the time T01 is replaced with a time T41, the time T02 is replaced with a time T42, the time T03 is replaced with a time T43, the time T04 is replaced with a time T44, the time T01*d* is replaced with a time T41*d*, and the time T02*d* is replaced with a time T42*d*. The period of time from the time T41*d* to the time T42 is the same as the period of time ΔT from the time T01*d* to the time T02. Regarding whether each of the latch input circuit 1231 and the inverter circuit 12322 is ON or OFF, the description of FIG. 13 applies, except that the times are replaced as described above.

First, the signals Sigαh and Sigβh will be described.

At the time T40, the signal Sigαh is at the L level and the signal Sigβh is at the H level. These levels of the signals Sigαh and Sigβh are maintained until a time T41*s*. The time T41*s* is after the time T41 and before the time T41*d*. At the time T41*s*, the signal Sigαh rises from the L level to the H level, and the signal Sigβh drops from the H level to the L level. These levels of the signals Sigαh and Sigβh are maintained until the time T42. At the time T42, the signal Sigαh drops from the H level to the L level, and the signal Sigβh rises from the L level to the H level. These levels of the signals Sigαh and Sigβh are maintained until a time T43*s*. The time T43*s* is after the time T43 and before the time T44. At the time T43*s*, the signal Sigαh rises from the L level to the H level, and the signal Sigβh drops from the H level to the L level. These levels of the signals Sigαh and Sigβh are maintained until the time T44.

The inverter circuit 12321*b* is in the non-adjustable state while the signal Sigαh is at the L level and in the adjustable state while the signal Sigαh is at the H level. Therefore, the period in which the inverter circuit 12321*b* is in the adjustable state and the period in which the inverter circuit 12321*b* is in the non-adjustable state are as follows. The inverter circuit 12321*b* is in the adjustable state from the time T41*s* to the time T42 of the period from the time T41 to the time T42, in which the latch input circuit 1231 is ON. The inverter circuit 12321*b* is in the adjustable state from the time T43*s* to the time T44 of the period from the time T43 to the time T44, in which the latch input circuit 1231 is ON. The inverter circuit 12321*b* is in the non-adjustable state at other times.

Next, the voltage of the node N1 will be described.

From the time T40 to the time T41*d*, the voltage of the node N1 is at the H level as in the period from the time T00 to the time T01*d* in the example of FIG. 13. However, from the time T40 to the time T41*s*, since the inverter circuit 12321*b* is in the non-adjustable state, the H-level voltage is not a lowered voltage, as in the case of the comparative example in FIG. 15. The inverter circuit 12321*b* is in the adjustable state from the time T41*s* to the time T41*d*. From the time T41*s*, at which the inverter circuit 12321*b* enters the adjustable state, control by the inverter circuit 12321*b* works. As a result, the voltage of the node N1 is, for example, stabilized at the H level lowered by the voltage difference ΔVH as in the example of FIG. 13 and is stable at the H level until the time T41*d*.

From the time T41*d* to the time T42, the voltage of the node N1 drops from the H level as in the period from the time T01*d* to the time T02 in the example of FIG. 13. During this period, the inverter circuit 12321*b* is still in the adjustable state.

At the time T42, the value of the voltage of the node N1 is smaller than the threshold Vth7, like the time T02 in the example of FIG. 13. As in the example of FIG. 13, the value of the voltage of the node N2 becomes larger than or equal to the threshold Vth4 immediately after the value of the voltage of the node N1 becomes smaller than the threshold Vth7. Therefore, from the time T42 to the time T43, the inverter circuit 12321*b* supplies the node N2 with the H-level voltage and the node N1 is supplied with the L-level voltage as in the period from the time T02 to the time T03 in the example of FIG. 13. Consequently, as in the example of FIG. 13, the voltage of the node N1 reaches and is stabilized at the L level, and the voltage of the node N2 is stabilized at the H level. However, since the inverter circuit 12321*b* is in the non-adjustable state during this period, the L-level voltage of the node N1 is not a raised voltage, as in the case of the comparative example in FIG. 15.

In this manner, the H level of the signal Din<0> immediately before the time T42, at which the signal Sig1 drops, is reflected in the voltage of each of the node N1 and the node N2, as in the example of FIG. 13. Accordingly, data of a bit of the odd-numbered bits being sent via the signal DQ<0> when the signal DOS drops is latched by the partial latch circuit LC1*b* as described with reference to FIG. 12.

From the time T43 to the time T44, the H-level voltage is supplied to the node N1 as in the period from the time T03 to the time T04 in the example of FIG. 13. Accordingly, the voltage of the node N1 rises from the L level, and reaches and is stabilized at the H level. The inverter circuit 12321*b* is in the non-adjustable state from the time T43 to the time T43*s*. Therefore, when the voltage of the node N1 reaches the H level during this period, the H-level voltage is not a lowered voltage, as in the case of the comparative example in FIG. 15. The inverter circuit 12321*b* is in the adjustable state from the time T43*s* to the time T44. From the time T43*s*, at which the inverter circuit 12321*b* enters the adjustable state, control by the inverter circuit 12321*b* works. As a result, the voltage of the node N1 is stabilized at the H level lowered by the voltage difference ΔVH as in the example of FIG. 13, and is stable at the H level until the time T44.

Advantageous Effects

The partial latch circuit LClb of the semiconductor memory device 1*bh* according to the fourth embodiment produces the following advantageous effects in addition to the advantageous effects described in the first to third embodiments.

The inverter circuit 12321*b* of the partial latch circuit LC1*b* of the semiconductor memory device 1*bh* according to the fourth embodiment is in the non-adjustable state while the signal Sigh is at the L level, and is in the adjustable state while the signal Sigαh is at the H level. The signal Sigαh rises later than the signal Sig1, and is at the H level together with the signal Sig1 until the signal Sig1 drops, and drops at substantially the same time as the signal Sig1.

Therefore, the inverter circuit 12321*b* of the partial latch circuit LC1*b* of the semiconductor memory device 1*bh* according to the fourth embodiment enters the adjustable state later than the signal Sig1 rises, and enters the non-adjustable state at substantially the same time as when the signal Sig1 drops. Even though the inverter circuit 12321*b* enters the adjustable state later than the latch input circuit 1231 is turned on as described above, the partial latch circuit LClb can correctly latch data of each bit of the odd-numbered bits of the signal Din<0> as described in the first embodiment. This is because, for example when the period of time from a change in the level of the signal Din<0> to the drop of the signal Sig1 is such a short time as the period of time ΔT, the inverter circuit 12321*b* has already been in the adjustable state when the level of the signal Din<0> changes, and thus the H-level voltage of the node N1 is a lowered voltage or the L-level voltage of the node N1 is a raised voltage, as in the example of FIG. 26.

As described above, the period in which the inverter circuit 12321*b* of the partial latch circuit LClb of the semiconductor memory device 1*bh* according to the fourth embodiment is in the adjustable state is shorter than the period of the adjustable state in the case of the third embodiment. While the inverter circuit 12321*b* is in the adjustable state, power as described in the second embodiment may be consumed by the partial latch circuit LC1*b*. Therefore, the partial latch circuit LClb of the semiconductor memory device 1*bh* according to the fourth embodiment may enable further reduction in power consumption in comparison with the case of the third embodiment.

Fifth Embodiment

Hereinafter, a semiconductor memory device 1*bi* according to a fifth embodiment will be described.

Configuration Example

A configuration of the semiconductor memory device 1*bi* according to the fifth embodiment will be described, focusing on differences from the configuration of the semiconductor memory device 1*b* according to the third embodiment.

The semiconductor memory device 1*bi* according to the fifth embodiment is different from the semiconductor memory device 1*b* according to the third embodiment in that it includes an input/output circuit 12*bi* instead of the input/output circuit 12*b*. When a constituent of the semiconductor memory device 1*bi* according to the fifth embodiment which includes the input/output circuit 12*bi* is referred to, the constituent will be accompanied by the same reference symbol as that used in the third embodiment with a suffix i added thereto.

As already shown in FIG. 22, the input/output circuit 12*bi* includes a signal formation circuit 126*i* in addition to the constituents of the input/output circuit 12*b* of the semiconductor memory device 1*b* according to the third embodiment. Only the points different from those already described will be described with reference to FIG. 22.

The input circuit 122, for example, outputs the signal Sig1 to the signal formation circuit 126*i*.

The signal formation circuit 126*i*, for example, receives the signal Sig1 from the input circuit 122, generates signals Sigαi and Sigβi based on the signal Sig1, and outputs the signals Sigαi and Sigβi to the latch circuit 123*b*<0>.

Regarding the configuration of the partial latch circuit LC1*b* of the semiconductor memory device 1*bi* according to the fifth embodiment, the description of FIGS. 24 and 25 applies, except that the signal Sigαh is replaced with the signal Sigαi, and the signal Sigβh is replaced with the signal Sigβi.

Figure 27:
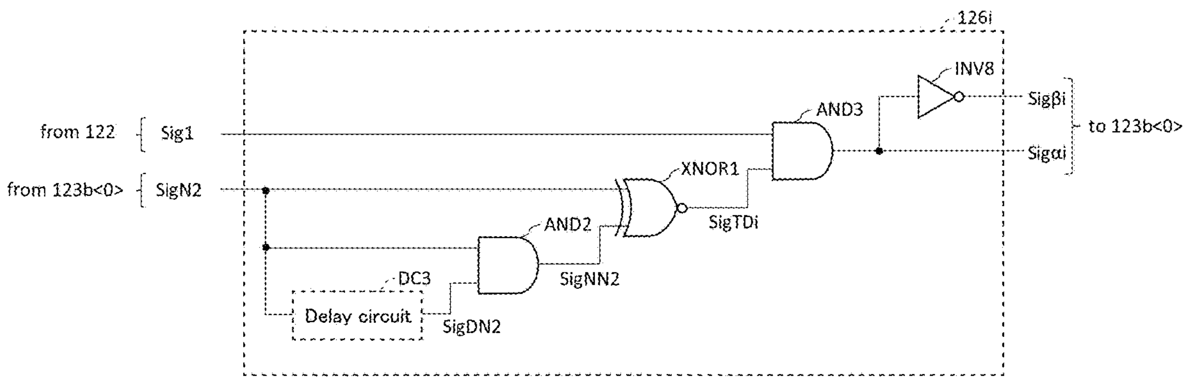
FIG. 27 shows an example of a circuit configuration of a signal formation circuit of a semiconductor memory device according to a fifth embodiment.

FIG. 27 shows an example of a circuit configuration of the signal formation circuit 126*i* of the semiconductor memory device 1*bi* according to the fifth embodiment.

The signal formation circuit 126*i* includes, for example, a delay circuit DC3, an AND gate AND2, an exclusive NOR gate XNOR1, an AND gate AND3, and an inverter INV8.

The signal formation circuit 126*i* further receives the signal SigN2 from the latch circuit 123*b*<0> and generates signals Sigαi and Sigβi also based on the signal SigN2. The signal SigN2 is a signal transferred on the node N2 and indicating the voltage of the node N2. The signals Sig1 and SigN2 are processed in the signal formation circuit 126*i* as follows.

The delay circuit DC3 receives the signal SigN2, generates a signal SigDN2 based on the signal SigN2, and outputs the signal SigDN2. The signal SigDN2 is a signal obtained by delaying the signal SigN2. The signal SigDN2, for example, rises later than the signal SigN2, and is at the H level together with the signal SigN2 until the signal SigN2 drops, and drops later than the signal SigN2.

The AND gate AND2 receives the signal SigN2 on a first input terminal and receives the signal SigDN2 on a second input terminal. The AND gate AND2 performs an AND operation on the two received signals and outputs a signal SigNN2 of a result of the operation. The signal SigNN2, for example, rises later than the signal SigN2, and is at the H level together with the signal SigN2 until the signal SigN2 drops, and drops at substantially the same time as the signal SigN2.

The exclusive NOR gate XNOR1 receives the signal SigN2 on a first input terminal and receives the signal SigNN2 on a second input terminal. The exclusive NOR gate XNOR1 performs an exclusive NOR operation on the two received signals and outputs a signal SigTDi of a result of the operation. The signal SigTDi is, for example, at the L level from the rise of the signal SigN2 up to the later rise of the signal SigNN2, but at the H level at the other times.

The AND gate AND3 receives the signal Sig1 on a first input terminal and receives the signal SigTDi on a second input terminal. The AND gate AND3 performs an AND operation on the two received signals and outputs a signal of a result of the operation. The output signal corresponds to the signal Sigαi shown in FIG. 22. The signal Sigαi is at the same level as the signal Sig1 while the signal SigTDi is at the H level, but is at the L level while the signal SigTDi is at the L level.

The inverter INV8 receives the signal Sigαi on the input terminal and outputs a signal at the level obtained by inverting the level of the voltage of the signal Sigαi. The output signal corresponds to the signal Sigβi shown in FIG. 22.

Operation Example

Figure 28:
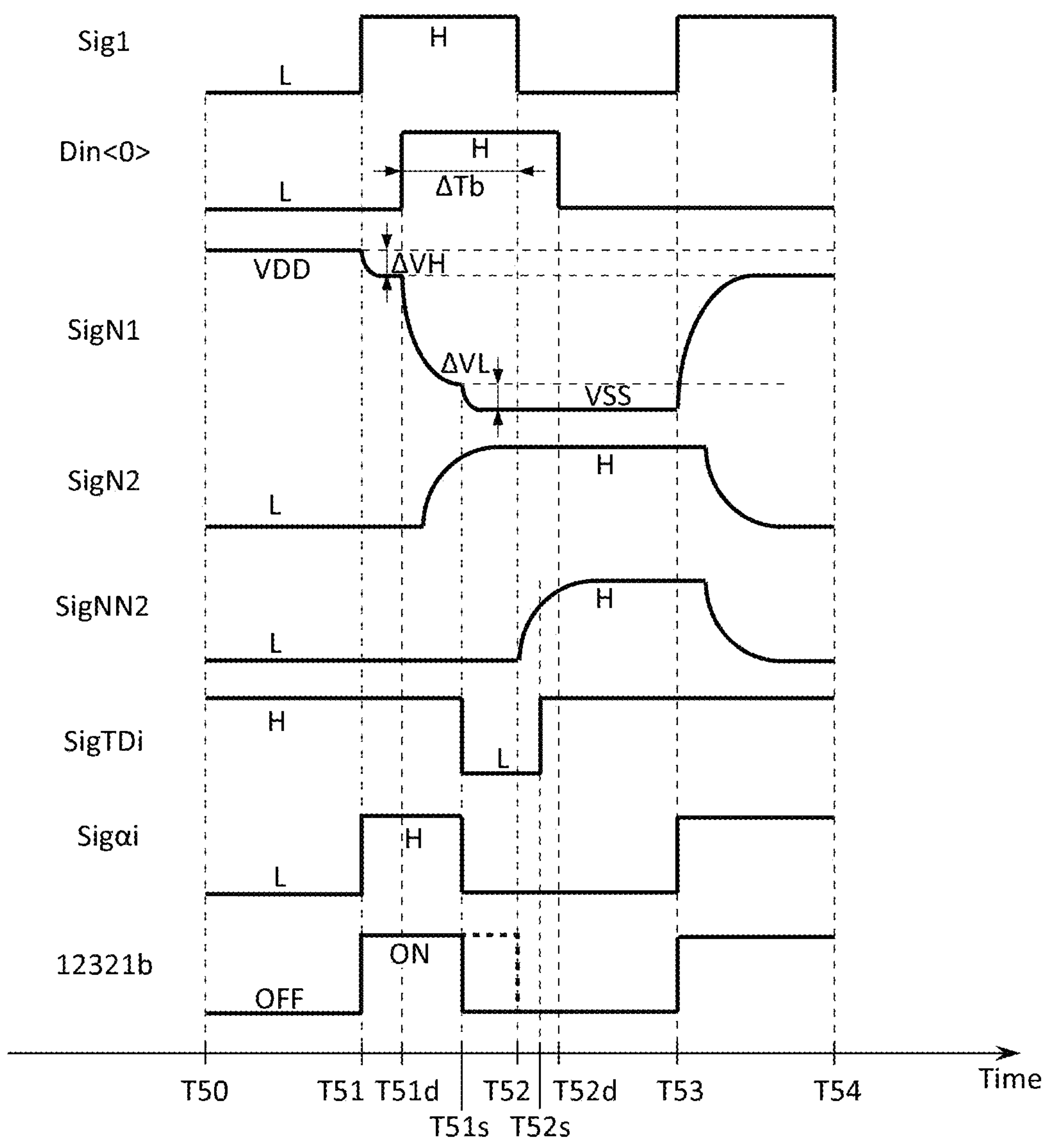
FIG. 28 shows an example of a timing chart showing temporal changes of various signals when a partial latch circuit of the semiconductor memory device according to the fifth embodiment latches data of a bit sent via a signal.

FIG. 28 shows an example of a timing chart showing temporal changes of various signals when the partial latch circuit LC1*b* of the semiconductor memory device 1*bi* according to the fifth embodiment latches data of a bit sent via the signal DQ<0>. In the timing chart, temporal changes of the signal Sig2 and signal Sigβi are omitted. This is because the signal Sig2 and signal Sigβi are merely complementary signals of the signal Sig1 and signal Sigαi, whose temporal changes are shown.

Regarding the temporal changes of the signal Sig1 and signal Din<0>, the description of FIG. 13 applies, except that the time T00 is replaced with a time T50, the time T01 is replaced with a time T51, the time T02 is replaced with a time T52, the time T03 is replaced with a time T53, the time T04 is replaced with a time T54, the time T01*d* is replaced with a time T51*d*, and the time T02*d* is replaced with a time T52*d*. The period of time ΔTb from the time T51*d* to the time T52 is longer than the period of time ΔT from the time T01*d* to the time T02. Regarding whether each of the latch input circuit 1231 and the inverter circuit 12322 is ON or OFF, the description of FIG. 13 applies, except that the times are replaced as described above. Regarding the temporal change of the signal SigN2, FIG. 28 merely shows whether the voltage of the node N2 is at the L level or the H level, or whether the voltage is changing from one level to the other level. The same applies to similar drawings to be referred to below.

The inverter circuit 12321*b* is in the non-adjustable state while the signal Sigαi is at the L level, and is in the adjustable state while the signal Sigαi is at the H level.

From the time T50 to the time T51*d*, the voltage of the node N1 is at the H level as in the period from the time T00 to the time T01*d* in the example of FIG. 13. During this period, in accordance with the value of the voltage of the node N1 being larger than or equal to the threshold Vth7, the inverter circuit 12321*b* supplies the node N2 with the L-level voltage. Accordingly, the voltage of the node N2 is stable at the L level. The H-level voltage of the node N1 during this period will be described.

Since the voltage of the node N2 is stable at the L level, the signal SigTDi is at the H level. Therefore, like the signal Sig1, the signal Sigαi is at the L level from the time T50 to the time T51, rises from the L level to the H level at the time T51, and is at the H level from the time T51 to the time T51*d*. The inverter circuit 12321*b* is in the non-adjustable state in the period from the time T50 to the time T51, in which the signal Sigαi is at the L level, and is in the adjustable state in the period from the time T51 to the time T51*d*, in which the signal Sigαi is at the H level.

Since the inverter circuit 12321*b* is in the non-adjustable state from the time T50 to the time T51, the H-level voltage of the node N1 is not a lowered voltage, as in the case of the comparative example in FIG. 15. From the time T51, at which the inverter circuit 12321*b* enters the adjustable state, control by the inverter circuit 12321*b* works. As a result, the voltage of the node N1 is, for example, stabilized at the H level lowered by the voltage difference ΔVH as in the example of FIG. 13 and is stable at the H level until the time T51*d*.

From the time T51*d* to the time T52, the L-level voltage, such as the voltage VSS, is supplied to the node N1 as in the period from the time T01*d* to the time T02 in the example of FIG. 13. Accordingly, the voltage of the node N1 drops from the H level. After the value of the voltage of the node N1 becomes smaller than the threshold Vth7 during this period, in accordance with the value of the voltage of the node N1 being smaller than the threshold Vth7, the inverter circuit 12321*b* supplies the node N2 with the H-level voltage. Accordingly, the voltage of the node N2 rises from the L level. Consequently, for example, the voltage of the node N1 reaches the L level, and the voltage of the node N2 reaches the H level. These levels of the voltages of the node N1 and the node N2 are maintained until the time T52. The L-level voltage of the node N1 during this period will be described.

In response to the voltage of the node N2 rising from the L level to the H level, the signal SigTDi drops from the H level to the L level at a time T51*s*. The time T51*s* is after the time T51*d* and before the time T52. After the rise of the voltage of the node N2, the signal SigNN2 rises from the L level to the H level. In response to the rise of the signal SigNN2, the signal SigTDi rises from the L level to the H level at a time T52*s*. The period of time from the time T51*s* and the time T52*s* is determined based on the amount of delay of the delay circuit DC3. The time T52*s* is, for example, after the time T52 and before the time T52*d*. Therefore, the signal Sigαi is at the same H level as the signal Sig1 from the time T51*d* to the time T51*s*, drops from the H level to the L level at the time T51*s*, and is at the L level from the time T51*s* to the time T52. The inverter circuit 12321*b* is in the adjustable state in the period from the time T51*d* to the time T51*s*, in which the signal Sigαi is at the H level, and is in the non-adjustable state in the period from the time T51*s* to the time T52, in which the signal Sigαi is at the L level.

Since the inverter circuit 12321*b* is in the adjustable state from the time T51*d* to the time T51*s*, the voltage of the node N1 is, for example, stabilized by the time T51*s* at the L level raised by the voltage difference ΔVL. From the time T51*s*, at which the inverter circuit 12321*b* enters the non-adjustable state, control by the inverter circuit 12321*b* does not work. As a result, the voltage of the node N1 is lowered by the voltage difference ΔVL, by which the voltage was raised, and is stabilized at the lowered L level, and then is stable at the L level until the time T52.

From the time T52 to the time T53, the inverter circuit 12321*b* supplies the H-level voltage to the node N2 and the node N1 is supplied with the L-level voltage as in the period from the time T02 to the time T03 in the example of FIG. 13. Accordingly, the voltage of the node N1 is stable at the L level, and the voltage of the node N2 is stable at the H level. During this period, the signal Sig1 is at the L level; therefore, the signal Sigαi is also at the L level. Consequently, the inverter circuit 12321*b* is in the non-adjustable state. Since the inverter circuit 12321*b* is in the non-adjustable state, the L-level voltage of the node N1 is not a raised voltage, as in the case of the comparative example in FIG. 15.

In this manner, the H level of the signal Din<0> immediately before the time T52, at which the signal Sig1 drops, is reflected in the voltage of each of the node N1 and the node N2, as in the example of FIG. 13. Accordingly, data of a bit of the odd-numbered bits being sent via the signal DQ<0> when the signal DOS drops is latched by the partial latch circuit LC1*b* as described with reference to FIG. 12.

From the time T53 to the time T54, the H-level voltage is supplied to the node N1 as in the period from the time T03 to the time T04 in the example of FIG. 13. Accordingly, the voltage of the node N1 rises from the L level, and reaches and is stabilized at the H level. After the value of the voltage of the node N1 becomes larger than or equal to the threshold Vth7 during this period, in accordance with the value of the voltage of the node N1 being larger than or equal to the threshold Vth7, the inverter circuit 12321*b* supplies the node N2 with the L-level voltage. Accordingly, the voltage of the node N2 drops from the H level, and reaches and is stabilized at the L level.

Even when the voltage of the node N2 changes from the H level to the L level, the signal SigTDi remains at the H level. Therefore, from the time T53 to the time T54, the signal Sigαi is at the same H level as the signal Sig1. Therefore, the inverter circuit 12321*b* is in the adjustable state. Since the inverter circuit 12321*b* is in the adjustable state, the H-level voltage of the node N1 is a voltage lowered by the voltage difference ΔVH, as in the example of FIG. 13.

Advantageous Effects

The partial latch circuit LClb of the semiconductor memory device 1*bi* according to the fifth embodiment produces the following advantageous effects in addition to the advantageous effects described in the first to third embodiments.

The inverter circuit 12321*b* of the partial latch circuit LC1*b* of the semiconductor memory device 1*bi* according to the fifth embodiment is in the non-adjustable state while the signal Sigαi is at the L level and in the adjustable state while the signal Sigαi is at the H level. The signal Sigαi is at the same level as the signal Sig1 while the signal SigTDi is at the H level, but is at the L level while the signal SigTDi is at the L level. The signal SigTDi, for example, is brought to the L level when a rise of the signal SigN2 is detected, and is at the H level at the other times.

The case where the partial latch circuit LClb of the semiconductor memory device 1*bi* according to the fifth embodiment, for example, lowers the voltage of the node N1 from the H level in response to the rise of the signal Din<0> from the L level to the H level while the signal Sig1 is at the H level, as in the example of FIG. 28, will be described.

The voltage of the node N2 is stable at, for example, the L level until the time of the rise of the signal Din<0>. Therefore, the signal SigTDi is at the H level; therefore, the signal Sigαi is at the same level as the signal Sig1. Consequently, the inverter circuit 12321*b* is in the adjustable state from the time when the signal Sig1 is brought to the H level to the rise of the signal Din<0>. Therefore, at the time of the rise of the signal Din<0>, the H-level voltage of the node N1 is a lowered voltage. This also applies when the time from the rise of the signal Din<0> to the drop of the signal Sig1 is such a short time as the period of time ΔT shown in FIG. 13. Accordingly, the partial latch circuit LClb of the semiconductor memory device 1*bi* according to the fifth embodiment can also correctly latch data of a bit being sent via the signal Din<0> at the time of the drop of the signal Sig1 as described in the first embodiment.

In response to the rise of the signal Din<0>, the latch input circuit 1231 supplies the node N1 with the L-level voltage. In accordance with the value of the voltage of the node N1 thereby becoming smaller than the threshold Vth7, the inverter circuit 12321*b* supplies the node N2 with the H-level voltage. Accordingly, the voltage of the node N2 rises from the L level and reaches the H level. In response to the rise of the voltage of the node N2, the signal SigTDi drops from the H level to the L level. When the drop of the signal SigTDi takes place while the signal Sig1 is at the H level, the signal Sigαi is brought to the L level in response to the drop. Consequently, the inverter circuit 12321*b* enters the non-adjustable state even while the signal Sig1 is at the H level. Since the signal Din<0> has already risen while the signal Sig1 is at the H level, the level of the signal Din<0> does not further change until the signal Sig1 drops from the H level to the L level.

As described above, the period in which the inverter circuit 12321*b* of the partial latch circuit LClb of the semiconductor memory device 1*bi* according to the fifth embodiment is in the adjustable state may be shorter than the period of the adjustable state in the case of the third embodiment, as in the case of the fourth embodiment. Therefore, the partial latch circuit LClb of the semiconductor memory device 1*bi* according to the fifth embodiment may also enable further reduction in power consumption in comparison with the case of the third embodiment.

Sixth Embodiment

Hereinafter, a semiconductor memory device 1*bj* according to a sixth embodiment will be described.

Configuration Example

A configuration of the semiconductor memory device 1*bj* according to the sixth embodiment will be described, focusing on differences from the configuration of the semiconductor memory device 1*b* according to the third embodiment.

The semiconductor memory device 1*bj* of the sixth embodiment is different from the semiconductor memory device 1*b* of the third embodiment in that it includes an input/output circuit 12*bj* instead of the input/output circuit 12*b*. When a constituent of the semiconductor memory device 1*bj* according to the sixth embodiment which includes the input/output circuit 12*bj* is referred to, the constituent will be accompanied by the same reference symbol as that used in the third embodiment with a suffix j added thereto.

As already shown in FIG. 22, the input/output circuit 12*bj* includes a signal formation circuit 126*j* in addition to the constituents of the input/output circuit 12*b* of the semiconductor memory device 1*b* according to the third embodiment. Only the points different from those already described will be described with reference to FIG. 22.

The input circuit 122, for example, outputs the signal Sig1 to the signal formation circuit 126*j*.

The signal formation circuit 126*j*, for example, receives the signal Sig1 from the input circuit 122, generates signals Sigαj and Sigβj based on the signal Sig1, and outputs the signals Sigαj and Sigβj to the latch circuit 123*b*<0>.

FIG. 29 shows an example of a configuration of the partial latch circuit LClb of the semiconductor memory device 1*bj* according to the sixth embodiment.

The partial latch circuit LClb includes a flip-flop circuit 1234 in addition to a latch input circuit 1231 and positive feedback circuit 1232*b* as shown in FIG. 24. Regarding the configuration apart from the flip-flop circuit 1234, the description of FIG. 24 applies, except that the signal Sigαh is replaced with the signal Sigαj, and the signal Sigβh is replaced with the signal Sigβj.

The configuration of the flip-flop circuit 1234 is equivalent to the configuration of the latch input circuit 1231 and positive feedback circuit 1232 shown in FIG. 10. In other words, the flip-flop circuit 1234 is configured by omitting the voltage adjustment circuit 1233 from the configuration of the partial latch circuit LC1 shown in FIG. 10. For example, of the flip-flop circuits F/F included in the shift register SR1 shown in FIG. 8, the first-stage flip-flop circuit F/F may function as the flip-flop circuit 1234 in FIG. 29.

In FIG. 29, of the configuration of the flip-flop circuit 1234, a part equivalent to the latch input circuit 1231 is shown by an inverter INV9 and a switch SW6, a part equivalent to the inverter circuit 12321 is shown by an inverter INV10, and a part equivalent to the inverter circuit 12322 is shown by an inverter INV11 and a switch SW7.

Regarding the configuration of the flip-flop circuit 1234, the description of the configuration of the latch input circuit 1231 and positive feedback circuit 1232 applies, except that the inverter INV2 is replaced with the inverter INV9, the switch SW2 is replaced with the switch SW6, the inverter INV3 is replaced with the inverter INV10, the inverter INV4 is replaced with the inverter INV11, the switch SW3 is replaced with the switch SW7, the node N1 is replaced with a node N3, the node N2 is replaced with a node N4, the input terminal of the inverter INV9 is coupled to the node N2, the signal Sig1 and the signal Sig2 are reversed, and the threshold Vth is replaced with an appropriate threshold. The signal DQ<0> is based on the voltage of the node N4.

Figure 30:
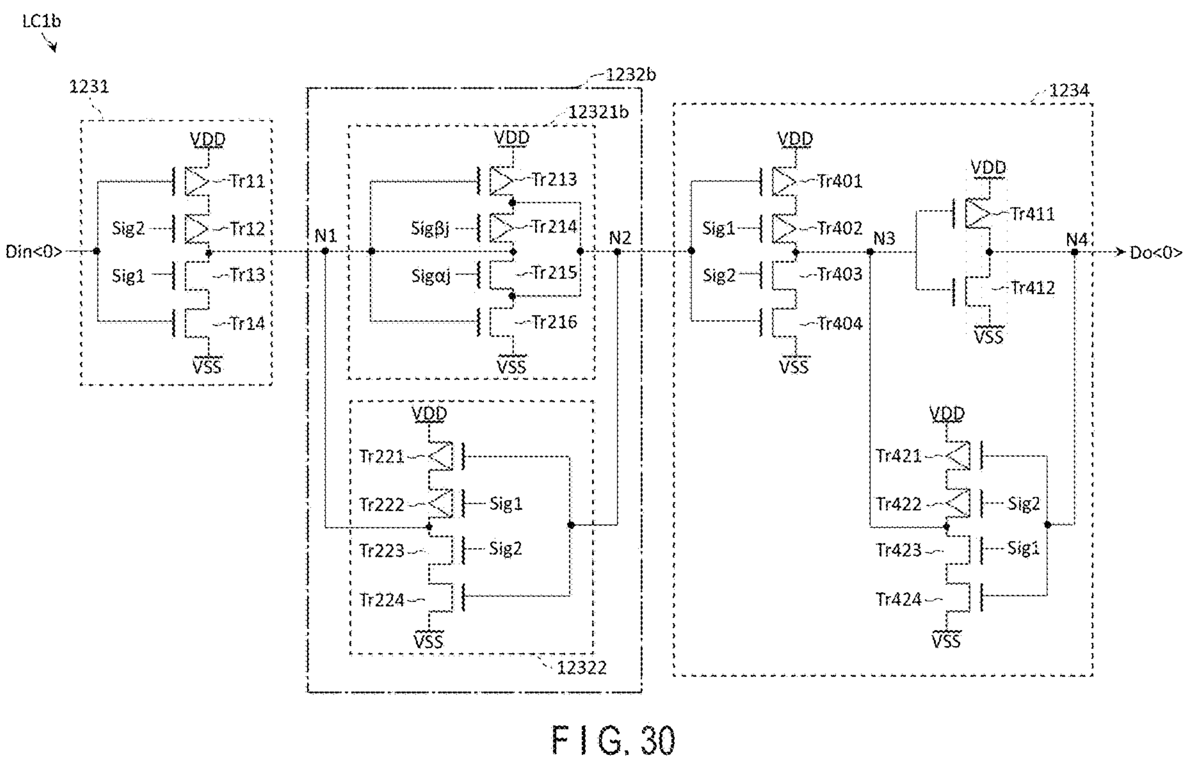
FIG. 30 shows an example of a circuit configuration of the partial latch circuit of the semiconductor memory device according to the sixth embodiment.

FIG. 30 shows an example of a circuit configuration of the partial latch circuit LClb of the semiconductor memory device 1*bj* according to the sixth embodiment. In FIG. 30, a configuration that implements a function equivalent to the function implemented by each inverter INV and switch SW described as a part of the flip-flop circuit 1234 with reference to FIG. 29 is more concretely shown in addition to the same circuit configuration as that shown in FIG. 25.

Regarding the circuit configuration apart from the flip-flop circuit 1234, the description of FIG. 25 applies, except that the signal Sigαh is replaced with the signal Sigαj, and the signal Sigβh is replaced with the signal Sigβj.

The circuit configuration of the flip-flop circuit 1234 shown in FIG. 30 is equivalent to the circuit configuration of the latch input circuit 1231 and positive feedback circuit 1232 described with reference to FIG. 11.

The flip-flop circuit 1234 includes, for example, p-channel MOS transistors Tr401, Tr402, Tr411, Tr421, and Tr422 and n-channel MOS transistors Tr403, Tr404, Tr412, Tr423, and Tr424.

A coupling relationship between the transistors Tr401, Tr402, Tr403, and Tr404 will be described. Regarding the coupling relationship, the description of the circuit configuration of the latch input circuit 1231 applies, except that the transistor Tr11 is replaced with the transistor Tr401, the transistor Tr12 is replaced with the transistor Tr402, the transistor Tr13 is replaced with the transistor Tr403, the transistor Tr14 is replaced with the transistor Tr404, the node N1 is replaced with the node N3, the signal Sig1 and the signal Sig2 are reversed, and the gate of each of the transistors Tr401 and Tr404 is coupled to the node N2.

A coupling relationship between the transistors Tr411 and Tr412 will be described. Regarding the coupling relationship, the description of the circuit configuration of the latch input circuit 12321 applies, except that the transistor Tr211 is replaced with the transistor Tr411, the transistor Tr212 is replaced with the transistor Tr412, the node N1 is replaced with the node N3, and the node N2 is replaced with the node N4.

A coupling relationship between the transistors Tr421, Tr422, Tr423, and Tr424 will be described. Regarding the coupling relationship, the description of the circuit configuration of the inverter circuit 12322 applies, except that the transistor Tr221 is replaced with the transistor Tr421, the transistor Tr222 is replaced with the transistor Tr422, the transistor Tr223 is replaced with the transistor Tr423, the transistor Tr224 is replaced with the transistor Tr424, the node N2 is replaced with the node N4, the node N1 is replaced with the node N3, and the signal Sig1 and the signal Sig2 are reversed.

Figure 31:
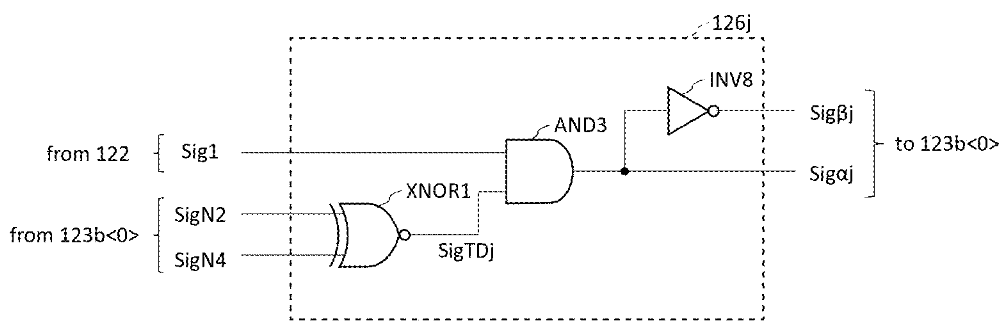
FIG. 31 shows an example of a circuit configuration of a signal formation circuit of the semiconductor memory device according to the sixth embodiment.

FIG. 31 shows an example of a circuit configuration of the signal formation circuit 126*j* of the semiconductor memory device 1*bj* according to the sixth embodiment.

The signal formation circuit 126*j* includes, for example, an exclusive NOR gate XNOR1, an AND gate AND3, and an inverter INV8, like the signal formation circuit 126*i* described with reference to FIG. 27.

The signal formation circuit 126*j* further receives signals SigN2 and SigN4 from the latch circuit 123*b*<0> and generates signals Sigαj and Sigβj also based on the signals SigN2 and SigN4. The signal SigN4 is a signal transferred on the node N4 and indicating the voltage of the node N4. The signals Sig1, SigN2, and SigN4 are processed in the signal formation circuit 126*j* as follows.

The exclusive NOR gate XNOR1 receives the signal SigN2 on a first input terminal and receives the signal SigN4 on a second input terminal. The exclusive NOR gate XNOR1 performs an exclusive NOR operation on the two received signals and outputs a signal SigTDj of a result of the operation. The signal SigTDj is, for example, at the L level from the rise of the signal SigN2 up to the later rise of the signal SigN4 and the drop of the signal SigN2 up to the later drop of the signal SigN4, but is at the H level at the other times.

The AND gate AND3 receives the signal Sig1 on a first input terminal and receives the signal SigTDj on a second input terminal. The AND gate AND3 performs an AND operation on the two received signals and outputs a signal of a result of the operation. The output signal corresponds to the signal Sigαj shown in FIG. 22. The signal Sigαj is at the same level as the signal Sig1 while the signal SigTDj is at the H level, but is at the L level while the signal SigTDj is at the L level.

The inverter INV8 receives the signal Sigαj on the input terminal and outputs a signal at the level obtained by inverting the level of the voltage of the signal Sigαj. The output signal corresponds to the signal Sigβj shown in FIG. 22.

Operation Example

Figure 32:
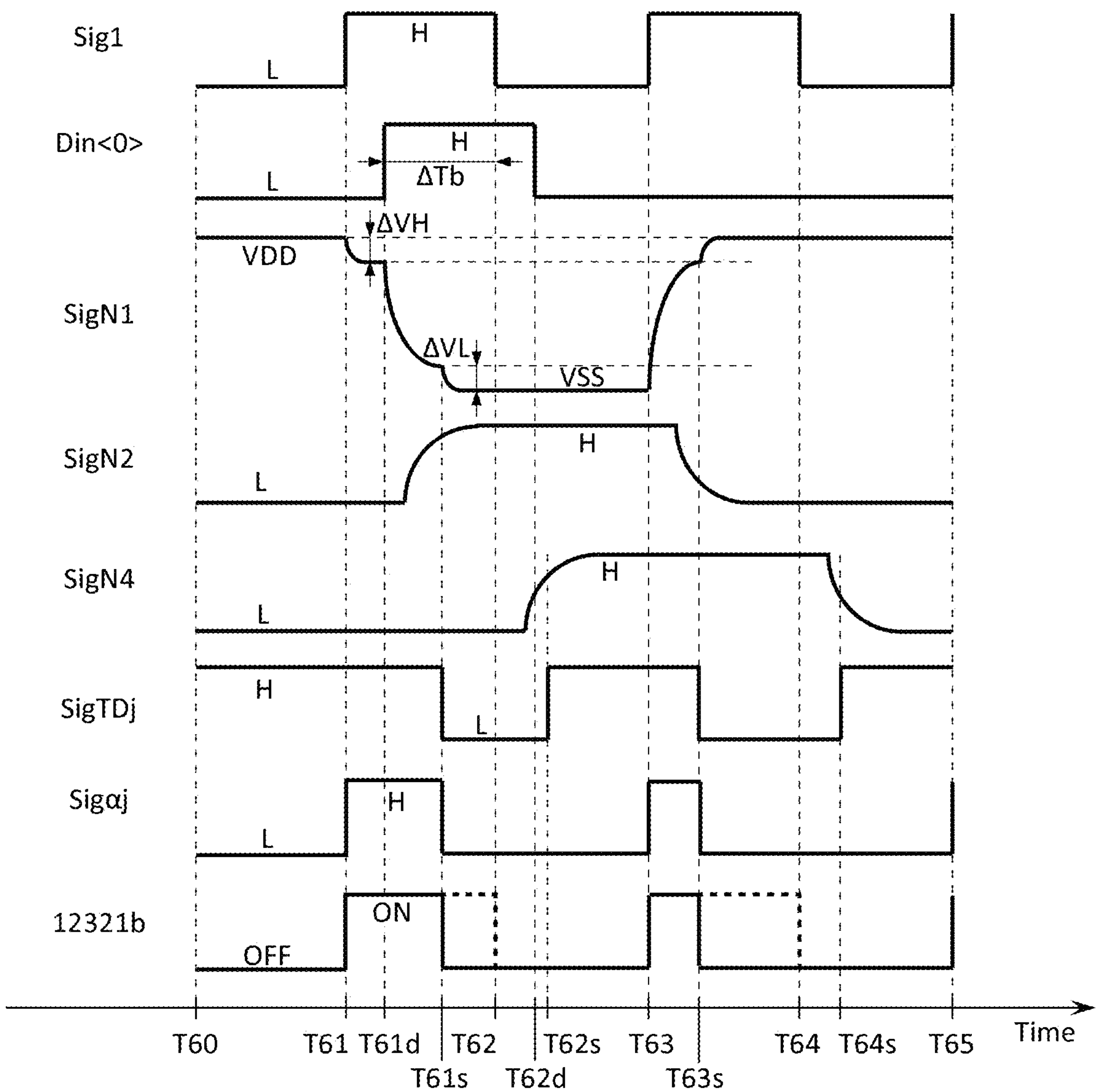
FIG. 32 shows an example of a timing chart showing temporal changes of various signals when the partial latch circuit of the semiconductor memory device according to the sixth embodiment latches data of a bit sent via a signal.

FIG. 32 shows an example of a timing chart showing temporal changes of various signals when the partial latch circuit LC1*b* of the semiconductor memory device 1*bj* according to the sixth embodiment latches data of a bit sent via the signal DQ<0>. In the timing chart, temporal changes of the signal Sig2 and the signal Sigβj are omitted for the same reason as that in the example of FIG. 28.

Regarding the temporal changes of the signal Sig1 and signal Din<0>, the description of FIG. 13 applies, except that the time T00 is replaced with a time T60, the time T01 is replaced with a time T61, the time T02 is replaced with a time T62, the time T03 is replaced with a time T63, the time T04 is replaced with a time T64, the time T01*d* is replaced with a time T01*d*, and the time T02*d* is replaced with a time T62*d*. The period of time ΔTb from the time T61*d* to the time T62 is longer than the period of time ΔT from the time T01*d* to the time T02. Regarding whether each of the latch input circuit 1231 and the inverter circuit 12322 is ON or OFF, the description of FIG. 13 applies, except that the times are replaced as described above.

The L level of the signal Sig1 at the time T64 is maintained until the time T65, and the signal Sig1 rises from the L level to the H level at the time T65. Therefore, from the time T64 to the time T65, the latch input circuit 1231 is OFF, whereas the inverter circuit 12322 is ON. The signal Din<0> is at the L level from the time T64 to the time T65.

While the signal Sig1 is at the L level, the flip-flop circuit 1234 supplies the node N4 with, for example, a voltage at the same level as the voltage of the node N2. While the signal Sig1 is at the H level, the flip-flop circuit 1234 supplies the node N4 with, for example, a voltage at the same level as the voltage of the node N4 to, for example, maintain the level of the voltage of the node N4.

The inverter circuit 12321*b* is in the non-adjustable state while the signal Sigαj is at the L level, and is in the adjustable state while the signal Sigαj is at the H level.

From the time T60 to the time T61*d*, the voltage of the node N1 is at the H level as in the period from the time T50 to the time T51*d* in the example of FIG. 28. During this period, the voltage of the node N2 is stable at the L level as in the period from the time T50 to the time T51*d* in the example of FIG. 28. The H-level voltage of the node N1 during this period will be described.

From the time T60 to the time T61, the flip-flop circuit 1234 supplies the node N4 with a voltage at the same L level as the voltage of the node N2. Accordingly, the voltage of the node N4 is stable at the L level. From the time T61 to the time T01*d*, the flip-flop circuit 1234 supplies the node N4 with a voltage at the same L level as the voltage of the node N4. Accordingly, the voltage of the node N4 is stable at the L level. From the time T60 to the time T61*d*, the voltage of the node N2 and that of the node N4 are both at the L level; therefore, the signal SigTDj is at the H level as in the example of FIG. 28.

Therefore, regarding the H-level voltage of the node N1 during this period, the description of the voltage from the time T50 to the time T51*d* in the example of FIG. 28 applies, except that the signal Sigαi is replaced with the signal Sigαj, and the time T50 is replaced with the time T60, the time T51 is replaced with the time T61, and the time T51*d* is replaced with the time T61*d*.

From the time T01d to the time T62, the L-level voltage is supplied to the node N1 as in the period from the time T51d to the time T52 in the example of FIG. 28. After the value of the voltage of the node N1 becomes smaller than the threshold Vth7 during this period, the inverter circuit 12321b supplies the node N2 with the H-level voltage. Consequently, for example the voltage of the node N1 drops from the H level to reach the L level, and the voltage of the node N2 rises from the L level to reach the H level. These levels of the voltages of the node N1 and the node N2 are maintained until the time T62. The L-level voltage of the node N1 during this period will be described.

From the time T01d to the time T62, the flip-flop circuit 1234 supplies the node N4 with a voltage at the same L level as the voltage of the node N4. Accordingly, the voltage of the node N4 is stable at the L level. Therefore, even when the voltage of the node N2 rises from the L level to the H level as described above, the voltage of the node N4 does not rise from the L level until the time T62. In response to the rise of the voltage of the node N2, the signal SigTDj drops from the H level to the L level at a time T61s, and the L level of the signal SigTDj is maintained until the time T62. The time T61s is after the time T01d and before the time T62. As described above, the signal SigTDj is at the H level from the time T01d to the time T61s as in the period from the time T51d to the time T51s in the example of FIG. 28, and is at the L level from the time T61s to the time T62 as in the period from the time T51s to the time T52 in the example of FIG. 28.

Therefore, regarding the voltage of the node N1 during this period, the description of the voltage from the time T51d to the time T52 in the example of FIG. 28 applies, except that the signal Sigαi is replaced with the signal Sigαj, and the time T51d is replaced with the time T61d, the time T51s is replaced with the time T61s, and the time T52 is replaced with the time T62.

From the time T62 to the time T63, the voltage of the node N1 is stable at the L level and the voltage of the node N2 is stable at the H level as in the period from the time T52 to the time T53 in the example of FIG. 28. During this period, the signal Sig1 is at the L level; therefore, the signal Sigαj is also at the L level, as in the example of FIG. 28. Consequently, the L-level voltage of the node N1 is not a raised voltage, as in the case of the comparative example in FIG. 15.

In this manner, the H level of the signal Din<0> immediately before the time T62, at which the signal Sig1 drops, is reflected in the voltage of each of the node N1 and the node N2, as in the example of FIG. 13. Accordingly, data of a bit of the odd-numbered bits being sent via the signal DQ<0> when the signal DOS drops is latched by the partial latch circuit LC1b as described with reference to FIG. 12.

From the time T62 to the time T63, the flip-flop circuit 1234 supplies the node N3 with a voltage at the L level, which is the level obtained by inverting the level of the voltage of the node N2. After the value of the voltage of the node N3 becomes smaller than the threshold during this period, in accordance with the value of the voltage of the node N3 being smaller than the threshold, the flip-flop circuit 1234 supplies the node N4 with the H-level voltage. Accordingly, the voltage of the node N4 rises from the L level, and reaches and is stabilized at the H level. In response to the rise of the voltage of the node N4 while the voltage of the node N2 is stable at the H level, the signal SigTDj rises from the L level to the H level at a time T62s. The time T62s is after the time T62 and before the time T63. In FIG. 32, the time T62s is after the time T62d. The H level of the signal SigTDj is maintained until the time T63.

From the time T63 to the time T64, the H-level voltage is supplied to the node N1 as in the period from the time T53 to the time T54 in the example of FIG. 28. After the value of the voltage of the node N1 becomes larger than or equal to the threshold Vth7 during this period, the inverter circuit 12321b supplies the node N2 with the L-level voltage. Consequently, the voltage of the node N1 rises from the L level to reach the H level, and the voltage of the node N2 drops from the H level to reach the L level. These levels of the voltages of the node N1 and the node N2 are maintained until the time T64. The H-level voltage of the node N1 during this period will be described.

From the time T63 to the time T64, the flip-flop circuit 1234 supplies the node N4 with a voltage at the same H level as the voltage of the node N4. Accordingly, the voltage of the node N4 is stable at the H level. Therefore, even when the voltage of the node N2 drops from the H level to the L level as described above, the voltage of the node N4 does not drop from the H level until the time T64. Consequently, in response to the drop of the voltage of the node N2, the signal SigTDj drops from the H level to the L level at a time T63s, and the L level of the signal SigTDj is maintained until the time T64. The time T63s is after the time T63 and before the time T64. Therefore, the signal Sigαj is at the same H level as the signal Sig1 from the time T63 to the time T63s, drops from the H level to the L level at the time T63s, and is at the L level from the time T63s to the time T64. The inverter circuit 12321b is in the adjustable state in the period from the time T63 to the time T63s, in which the signal Sigαj is at the H level, and is in the non-adjustable state in the period from the time T63s to the time T64, in which the signal Sigαj is at the L level.

Since the inverter circuit 12321b is in the adjustable state from the time T63 to the time T63s, the voltage of the node N1 is, for example, by the time T63s, stabilized at the H level lowered by the voltage difference ΔVH. From the time T63s, at which the inverter circuit 12321b enters the non-adjustable state, control by the inverter circuit 12321b does not work. As a result, the voltage of the node N1 is raised by the voltage difference ΔVH, by which the voltage was lowered, and is stabilized at the raised H level, and then is stable at the H level until the time T64.

From the time T64 to the time T65, the inverter circuit 12321b supplies the node N2 with the L-level voltage, and the inverter circuit 12322 supplies the node N1 with the H-level voltage. Accordingly, the voltage of the node N1 is stable at the H level, and the voltage of the node N2 is stable at the L level. During this period, the signal Sig1 is at the L level; therefore, the signal Sigαj is also at the L level. Therefore, the inverter circuit 12321b is in the non-adjustable state. Since the inverter circuit 12321b is in the non-adjustable state, the H-level voltage of the node N1 is not a lowered voltage, as in the case of the comparative example in FIG. 15.

In this manner, the L level of the signal Din<0> immediately before the time T64, at which the signal Sig1 drops, is reflected in the voltage of each of the node N1 and the node N2. Accordingly, data of a bit of the odd-numbered bits being sent via the signal DQ<0> when the signal DQS drops is latched by the partial latch circuit LC1b as described with reference to FIG. 12.

From the time T64 to the time T65, the flip-flop circuit 1234 supplies the node N3 with a voltage at the H level, which is the level obtained by inverting the level of the voltage of the node N2. After the value of the voltage of the node N3 becomes larger than or equal to the threshold during this period, in accordance with the value of the voltage of the node N3 being larger than or equal to the threshold, the flip-flop circuit 1234 supplies the node N4 with the L-level voltage. Accordingly, the voltage of the node N4 drops from the H level to the L level, and is stabilized at the L level. In response to the drop of the voltage of the node N4 while the voltage of the node N2 is stable at the L level, the signal SigTDj rises from the L level to the H level at a time T64*s*. The time T64*s* is after the time T64 and before the time T65. The H level of the signal SigTDj is maintained until the time T65.

Advantageous Effects

The partial latch circuit LClb of the semiconductor memory device 1*bj* according to the sixth embodiment produces the following advantageous effects in addition to the advantageous effects described in the first to third embodiments.

The inverter circuit 12321*b* of the partial latch circuit LC1*b* of the semiconductor memory device 1*bj* according to the sixth embodiment is in the non-adjustable state while the signal Sigαj is at the L level, and is in the adjustable state while the signal Sigαj is at the H level. The signal Sigαj is at the same level as the signal Sig1 while the signal SigTDj is at the H level, but is at the L level while the signal SigTDj is at the L level. The signal SigTDj is brought to the L level, for example when a rise or drop of the signal SigN2 is detected, and is at the H level at the other times.

The case where the partial latch circuit LClb of the semiconductor memory device 1*bj* according to the sixth embodiment, for example, lowers the voltage of the node N1 from the H level in response to the rise of the signal Din<0> from the L level to the H level while the signal Sig1 is at the H level, as in the example of FIG. 32, will be described.

The voltage of the node N2 is stable at, for example, the L level until the time of the rise of the signal Din<0>. Therefore, the signal SigTDj is at the H level, and the inverter circuit 12321*b* is in the adjustable state from the time when the signal Sig1 is brought to the H level to the rise of the signal Din<0>, as described in the fifth embodiment. Accordingly, the partial latch circuit LC1*b* of the semiconductor memory device 1*bj* according to the sixth embodiment can also correctly latch data of a bit being sent via the signal Din<0> at the time of the drop of the signal Sig1 as described in the fifth embodiment.

In response to the rise of the signal Din<0>, the voltage of the node N2 rises from the L level and reaches the H level. In response to the rise of the voltage of the node N2, the signal SigTDj drops from the H level to the L level. When the drop of the signal SigTDj takes place while the signal Sig1 is at the H level, the signal Sigαj is brought to the L level in response to the drop, and thereby the inverter circuit 12321*b* enters the non-adjustable state even while the signal Sig1 is at the H level, as described in the fifth embodiment. In the partial latch circuit LC1*b* of the semiconductor memory device 1*bj* according to the sixth embodiment, the inverter circuit 12321*b* may enter the non-adjustable state even while the signal Sig1 is at the H level also in the case where the signal Din<0> drops from the H level to the L level while the signal Sig1 is at the H level.

As described above, the period in which the inverter circuit 12321*b* of the partial latch circuit LC1*b* of the semiconductor memory device 1*bj* according to the sixth embodiment is in the adjustable state may be shorter than the period of the adjustable state in the case of the third embodiment, as in the case of the fifth embodiment. Therefore, the partial latch circuit LC1*b* of the semiconductor memory device 1*bj* according to the sixth embodiment may also enable further reduction in power consumption in comparison with the case of the third embodiment.

Seventh Embodiment

Hereinafter, a semiconductor memory device 1*bk* according to a seventh embodiment will be described.

Configuration Example

A configuration of the semiconductor memory device 1*bk* according to the seventh embodiment will be described, focusing on differences from the configuration of the semiconductor memory device 1*b* according to the third embodiment.

The semiconductor memory device 1*bk* according to the seventh embodiment is different from the semiconductor memory device 1*b* according to the third embodiment in that it includes an input/output circuit 12*bk* instead of the input/output circuit 12*b*. When a constituent of the semiconductor memory device 1*bk* according to the seventh embodiment which includes the input/output circuit 12*bk* is referred to, the constituent will be accompanied by the same reference symbol as that used in the third embodiment with a suffix k added thereto.

As already shown in FIG. 22, the input/output circuit 12*bk* includes a signal formation circuit 126*k* in addition to the constituents of the input/output circuit 12*b* of the semiconductor memory device 1*b* according to the third embodiment. Only the points different from those already described will be described with reference to FIG. 22.

The input circuit 122, for example, outputs the signal Sig1 to the signal formation circuit 126*k*.

The signal formation circuit 126*k*, for example, receives the signal Sig1 from the input circuit 122, generates signals Sigαk and Sigβk based on the signal Sig1, and outputs the signals Sigαk and Sigβk to the latch circuit 123*b*<0>.

Regarding the configuration of the partial latch circuit LClb of the semiconductor memory device 1*bk* according to the seventh embodiment, the description of FIGS. 24 and 25 applies, except that the signal Sigαh is replaced with the signal Sigαk, and the signal Sigβh is replaced with the signal Sigβk.

Figure 33:
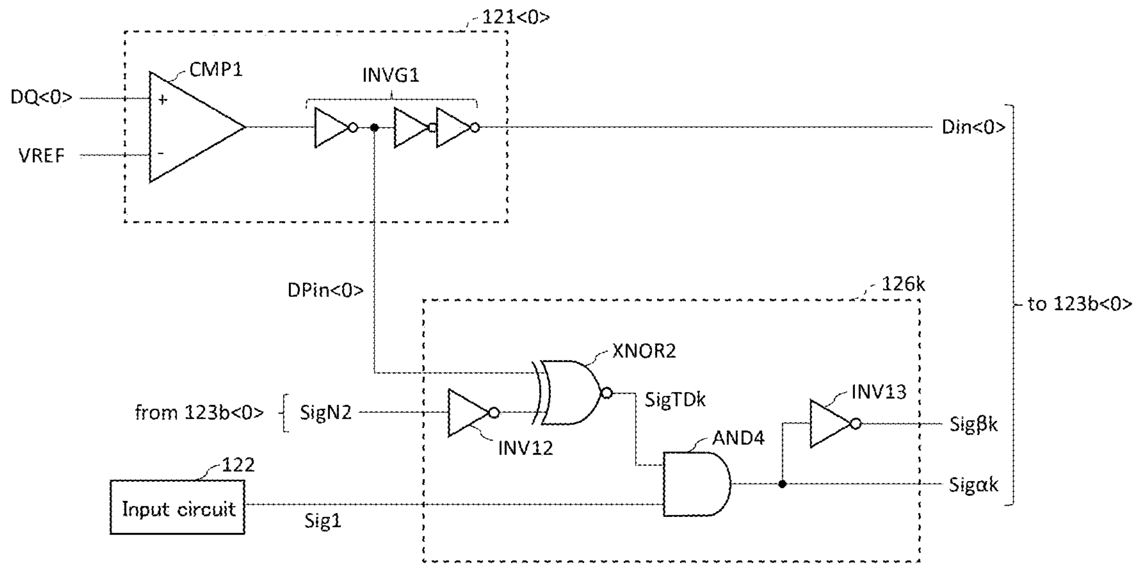
FIG. 33 shows an example of a circuit configuration of a signal formation circuit of a semiconductor memory device according to a seventh embodiment.

FIG. 33 shows an example of a circuit configuration of the signal formation circuit 126*k* of the semiconductor memory device 1*bk* according to the seventh embodiment. FIG. 33 also shows the input circuits 121<0> and 122.

The signal formation circuit 126*k* includes, for example, an inverter INV12, an exclusive NOR gate XNOR2, an AND gate AND4, and an inverter INV13.

The signal formation circuit 126*k* further receives, from the input circuit 121<0>, a signal DPin<0> output from the first-stage inverter of the inverter group INVG1 constituted by three inverters, for example. The signal DPin<0>, for example, rises a given time earlier than the signal Din<0> rises and then is at the H level together with the signal Din<0>, and drops the given time earlier than the signal Din<0> drops. Such a relationship between the signal DPin<0> and the signal Din<0> is attributed to the delay caused by the inverter group INVG1. The signal formation circuit 126*k* further receives the signal SigN2 from the latch circuit 123*b*<0>. The signal formation circuit 126*k* generates signals Sigαk and Sigβk also based on the signal DPin<0> and signal SigN2. The signals Sig1, DPin<0>, and SigN2 are processed in the signal formation circuit 126k as follows.

The inverter INV12 receives the signal SigN2 on the input terminal and outputs a signal at the level obtained by inverting the level of the voltage of the signal SigN2.

The exclusive NOR gate XNOR2 receives the signal DPin<0> on a first input terminal and receives the signal output from the inverter INV12 on a second input terminal. The exclusive NOR gate XNOR2 performs an exclusive NOR operation on the two received signals and outputs a signal SigTDk of a result of the operation. The signal SigTDk is, for example, at the H level from the rise of the signal DPin<0> up to the later rise of the signal SigN2 and from the drop of the signal DPin<0> up to the later drop of the signal SigN2, but is at the L level at the other times.

The AND gate AND4 receives the signal Sig1 on a first input terminal and receives the signal SigTDk on a second input terminal. The AND gate AND4 performs an AND operation on the two received signals and outputs a signal of a result of the operation. The output signal corresponds to the signal Sigαk shown in FIG. 22. The signal Sigαk is at the H level while the signal Sig1 is at the H level and the signal SigTDk is also at the H level, but is at the L level at the other times.

The inverter INV13 receives the signal Sigαk on the input terminal and outputs a signal at the level obtained by inverting the level of the voltage of the signal Sigαk. The output signal corresponds to the signal Sigβk shown in FIG. 22.

Operation Example

Figure 34:
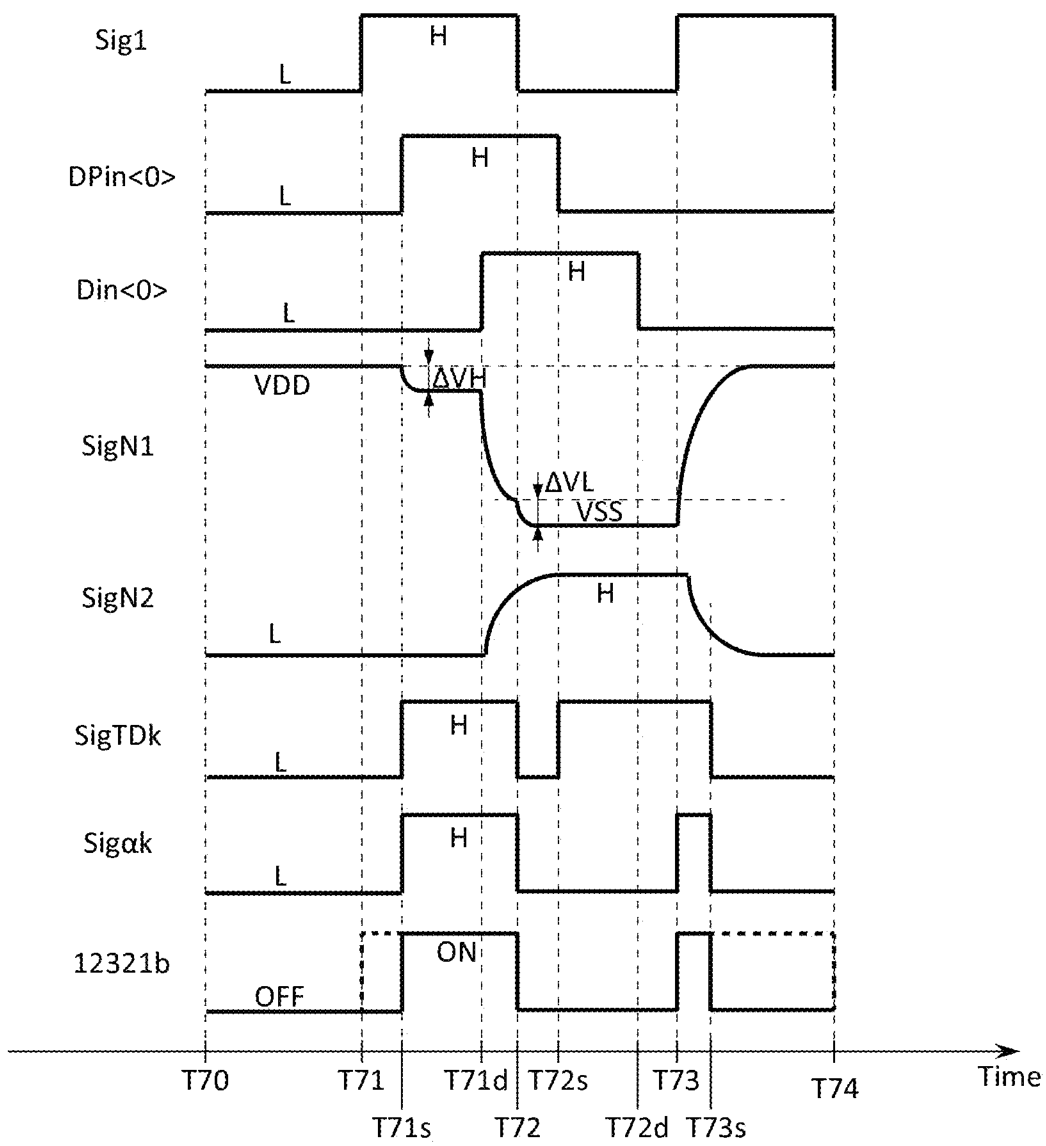
FIG. 34 shows an example of a timing chart showing temporal changes of various signals when a partial latch circuit of the semiconductor memory device according to the seventh embodiment latches data of a bit sent via a signal.

FIG. 34 shows an example of a timing chart showing temporal changes of various signals when the partial latch circuit LC1b of the semiconductor memory device 1bk according to the seventh embodiment latches data of a bit sent via the signal DQ<0>. In the timing chart, temporal changes of the signal Sig2 and the signal Sigβk are omitted for the same reason as that in the example of FIG. 28.

Regarding the temporal changes of the signal Sig1 and signal Din<0>, the description of FIG. 13 applies, except that the time T00 is replaced with a time T70, the time T01 is replaced with a time T71, the time T02 is replaced with a time T72, the time T03 is replaced with a time T73, the time T04 is replaced with a time T74, the time T01d is replaced with a time T71d, and the time T02d is replaced with a time T72d. Regarding whether each of the latch input circuit 1231 and the inverter circuit 12322 is ON or OFF, the description of FIG. 13 applies, except that the times are replaced as described above.

The signal DPin<0> is at the L level from the time T70 to a time T71s, rises from the L level to the H level at the time T71s, and is at the H level from the time T71s to a time T72s. The time T71s is, for example, after the time T71 and before the time T71d. The time T72s is after the time T72 and before the time T72d. The signal DPin<0> drops from the H level to the L level at the time T72s, is at the L level from the time T72s to the time T74.

The inverter circuit 12321b is in the non-adjustable state while the signal Sigαk is at the L level, and is in the adjustable state while the signal Sigαk is at the H level.

From the time T70 to the time T71d, the voltage of the node N1 is at the H level as in the period from the time T00 to the time T01d in the example of FIG. 13. During this period, in accordance with the value of the voltage of the node N1 being larger than or equal to the threshold Vth7, the inverter circuit 12321b supplies the node N2 with the L-level voltage. Accordingly, the voltage of the node N2 is stable at the L level. The H-level voltage of the node N1 during this period will be described.

Since the voltage of the node N2 is stable at the L level, the signal SigTDk is at the L level in the period from the time T70 to the time T71s, in which the signal DPin<0> is also at the L level, and is at the H level in the period from the time T71s to the time T71d, in which the signal DPin<0> is at the H level. Therefore, the signal Sigαk is at the L level from the time T70 to the time T71s, rises from the L level to the H level at the time T71s, and is at the same H level as the signal Sig1 from the time T71s to the time T71d. The inverter circuit 12321b is in the non-adjustable state in the period from the time T70 to the time T71s, in which the signal Sigαk is at the L level, and is in the adjustable state in the period from the time T71s to the time T71d, in which the signal Sigαk is at the H level.

Since the inverter circuit 12321b is in the non-adjustable state from the time T70 to the time T71s, the H-level voltage of the node N1 is not a lowered voltage, as in the case of the comparative example in FIG. 15. From the time T71s, at which the inverter circuit 12321b enters the adjustable state, control by the inverter circuit 12321b works. As a result, the voltage of the node N1 is, for example, stabilized at the H level lowered by the voltage difference ΔVH as in the example of FIG. 13 and is stable at the H level until the time T71d.

From the time T71d to the time T72, the L-level voltage is supplied to the node N1 as in the period from the time T01d to the time T02 in the example of FIG. 13. Accordingly, the voltage of the node N1 drops from the H level. After the value of the voltage of the node N1 becomes smaller than the threshold Vth7 during this period, the inverter circuit 12321b supplies the node N2 with the H-level voltage in accordance with the value of the voltage of the node N1 being smaller than the threshold Vth7. Accordingly, the voltage of the node N2 rises from the L level. At the time T72, for example the voltage of the node N1 reaches the L level, but the voltage of the node N2 does no reach the H level. The L-level voltage of the node N1 during this period will be described.

The signal SigTDk is at the H level from the T71d to the time T72 since the voltage of the node N2 has not sufficiently been raised and the signal DPin is at the H level. Therefore, during this period, the signal Sigαk is as the same H level as the signal Sig1, and the inverter circuit 12321b is thus in the adjustable state. Consequently, the voltage of the node N1 is, for example, stabilized by the time T72, at the L level raised by the voltage difference ΔVL.

From the time T72 to the time T73, the L-level voltage is supplied to the node N1 as in the period from the time T02 to the time T03 in the example of FIG. 13. Accordingly, the L-level voltage of the node N1 is maintained. During this period, in accordance with the value of the voltage of the node N1 being smaller than the threshold Vth7, the inverter circuit 12321b supplies the node N2 with the H-level voltage. Consequently, the voltage of the node N2 reaches and is stabilized at the H level. During this period, since the signal Sig1 is at the L level, the signal Sigαk is also at the L level; therefore, the inverter circuit 12321b is in the non-adjustable state. From the time T72, at which the inverter circuit 12321b enters the non-adjustable state, control by the inverter circuit 12321b does not work. As a result, the voltage of the node N1 is lowered by the voltage difference ΔVL, by which the voltage was raised, and is stabilized at the lowered L level, and then is stable at the L level until the time T73.

The voltage of the node N2 reaches the H level, for example before the time T72*s*. In response to the voltage of the node N2 rising from the L level to the H level in this manner, the signal SigTDk drops from the H level to the L level. Thereafter, the signal SigTDk is at the L level until the time T72*s* since the voltage of the node N2 and the signal DPin<0> are also at the H level, and the signal SigTDk is at the H level in the period from the time T72*s* to the time T73, in which the voltage of the node N2 is at the H level and the signal DPin<0> is at the L level.

From the time T73 to the time T74, the H-level voltage is supplied to the node N1 as in the period from the time T03 to the time T04 in the example of FIG. 13. Accordingly, the voltage of the node N1 rises from the L level, and reaches and is stabilized at the H level. After the value of the voltage of the node N1 becomes larger than or equal to the threshold Vth7 during this period, the inverter circuit 12321*b* supplies the node N2 with the L-level voltage in accordance with the value of the voltage of the node N1 being larger than or equal to the threshold Vth7. Accordingly, the voltage of the node N2 drops from the H level, and reaches and is stabilized at the L level.

In response to the voltage of the node N2 dropping from the H level to the L level in this manner, the signal SigTDk drops from the H level to the L level at a time T73*s*. The time T73*s* is after the time T73 and before the time T74. Thereafter, the signal SigTDk is at the L level until the time T74 since the voltage of the node N2 and the signal DPin<0> are also at the L level. Therefore, the signal Sigαk is at the same H level as the signal Sig1 from the time T73 to the time T73*s*, and is at the L level from the time T73*s* to the time T74. The inverter circuit 12321*b* is in the adjustable state in the period from the time T73 to the time T73*s*, in which the signal Sigαk is at the H level, and is in the non-adjustable state in the period from the time T73*s* to the time T74, in which the signal Sigαk is at the L level.

Since the inverter circuit 12321*b* is in the adjustable state from the time T73 to the time T73*s*, the voltage of the node N1 may be stabilized, by for example, the time T73*s*, at the H level lowered by the voltage difference ΔVH. Since the inverter circuit 12321*b* is in the non-adjustable state from the time T73*s* to the time T74, the voltage of the node N1 is stabilized at the H level. The H-level voltage is not a lowered voltage, as in the case of the comparative example in FIG. 15.

Advantageous Effects

The partial latch circuit LC1*b* of the semiconductor memory device 1*bk* according to the seventh embodiment produces the following advantageous effects in addition to the advantageous effects described in the first to third embodiments.

The inverter circuit 12321*b* of the partial latch circuit LC1*b* of the semiconductor memory device 1*bk* according to the seventh embodiment is in the non-adjustable state while the signal Sigαk is at the L level, and is in the adjustable state while the signal Sigαk is at the H level. The signal Sigαk is at the same level as the signal Sig1 while the signal SigTDk is at the H level, but is at the L level while the signal SigTDk is at the L level. The signal SigTDk is at the H level from, for example, when a change in the level of the signal DPin<0> is detected, to when a change in the level of the signal SigN2 corresponding to the change in the level of the signal DPin<0> is detected, but is at the L level at the other times. The signal DPin<0>, for example, rises a given time earlier than the signal Din<0> rises and then is at the H level together with the signal Din<0>, and drops the given time earlier than the signal Din<0> drops.

The case where the partial latch circuit LClb of the semiconductor memory device 1*bk* according to the seventh embodiment, for example, lowers the voltage of the node N1 from the H level in response to the rise of the signal Din<0> from the L level to the H level while the signal Sig1 is at the H level, as in the example of FIG. 34, will be described.

The voltage of the node N2 is stable at, for example, the L level until the time of the rise of the signal Din<0>. Namely, while the voltage of the node N2 is stable at the L level, the signal DPin<0> rises from the L level to the H level. Therefore, the signal SigTDk is at the L level until the rise of the signal DPin<0>, and rises from the L level to the H level in response to the rise of the signal DPin<0>. The H level of the signal SigTDk is maintained until the voltage of the node N2 rises in response to the rise of the signal Din<0>. Thus, the inverter circuit 12321*b* is in the adjustable state from the later one of the rise of the signal Sig1 and the rise of the signal SigTDk, i.e., the rise of the signal DPin<0>, to the rise of the signal Din<0>. Therefore, at the time of the rise of the signal Din<0>, the H-level voltage of the node N1 is a lowered voltage. Accordingly, the partial latch circuit LC1*b* of the semiconductor memory device 1*bk* according to the seventh embodiment can also correctly latch data of a bit being sent via the signal Din<0> at the time of the drop of the signal Sig1, as described in the first embodiment. When the voltage of the node N2 rises in response to the rise of the signal Din<0>, the signal SigTDk drops from the H level to the L level in response to the rise of the voltage of the node N2. Thus, the inverter circuit 12321*b* changes from the adjustable state to the non-adjustable state in response to the earlier one of the drop of the signal Sig1 and the drop of the signal SigTDk, i.e., the rise of the voltage of the node N2.

When the rise of the signal DPin<0> is later than the rise of the signal Sig1, the inverter circuit 12321*b* is in the non-adjustable state until the signal DPin<0> rises even while the signal Sig1 is at the H level. When the rise of the voltage of the node N2 is earlier than the drop of the signal Sig1, the inverter circuit 12321*b* is in the non-adjustable state after the rise of the voltage of the node N2 even while the signal Sig1 is at the H level.

As described above, the period in which the inverter circuit 12321*b* of the partial latch circuit LClb of the semiconductor memory device 1*bk* according to the seventh embodiment is in the adjustable state may be shorter than the period of the adjustable state in the case of the third embodiment, as in the case of the fourth embodiment. Therefore, the partial latch circuit LClb of the semiconductor memory device 1*bk* according to the seventh embodiment may also enable further reduction in power consumption in comparison with the case of the third embodiment.

Eighth Embodiment

Hereinafter, a semiconductor memory device 1*c* according to an eighth embodiment will be described.

A configuration of the semiconductor memory device 1*c* according to the eighth embodiment will be described, focusing on differences from the configuration of the semiconductor memory device 1 according to the first embodiment.

The semiconductor memory device 1*c* according to the eighth embodiment is different from the semiconductor memory device 1 according to the first embodiment in that it includes a partial latch circuit LC1*c* instead of the partial latch circuit LC1. When a constituent of the semiconductor memory device 1*c* according to the eighth embodiment which includes the partial latch circuit LC1*c* is referred to, the constituent will be accompanied by the same reference symbol as that used in the first embodiment with a suffix c added thereto.

FIG. 35 shows an example of a configuration of the partial latch circuit LC1*c* of the semiconductor memory device 1*c* according to the eighth embodiment.

The partial latch circuit LC1*c* includes a voltage adjustment circuit 1235 in addition to a latch input circuit 1231, positive feedback circuit 1232, and voltage adjustment circuit 1233 as shown in FIG. 10.

The voltage adjustment circuit 1235 includes, for example, an inverter INV14. The input terminal and output terminal of the inverter INV14 are coupled to the node N2. The inverter INV14 supplies the node N2 coupled to the output terminal with, for example, the L-level voltage while the value of the voltage of the node N2 coupled to the input terminal is larger than or equal to a threshold Vth14, and the H-level voltage while the value is smaller than the threshold Vth14.

When the inverter circuit 12321 supplies the node N2 with the H-level voltage, the voltage of the node N2 may thereby be caused to rise. When the value of the voltage is larger than or equal to the threshold Vth14, the voltage adjustment circuit 1235 supplies the node N2 with the L-level voltage in accordance with the value of the voltage of the node N2 being larger than or equal to the threshold Vth14. As a result, the voltage of the node N2 may be stabilized at the H level. The H-level voltage is lower than the voltage in the case where the voltage of the node N2 is stabilized based on the H-level voltage supplied from the inverter circuit 12321 with no voltage supply from the voltage adjustment circuit 1235. These are because, when the voltage of the node N2 is stable at the H level, a resistance R14L of the path from the source of the L-level voltage supplied by the voltage adjustment circuit 1235 to the node N2 is larger than a resistance R3H of the path from the source of the H-level voltage supplied by the inverter circuit 12321 to the node N2. For example, when the voltage of the node N2 is stable at the H level, (magnitude of resistance R14L)/(magnitude of resistance R3H) is not less than 5/3 and not more than 3.

When the inverter circuit 12321 supplies the L-level voltage to the node N2, the voltage of the node N2 may thereby be lowered. When the value of the voltage becomes smaller than the threshold Vth14, the voltage adjustment circuit 1235 supplies the node N2 with the H-level voltage in accordance with the value of the voltage of the node N2 being smaller than the threshold Vth14. As a result, the voltage of the node N2 may be stabilized at the L level. The L-level voltage is higher than the voltage in the case where the voltage of the node N2 is stabilized based on the L-level voltage supplied from the inverter circuit 12321 with no voltage supply from the voltage adjustment circuit 1235. These are because, when the voltage of the node N2 is stable at the L level, a resistance R14H of the path from the source of the H-level voltage supplied by the voltage adjustment circuit 1235 to the node N2 is larger than a resistance R3L of the path from the source of the L-level voltage supplied by the inverter circuit 12321 to the node N2. For example, when the voltage of the node N2 is stable at the L level, (magnitude of resistance R14H)/(magnitude of resistance R3L) is not less than 5/3 and not more than 3.

The partial latch circuit LC1*c* of the semiconductor memory device 1*c* according to the eighth embodiment produces the following advantageous effects in addition to the advantageous effects described in the first embodiment. The H-level voltage of the node N2 is lowered and the L-level voltage of the node N2 is raised by the voltage adjustment circuit 1235. This enables the inverter circuit 12321 to, for example, lower the voltage of the node N2 from the H level to take a value smaller than the threshold Vth4 and raise the voltage of the node N2 from the L level to take a value larger than or equal to the threshold Vth4 in a shorter time.

Ninth Embodiment

Hereinafter, a semiconductor memory device 1*d* according to a ninth embodiment will be described.

A configuration of the semiconductor memory device 1*d* according to the ninth embodiment will be described, focusing on differences from the configuration of the semiconductor memory device 1 according to the first embodiment.

The semiconductor memory device 1*d* according to the ninth embodiment is different from the semiconductor memory device 1 according to the first embodiment in that it includes a partial latch circuit LC1*d* instead of the partial latch circuit LC1. When a constituent of the semiconductor memory device 1*d* according to the ninth embodiment which includes the partial latch circuit LC1*d* is referred to, the constituent will be accompanied by the same reference symbol as that used in the first embodiment with a suffix d added thereto.

FIG. 36 shows an example of a configuration of the partial latch circuit LC1*d* of the semiconductor memory device 1*d* according to the ninth embodiment.

The partial latch circuit LC1*d* includes an inverter circuit 1236 in addition to a latch input circuit 1231 and positive feedback circuit 1232*b* as shown in FIG. 20. The configurations of the latch input circuit 1231 and the positive feedback circuit 1232*b* are as described with reference to FIG. 20.

The inverter circuit 1236 includes, for example, an inverter INV15 and a switch SW8.

Regarding the configuration of the inverter circuit 1236, the description of the configuration of the inverter circuit 12321*b* applies, except that the inverter INV7 is replaced with the inverter INV15, the switch SW5 is replaced with the switch SW8, the node N1 is replaced with the node N2, the node N2 is replaced with the node N5, and the threshold Vth7 is replaced with a threshold Vth15. The signal DQ<0> is based on the voltage of the node N5.

The function of adjusting the voltage of the node N2, which is performed by the inverter circuit 1236 while the signal Sig1 is at the H level, will be described. During this period, the switch SW8 is ON, i.e., the inverter circuit 1236 is in the adjustable state.

When the inverter circuit 12321*b* supplies the node N2 with the H-level voltage, the voltage of the node N2 may thereby be caused to rise. When the value of the voltage is larger than or equal to the threshold Vth15, the inverter circuit 1236 supplies the node N2 with the L-level voltage in accordance with the value of the voltage of the node N2 being larger than or equal to the threshold Vth15. As a result, the voltage of the node N2 may be stabilized at the H level. The H-level voltage is lower than the voltage in the case where the voltage of the node N2 is stabilized based on the H-level voltage supplied from the inverter circuit 12321*b* with no voltage supply from the inverter circuit 1236. These are because, when the voltage of the node N2 is stable at the H level, a resistance R15L of the path from the source of the L-level voltage supplied by the inverter circuit 1236 to the node N2 is larger than a resistance R7H of the path from the source of the H-level voltage supplied by the inverter circuit 12321*b* to the node N2. For example, when the voltage of the node N2 is stable at the H level, (magnitude of resistance R15L)/(magnitude of resistance R7H) is not less than 5/3 and not more than 3.

When the inverter circuit 12321*b* supplies the L-level voltage to the node N2, the voltage of the node N2 may thereby be lowered. When the value of the voltage is smaller than the threshold Vth15, the inverter circuit 1236 supplies the node N2 with the H-level voltage in accordance with the value of the voltage of the node N2 being smaller than the threshold Vth15. As a result, the voltage of the node N2 may be stabilized at the L level. The L-level voltage is higher than the voltage in the case where the voltage of the node N2 is stabilized based on the L-level voltage supplied from the inverter circuit 12321*b* with no voltage supply from the inverter circuit 1236. These are because, when the voltage of the node N2 is stable at the L level, a resistance R15H of the path from the source of the H-level voltage supplied by the inverter circuit 1236 to the node N2 is larger than a resistance R7L of the path from the source of the L-level voltage supplied by the inverter circuit 12321*b* to the node N2. For example, when the voltage of the node N2 is stable at the L level, (magnitude of resistance R15H)/(magnitude of resistance R7L) is not less than 5/3 and not more than 3.

The period in which the signal Sig1 is at the L level will be described. During this period, the switch SW8 is OFF, i.e., the inverter circuit 1236 is in the non-adjustable state. Therefore, even when the voltage of the node N2 is stable at the H level or the L level, the inverter circuit 1236 does not perform the above-described voltage lowering or voltage raising on the voltage of the node N2.

Figure 37:
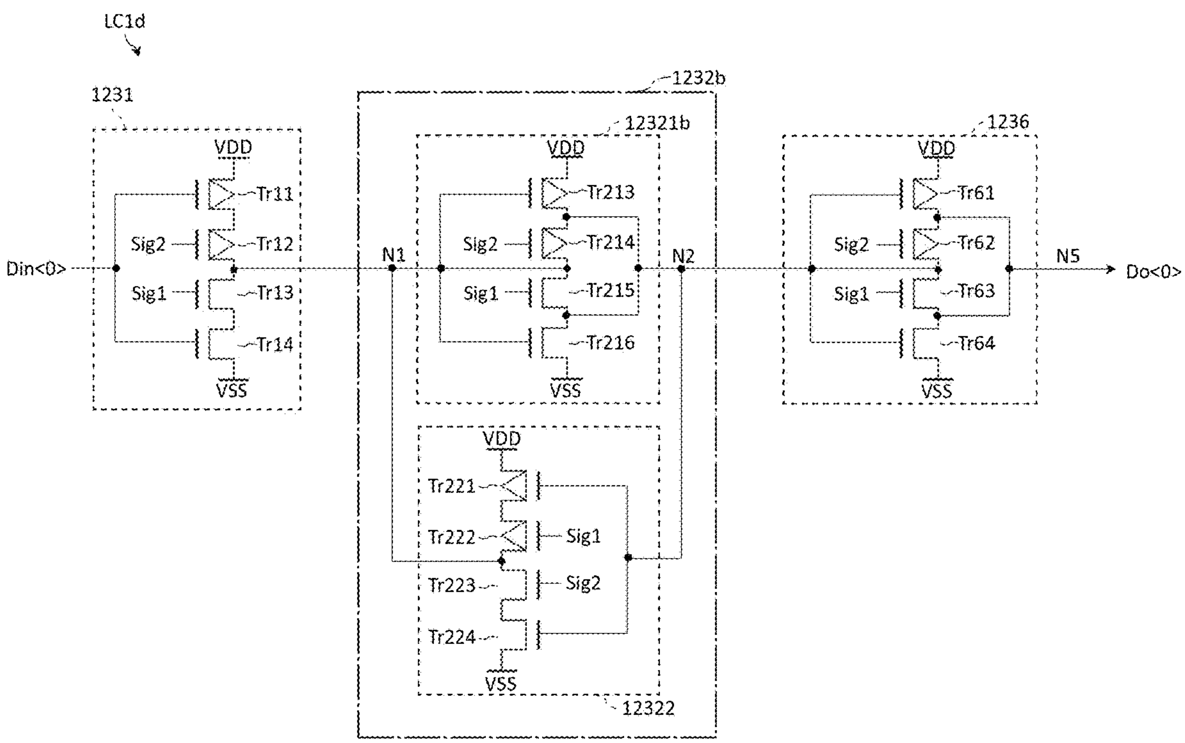
FIG. 37 shows an example of a circuit configuration of the partial latch circuit of the semiconductor memory device according to the ninth embodiment.

FIG. 37 shows an example of a circuit configuration of the partial latch circuit LC1*d* of the semiconductor memory device 1*d* according to the ninth embodiment. In FIG. 37, a configuration that implements a function equivalent to the function implemented by the inverter INV15 and switch SW8 described as a part of the inverter circuit 1236 with reference to FIG. 36 is more concretely shown in addition to the same circuit configuration as that shown in FIG. 21. The circuit configuration apart from the inverter circuit 1236 is as described with reference to FIG. 21.

The inverter circuit 1236 includes, for example, p-channel MOS transistors Tr61 and Tr62 and n-channel MOS transistors Tr63 and Tr64.

Regarding the circuit configuration of the inverter circuit 1236, the description of the circuit configuration of the inverter circuit 12321*b* applies, except that the transistor Tr213 is replaced with the transistor Tr61, the transistor Tr214 is replaced with the transistor Tr62, the transistor Tr215 is replaced with the transistor Tr63, the transistor Tr216 is replaced with the transistor Tr64, the node N1 is replaced with the node N2, and the node N2 is replaced with the node N5.

The partial latch circuit LC1*d* of the semiconductor memory device 1*d* according to the ninth embodiment produces the advantageous effects described in the third embodiment in addition to the advantageous effects described in the eighth embodiment.

Described in the eighth embodiment and ninth embodiment are examples of the case where circuits that supply voltages to lower the H-level voltage of each of the node N1 and the node N2 and raise the L-level voltage of the node N are provided. The circuits described in the first to seventh embodiments can be applied alone or in combination as the circuits that supply voltages to the node N1 and node N2 in the above-described manner.

Tenth Embodiment

Hereinafter, a semiconductor memory device 1*eh* according to a tenth embodiment will be described.

Configuration Example

A configuration of the semiconductor memory device 1*eh* according to the tenth embodiment will be described, focusing on differences from the configuration of the semiconductor memory device 1*bh* according to the fourth embodiment.

The semiconductor memory device 1*eh* according to the tenth embodiment is different from the semiconductor memory device 1*bh* according to the fourth embodiment in that it includes a partial latch circuit LC1*e* instead of the partial latch circuit LC1*b*. When a constituent of the semiconductor memory device 1*eh* according to the tenth embodiment which includes the partial latch circuit LC1*e* is referred to, the constituent will be accompanied by the same reference symbol as that used in the fourth embodiment except that the suffix b is replaced with e.

Figure 38:
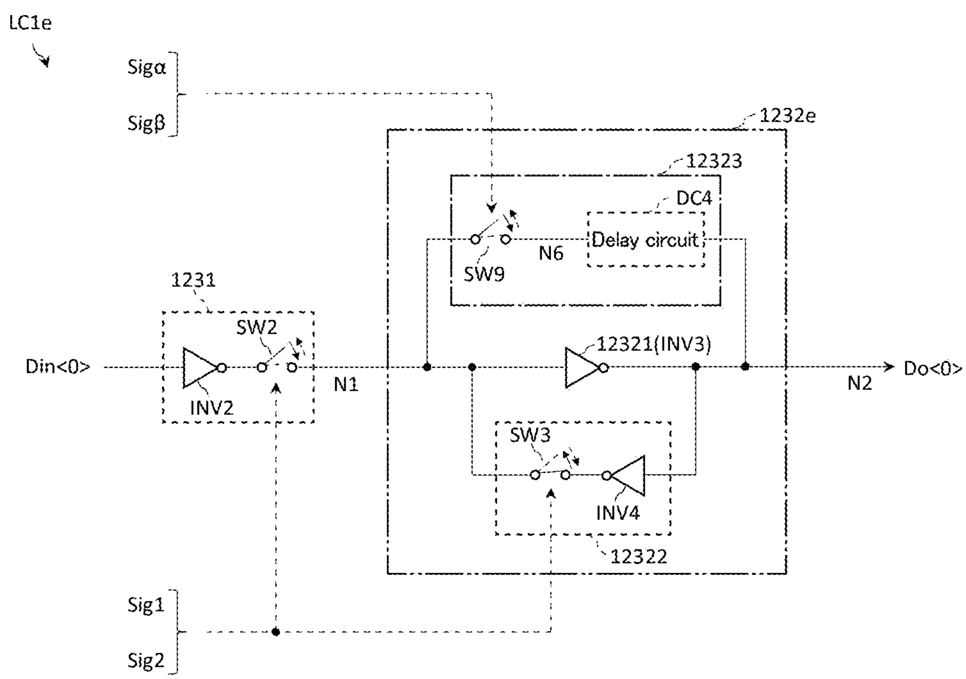
FIG. 38 shows an example of a configuration of a partial latch circuit of a semiconductor memory device according to a tenth embodiment.

FIG. 38 shows an example of a configuration of the partial latch circuit LC1*e* of the semiconductor memory device 1*eh* according to the tenth embodiment.

The partial latch circuit LC1*e* shown in FIG. 38 is different from the partial latch circuit LC1*b* shown in FIG. 24 in that it includes a positive feedback circuit 1232*e* instead of the positive feedback circuit 1232*b*. The positive feedback circuit 1232*e* is different from the positive feedback circuit 1232*b* in that it includes the inverter circuit 12321 and the voltage adjustment circuit 12323 instead of the inverter circuit 12321*b*. The configurations of the inverter circuit 12321 and inverter circuit 12322 of the positive feedback circuit 1232*e* are as described with reference to FIG. 10.

The voltage adjustment circuit 12323 includes, for example, a delay circuit DC4 and a switch SW9.

The input terminal of the delay circuit DC4 is coupled to the node N2, and the output terminal of the delay circuit DC4 is coupled to a node N6. A first terminal of the switch SW9 is coupled to the node N6, and a second terminal of the switch SW9 is coupled to the node N1.

The delay circuit DC4 receives the signal SigN2 on the node N2 coupled to the input terminal, generates a signal by delaying the signal SigN2, and outputs the generated signal to the node N6 coupled to the output terminal. The switch SW9 transfers a signal SigN6 transferred on the node N6 coupled to the first terminal to the node N1 coupled to the second terminal while the switch SW9 is ON. The signal SigN6 is a signal indicating the voltage of the node N6. Like the switch SW5 described with reference to FIG. 24, the switch SW9 is OFF while the signal Sigαh is at the L level and the signal Sigβh is at the H level, and is ON while the signal Sigαh is at the H level and the signal Sigβh is at the L level. FIG. 38 shows the signals Sigαh and Sigβh as signals Sigα and Sigβ. The same applies to the other drawings of the present embodiment.

Described above is an example of the configuration of the voltage adjustment circuit 12323; however, the present embodiment is not limited thereto. The voltage adjustment circuit 12323 may have another configuration capable of outputting a signal obtained by delaying the signal SigN2 to the node N1 while the switch SW9 is ON.

Regarding the function of adjusting the voltage of the node N1 by the voltage adjustment circuit 12323, the same description as that of the function of adjusting the voltage of the node N1 by the inverter circuit 12321*b*, which is provided with reference to FIG. 20, applies.

Figure 39:
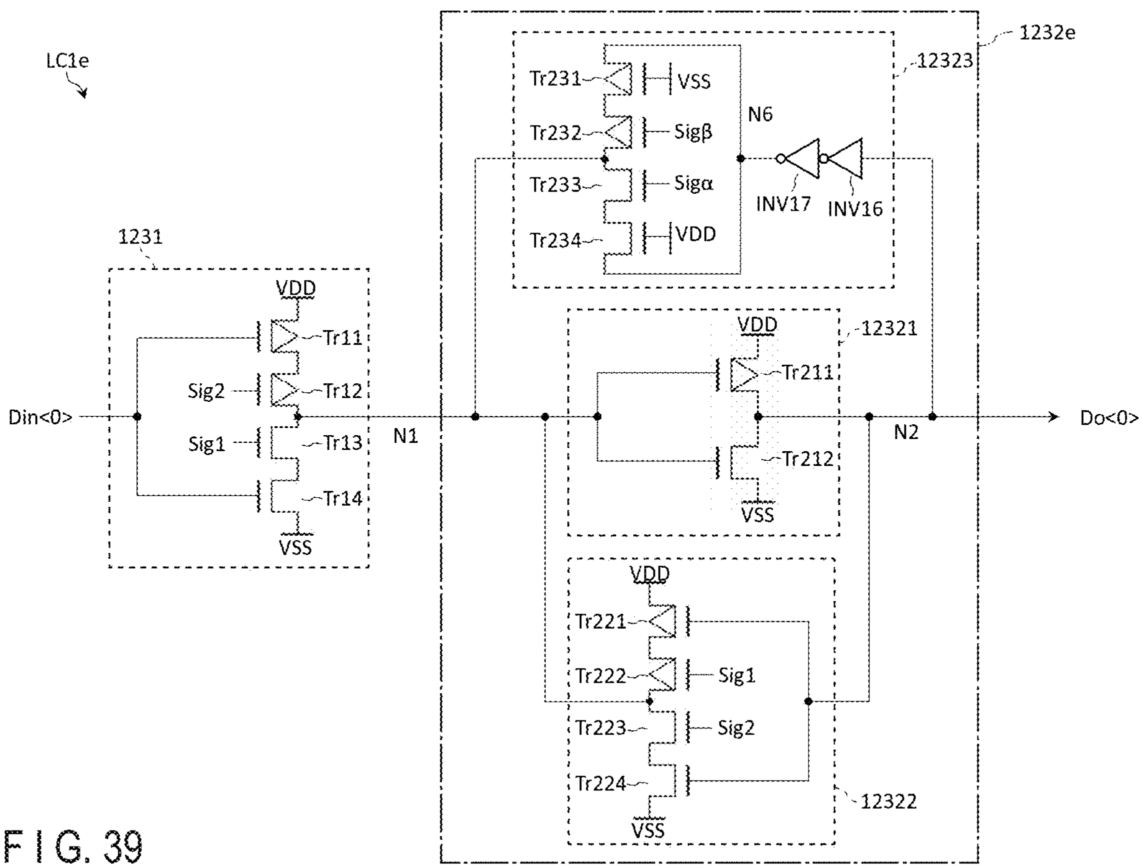
FIG. 39 shows an example of a circuit configuration of the partial latch circuit of the semiconductor memory device according to the tenth embodiment.

FIG. 39 shows an example of a circuit configuration of the partial latch circuit LC1*e* of the semiconductor memory device 1*eh* according to the tenth embodiment.

The circuit configurations of the latch input circuit 1231, inverter circuit 12321, and inverter circuit 12322 shown in FIG. 39 are the same as those in the example of FIG. 11. A circuit configuration of the voltage adjustment circuit 12323 will be described.

The voltage adjustment circuit 12323 includes, for example, inverters INV16 and INV17, p-channel MOS transistors Tr231 and TR232, and n-channel MOS transistors Tr233 and Tr234. The case where the voltage adjustment circuit 12323 includes two inverters INV will be described; however, the number of inverters INV included in the voltage adjustment circuit 12323 is not limited to two.

The input terminal of the inverter INV16 is coupled to the node N2, and the output terminal of the inverter INV16 is coupled to the input terminal of the inverter INV17. The output terminal of the inverter INV17 is coupled to the node N6.

The inverter INV16 receives the signal SigN2 on the node N2 coupled to the input terminal, and supplies a voltage at the level obtained by inverting the level of the signal SigN2 to the input terminal of the inverter INV17 coupled to the output terminal. The inverter INV17 receives the voltage accordingly supplied to the input terminal, and supplies a voltage at the level obtained by inverting the level of that received voltage to the node N6 coupled to the output terminal of the inverter INV17. In this way, a voltage at the same level as the signal SigN2 is supplied to the node N6, but the signal SigN6 is a signal obtained by delaying the signal SigN2 through the inverters INV16 and INV17. The H-level voltage supplied by the inverter INV17 to the node N6 is, for example, the voltage VDD, and the L-level voltage supplied by the inverter INV17 to the node N6 is, for example, the voltage VSS.

A first terminal of the transistor Tr231 is coupled to the node N6, and a second terminal of the transistor Tr231 is coupled to a first terminal of the transistor Tr232. A second terminal of the transistor Tr232 is coupled to the node N1. A first terminal of the transistor Tr233 is coupled to the node N1, and a second terminal of the transistor Tr233 is coupled to a first terminal of the transistor Tr234. The second terminal of the transistor Tr234 is coupled to the node N6. For example, the voltage VSS is applied to the gate of the transistor Tr231 and, for example, the voltage VDD is applied to the gate of the transistor Tr234. The signal Sigβh is input to the gate of the transistor Tr232, and the signal Sigαh is input to the gate of the transistor Tr233.

When the signal SigN6 is at the H level, the transistor Tr231 is ON and the transistor Tr234 is OFF. Therefore, in accordance with the signal SigN6 being at the H level, the H-level voltage VDD of the signal SigN6 is supplied to the first terminal of the transistor Tr232. In contrast, when the signal SigN6 is at the L level, the transistor Tr231 is OFF and the transistor Tr234 is ON. Therefore, in accordance with the signal SigN6 being at the L level, the L-level voltage VSS of the signal SigN6 is supplied to the second terminal of the transistor Tr233. The transistors Tr231 and Tr234 may produce the same advantageous effects as those described in connection with the transistors Tr303 and Tr304 with reference to FIG. 19.

While the signal Sigαh is at the L level and the signal Sigβh is at the H level, the transistors Tr232 and Tr233 are OFF. Therefore, neither the voltage VDD which may be supplied to the first terminal of the transistor Tr232 nor the voltage VSS which may be supplied to the second terminal of the transistor Tr233 is supplied to the node N1.

While the signal Sigαh is at the H level and the signal Sigβh is at the L level, the transistors Tr232 and Tr233 are ON. During this period, the voltage adjustment circuit 12323 supplies a voltage to the node N1 as follows. When the signal SigN6 is at the H level, the voltage VDD supplied to the first terminal of the transistor Tr232 is supplied to the node N1. In contrast, when the signal SigN6 is at the L level, the voltage VSS applied to the second terminal of the transistor Tr233 is supplied to the node N1.

For example, the inverters INV16 and INV17 shown in FIG. 39 function as the delay circuit DC4 shown in FIG. 38. The p-channel MOS transistors Tr231 and Tr232 and n-channel MOS transistors Tr233 and Tr234 shown in FIG. 39 function as the switch SW9 shown in FIG. 38. The other circuit configurations shown in FIG. 39 correspond to those shown in FIG. 38 in a similar manner to the correspondence described with reference to FIG. 11.

Figure 40:
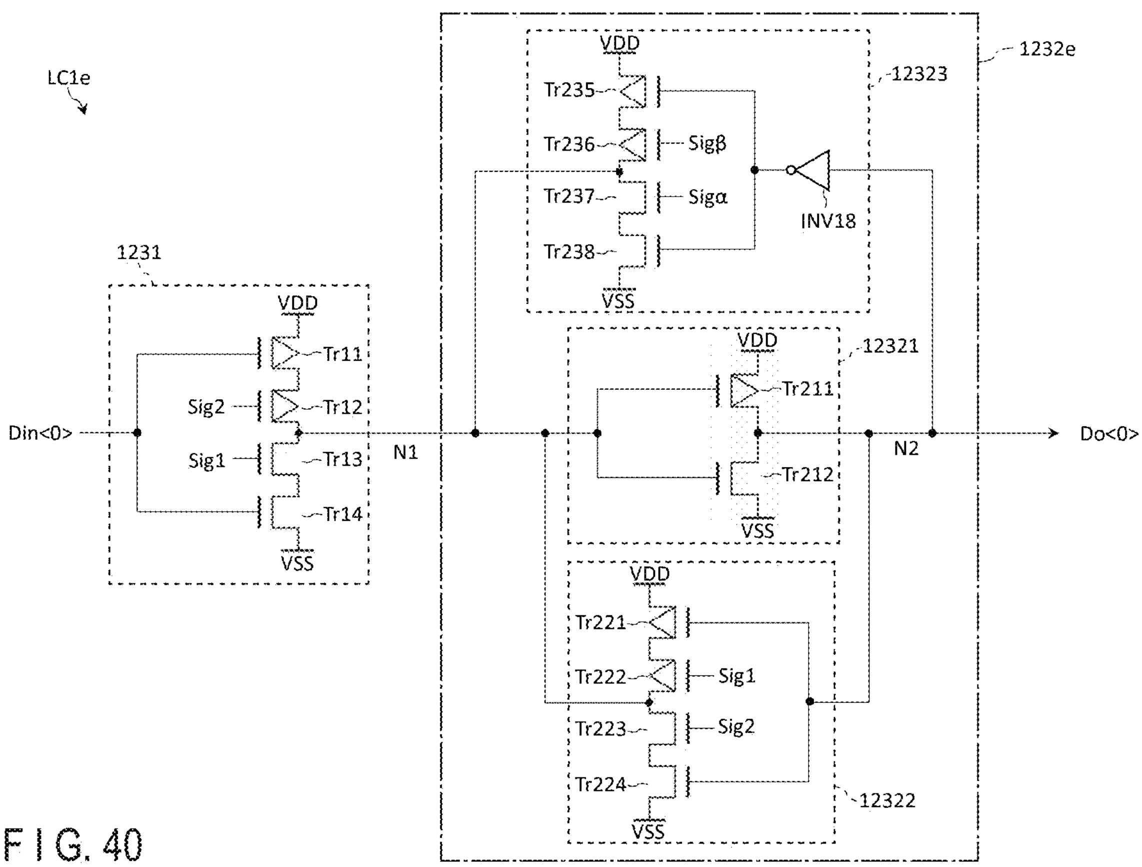
FIG. 40 shows another example of the circuit configuration of the partial latch circuit of the semiconductor memory device according to the tenth embodiment.

FIG. 40 shows another example of the circuit configuration of the partial latch circuit LC1*e* of the semiconductor memory device 1*eh* according to the tenth embodiment. The circuit configuration of the partial latch circuit LC1*e* is the same as that in the example of FIG. 39, except for the points to be described below.

The voltage adjustment circuit 12323 includes, for example, an inverter INV18, p-channel MOS transistors Tr235 and Tr236, and n-channel MOS transistors Tr237 and Tr238, instead of having the circuit configuration described with reference to FIG. 39.

The input terminal of the inverter INV18 is coupled to the node N2. For example, the voltage VDD is applied to a first terminal of the transistor Tr235, a second terminal of the transistor Tr235 is coupled to a first terminal of the transistor Tr236, and a second terminal of the transistor Tr236 is coupled to the node N1. A first terminal of the transistor Tr237 is coupled to the node N1, a second terminal of the transistor Tr237 is coupled to a first terminal of the transistor Tr238, and for example the voltage VSS is applied to a second terminal of the transistor Tr238. The gate of each of the transistors Tr235 and Tr238 is coupled to the output terminal of the inverter INV18. The signal Sigβh is input to the gate of the transistor Tr236, and the signal Sigh is input to the gate of the transistor Tr237.

While the signal Sigαh is at the L level and the signal Sigβh is at the H level, the transistors Tr236 and Tr237 are OFF. Therefore, neither the voltage VDD applied to the first terminal of the transistor Tr235 nor the voltage VSS applied to the second terminal of the transistor Tr238 is supplied to the node N1.

While the signal Sigαh is at the H level and the signal Sigβh is at the L level, the transistors Tr236 and Tr237 are ON. During this period, the voltage adjustment circuit 12323 supplies a voltage to the node N1 as follows.

The inverter INV18 receives the signal SigN2 on the node N2 coupled to the input terminal of the inverter INV18, and supplies a voltage at the level obtained by inverting the level of the signal SigN2 to the gate of each of the transistors Tr235 and Tr238 coupled to the output terminal of the inverter INV18. When the inverter INV18 supplies the L-level voltage to the gate of each of the transistors Tr235 and Tr238 in accordance with the H-level signal SigN2, the transistor Tr235 is ON and the transistor Tr238 is OFF. Therefore, in accordance with the signal SigN2 being at the H level, the voltage VDD applied to the first terminal of the transistor Tr235 is supplied to the node N1. In contrast, when the inverter INV18 supplies the H-level voltage to the gate of each of the transistors Tr235 and Tr238 in accordance with the L-level signal SigN2, the transistor Tr235 is OFF and the transistor Tr238 is ON. Therefore, in accordance with the L-level signal SigN2, the voltage VSS applied to the second terminal of the transistor Tr238 is supplied to the node N1.

Accordingly, the voltage supplied by the voltage adjustment circuit 12323 to the node N1 is at the same level as the signal SigN2, but the signal of that voltage supplied to the node N1 is a signal obtained by delaying the signal SigN2 through the inverter INV18 and transistors Tr235 and Tr238.

For example, the inverter INV18, p-channel MOS transistor Tr235, and n-channel MOS transistor Tr238 shown in FIG. 40 function as the delay circuit DC4 shown in FIG. 38. The p-channel MOS transistor Tr236 and n-channel MOS transistor Tr237 shown in FIG. 40 function as the switch SW9 shown in FIG. 38. The other circuit configurations shown in FIG. 40 correspond to those shown in FIG. 38 in a similar manner to the correspondence described with reference to FIG. 11.

In either example of FIG. 39 and FIG. 40, when the voltage adjustment circuit 12323 and the latch input circuit 1231 both supply the node N1 with voltages and the voltage of the node N1 is stable, the same description as that for the inverter circuit 12321*b* and the latch input circuit 1231 provided with reference to FIG. 21 applies to the relationship between the on-resistance of the transistors Tr through which a current passes between the node N1 and the source of the voltage supplied by the voltage adjustment circuit 12323 and the on-resistance of the transistors Tr through which a current passes between the node N1 and the source of the voltage supplied by the latch input circuit 1231.

Described above is an example of the case where the configuration in which the delay circuit DC4 relates to the adjustment of the voltage of the node N1 is applied to the semiconductor memory device 1*bh* according to the fourth embodiment; however, the present embodiment is not limited thereto. The technique disclosed in the present embodiment may be applied to the semiconductor memory devices according to the other embodiments.

Operation Example

FIG. 41 shows an example of a timing chart showing temporal changes of various signals when the partial latch circuit LC1*e* of the semiconductor memory device 1*eh* according to the tenth embodiment latches data of a bit sent via the signal DQ<0>. In the timing chart, temporal changes of the signal Sig2 and the signal Sigβh are omitted for the same reason as that in the example of FIG. 28.

Regarding the temporal changes of the signal Sig1 and signal Din<0>, the description of FIG. 13 applies, except that the time T00 is replaced with a time T80, the time T01 is replaced with a time T81, the time T02 is replaced with a time T82, the time T03 is replaced with a time T83, the time T04 is replaced with a time T84, the time T01*d* is replaced with a time T81*d*, and the time T02*d* is replaced with a time T82*d*. The period of time from the time T81*d* to the time T82 is, for example, the same as the period of time ΔT from the time T01*d* to the time T02. Regarding whether each of the latch input circuit 1231 and the inverter circuit 12322 is ON or OFF, the description of FIG. 13 applies, except that the times are replaced as described above.

Regarding the temporal change of the signal Sigαh, the description of FIG. 26 applies, except that the time T40 is replaced with the time T80, the time T41 is replaced with the time T81, the time T41*s* is replaced with a time T81*s*, the time T41*d* is replaced with the time T81*d*, the time T42 is replaced with the time T82, the time T43 is replaced with the time T83, the time T43*s* is replaced with a time T83*s*, and the time T44 is replaced with the time T84. Therefore, the voltage adjustment circuit 12323 is ON from the time T81*s* to the time T82 and from the time T83*s* to the time T84, and is OFF at the other times, like the inverter circuit 12321*b* in the example of FIG. 26.

From the time T80 to the time T81*d*, the voltage of the node N1 is at the H level as in the period from the time T00 to the time T01*d* in the example of FIG. 13. During this period, in accordance with the voltage of the node N1 being at the H level, the inverter circuit 12321 supplies the node N2 with the L-level voltage. Accordingly, the voltage of the node N2 is stable at the L level. In addition, during this period, in accordance with the voltage of the node N2 being at the L level, the delay circuit DC4 of the voltage adjustment circuit 12323 supplies the node N6 with the L-level voltage. Accordingly, the voltage of the node N6 is also stable at the L level. The H-level voltage of the node N1 during this period will be described.

Since the voltage adjustment circuit 12323 is OFF from the time T80 to the time T81*s*, the H-level voltage of the node N1 is not a lowered voltage, as in the case of the comparative example in FIG. 15. From the time T81*s* to the time 81*d*, the voltage adjustment circuit 12323 is ON, and transfers the L-level voltage of the node N6 to the node N1. As a result, the voltage of the node N1 is, for example, stabilized at the H level lowered by the voltage difference ΔVH as in the example of FIG. 13 and is stable at the H level until the time T81*d*.

From the time T81*d* to the time T82, the L-level voltage, such as the voltage VSS, is supplied to the node N1 as in the period from the time T01*d* to the time T02 in the example of FIG. 13. Accordingly, the voltage of the node N1 drops from the H level. In response to the drop of the voltage of the node N1, the inverter circuit 12321 supplies the node N2 with the H-level voltage. Accordingly, the voltage of the node N2 rises from the L level. In response to the rise of the voltage of the node N2, the inverter circuit DC4 supplies the node N6 with the H-level voltage. The supply of the H-level voltage to the node N6 starts later than the supply of the H-level voltage to the node N2, for example, after the time T82. In this case, the voltage of the node N6 does not rise and is, for example, constant, and is stable at the L level, from the time T81*d* to the time T82. During this period, the voltage adjustment circuit 12323 is ON, and transfers the L-level voltage of the node N6 to the node N1.

At the time T82, the voltage of the node N1 has been lowered to such an extent that the change in the level of the signal Din<0> is surely conveyed as a change in the voltage of the node N1. From the time T82 to the time T83, the inverter circuit 12321 supplies the H-level voltage to the node N2 and the L-level voltage is supplied to the node N1 as in the period from the time T02 to the time T03 in the example of FIG. 13. Therefore, as in the example of FIG. 13, the voltage of the node N1 reaches and is stabilized at the L level, and the voltage of the node N2 rises and is stabilized at the H level. In response to the rise of the voltage of the node N2, the delay circuit DC4 supplies the node N6 with the H-level voltage; therefore, the voltage of the node N6 is also stabilized at the H level. However, since the voltage adjustment circuit 12323 is OFF during this period, the L-level voltage of the node N1 is not a raised voltage, as in the case of the comparative example in FIG. 15.

In this manner, the H level of the signal Din<0> immediately before the time T82, at which the signal Sig1 drops, is reflected in the voltage of each of the node N1 and the node N2, as in the example of FIG. 13. Accordingly, data of a bit of the odd-number bits being sent via the signal DQ<0> when the signal DOS drops is latched by the partial latch circuit LC1*e* as described with reference to FIG. 12.

From the time T83 to the time T84, the H-level voltage is supplied to the node N1 as in the period from the time T03 to the time T04 in the example of FIG. 13. Accordingly, the voltage of the node N1 rises from the L level, and reaches and is stabilized at the H level. In response to the rise of the voltage of the node N1, the inverter circuit 12321 supplies the node N2 with the L-level voltage. Accordingly, the voltage of the node N2 drops from the H level. In response to the drop of the voltage of the node N2, the delay circuit DC4 supplies the node N6 with the L-level voltage. The supply of the L-level voltage to the node N6 starts later than the supply of the L-level voltage to the node N2.

The voltage adjustment circuit 12323 is OFF from the time T83 to the time T83*s*. Therefore, when the voltage of the node N1 reaches the H level during this period, the H-level voltage is not a lowered voltage, as in the case of the comparative example in FIG. 15. The voltage adjustment circuit 12323 is ON from the time T83*s* to the time T84. As a result, the voltage of the node N1 is stabilized at the H level lowered by the voltage difference ΔVH as in the example of FIG. 13, and is stable at the H level until the time T84.

Advantageous Effects

The partial latch circuit LC1*e* of the semiconductor memory device 1*eh* according to the tenth embodiment produces the following advantageous effects in addition to the advantageous effects described in the first to fourth embodiments.

In the example of FIG. 41, at the time T81*d*, the latch input circuit 1231 starts supply of the L-level voltage to the node N1 in response to the rise of the signal Din<0> from the L level to the H level. Accordingly, the voltage of the node N1 drops from the H level lowered by the voltage difference ΔVH. In response to the drop of the voltage of the node N1, the inverter circuit 12321 supplies the node N2 with the H-level voltage. Accordingly, the voltage of the node N2 rises from the L level. In response to the rise of the voltage of the node N2, the inverter circuit DC4 supplies the node N6 with the H-level voltage. Due to the intermediation of the delay circuit DC4, the supply of the H-level voltage to the node N6 starts later than the supply of the H-level voltage to the node N2, for example, after the time T82. In this case, the voltage of the node N6 does not rise and is, for example, constant, and is stable at the L level, from the time T81*d* to the time T82. The latch input circuit 1231 continues the supply of the L-level voltage to the node N1 until the time T82.

From the time T81*d* to the time T82, the voltage adjustment circuit 12323 transfers the L-level voltage of the node N6 to the node N1. Accordingly, for example, the L-level voltage of the node N6 is continuously transferred to the node N1 while the voltage of the node N1 is dropping from the time T81*d* to the time T82. Namely, the voltage adjustment circuit 12323 may maximize the function of lowering the voltage of the node N1 during this period. Therefore, the latch input circuit 1231 can lower the voltage of the node N1 between the time T81*d* and the time T82 to such an extent that the change in the level of the signal Din<0> is surely conveyed as a change in the voltage of the node N1.

Even when the period of time from the rise of the signal Din<0> to the drop of the signal Sig1 is such a short time as the period of time ΔT as described above, the partial latch circuit LC1*e* of the semiconductor memory device 1*eh* of the tenth embodiment can correctly latch data of a bit being sent via the signal Din<0> at the time of the drop. Therefore, the partial latch circuit LC1*e* of the semiconductor memory device 1*eh* can correctly latch data of each of the odd-number bits of the signal Din<0> even when the semiconductor memory device 1*eh* operates at a high speed, as described with reference to the first embodiment.

Other Embodiments

Some D latch circuits have been described as examples of latch circuits to which the technique disclosed herein is applicable. However, the technique disclosed herein is applicable to other various D latch circuits in a similar manner. In addition, the technique disclosed herein may be applied to latch circuits other than the D latch circuit.

Described in the first embodiment is the case where the voltage adjustment circuit 1233 is implemented by a CMOS inverter circuit. However, the voltage adjustment circuit 1233 may be implemented by an inverter having another configuration. Instead of the CMOS inverter circuit, for example a NAND gate circuit may be used. In this case, by supplying the H-level voltage to one of the two input terminals of the NAND gate circuit, the other one can be used as the input terminal of the inverter. Instead of the CMOS inverter circuit, a clocked inverter circuit may be used. Specifically, a clock synchronization CMOS inverter circuit may be used. Accordingly, as the inverter constituting the voltage adjustment circuit 1233, circuits having various configurations may be used as long as the circuits can supply a voltage at a logic level (L level or H level) opposite to the logic level (H level or L level) of the voltage supplied to the input terminal. The same applies to the other inverters.

For example, the fourth embodiment, fifth embodiment, sixth embodiment, and seventh embodiment each shorten the period of the adjustable state by adding a signal formation circuit to the configuration of the third embodiment. However, the period of the adjustable state may be shortened by applying the signal formation circuit described in each of the fourth embodiment, fifth embodiment, sixth embodiment, and seventh embodiment to the second embodiment.

Described above is the case where, for example, an inverter is used to drop or rise the H-level or L-level voltage of a node. However, another configuration may be used for adjustment of the voltage of the node. For example, a configuration in which the node is supplied with a voltage between the H-level voltage and the L-level voltage, such as an average voltage of the H-level voltage and the L-level voltage may be used.

Herein, the term "couple" refers to electrical coupling, and does not exclude intervention of another component.

Herein, expressions such as "the same", "match", "constant", and "maintain" are used with an intention of tolerating an error in a design range when the technique described in each embodiment is implemented. The same applies to the above expressions accompanied by "substantially", such as "substantially the same". Expressions such as a voltage being applied or supplied are used with an intention of including both control to apply or supply the voltage and actual application or supply of the voltage. Application or supply of a voltage may include application or supply of, for example, 0V.

Each of the above embodiments may be understood in light of the following:

[1] A semiconductor device comprising:

a first circuit configured to receive a first signal, and output a first voltage to a first node in accordance with a voltage of the first signal being at a first level and output a second voltage to the first node in accordance with the voltage of the first signal being at a second level, the first voltage being higher than the second voltage;

a second circuit coupled to the first node and configured to latch data based on a voltage of the first node; and a third circuit coupled to the first node and configured to output a third voltage to the first node while the first circuit is outputting the first voltage to the first node and output a fourth voltage to the first node while the first circuit is outputting the second voltage to the first node, the third voltage being lower than the first voltage, and the fourth voltage being higher than the second voltage.

[2] The device according to [1], wherein the first circuit is further configured to receive a second signal, and the output of the first voltage and the second voltage to the first node is performed while a voltage of the second signal is at a third level.

[3] The device according to [1], wherein the third circuit includes an inverter, and the third voltage and the fourth voltage are output by the inverter based on the voltage of the first node.

[4] The device according to [1], wherein the output of the third voltage and the fourth voltage to the first node by the third circuit is on-off controllable.

[5] The device according to [1], wherein the first circuit is coupled to a second node to which the first voltage is applied, the third circuit is coupled to a third node to which the third voltage is applied, and a resistance of a path from the third node to the first node is larger than a resistance of a path from the second node to the first node while the first circuit is outputting the first voltage to the first node and the third circuit is outputting the third voltage to the first node.

[6] A semiconductor device comprising:

a first circuit configured to receive a first signal, and output a first voltage to a first node in accordance with a voltage of the first signal being at a first level and output a second voltage to the first node in accordance with the voltage of the first signal being at a second level, the first voltage being higher than the second voltage; and a second circuit coupled to the first node and a second node and configured to latch data based on a voltage of the first node, wherein the second circuit includes an inverter, an input terminal of the inverter is coupled to the first node, and an output terminal of the inverter is coupled to the second node, the inverter outputs one of a third voltage and a fourth voltage to the second node based on the voltage of the first node, and the second circuit is further configured to output the third voltage output to the second node by the inverter to the first node while the first circuit is outputting the first voltage to the first node, and output the fourth voltage output to the second node by the inverter to the first node while the first circuit is outputting the second voltage to the first node.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a memory cell array including a memory cell;

a data signal terminal configured to receive data to be written into the memory cell from an exterior of the semiconductor memory device and to output data read from the memory cell to the exterior of the semiconductor memory;

a timing signal terminal configured to receive a timing control signal; and an interface circuit including:

a first comparator having a first input terminal connected to the data signal terminal, a second input terminal connected to a reference voltage, and an output terminal;

a plurality of first inverters connected in series, an input terminal of a first stage among the first inverters being connected to the output terminal of the first comparator;

a first switch circuit having a first terminal connected to an output terminal of a final stage among the first inverters and a second terminal;

a second inverter having an input terminal connected to the second terminal of the first switch and an output terminal connected to the second terminal of the first switch; and a first latch circuit connected to the second terminal of the first switch.

2. The semiconductor device according to claim 1, wherein the first latch circuit includes:

a third inverter having an input terminal connected to the second terminal of the first switch and an output terminal;

a fourth inverter having an input terminal connected to the output terminal of the third inverter and an output terminal; and a second switch circuit having a first terminal connected to the output terminal of the fourth inverter and a second terminal connected to the second terminal of the first switch.

3. The semiconductor device according to claim 1, further comprising:

a complement timing signal terminal configured to receive a complement timing control signal, wherein the interface circuit further includes:

a second comparator having a first input terminal connected to the timing signal terminal, a second input terminal connected to the complement timing signal terminal, and an output terminal; and a plurality of fifth inverters connected in series, an input terminal of a first stage one of the fifth inverters being connected to the output terminal of the second comparator.

4. The semiconductor device according to claim 3, wherein the first switch circuit further includes a control terminal connected to an output terminal of a final stage one of the fifth inverters.

5. The semiconductor device according to claim 4, wherein a number of the first inverters is different from a number of the fifth inverters.

6. The semiconductor device according to claim 2, further comprising:

a complement timing signal terminal configured to receive a complement timing control signal, wherein the interface circuit further includes:

a second comparator having a first input terminal connected to the timing signal terminal, a second input terminal connected to the complement timing signal terminal, a first output terminal, and a second output terminal;

a plurality of fifth inverters connected in series, an input terminal of a first stage one of the fifth inverters being connected to the first output terminal of the second comparator; and a plurality of sixth inverters connected in series, an input terminal of a first stage one of the sixth inverters being connected to the second output terminal of the second comparator.

7. The semiconductor device according to claim 6, wherein the interface circuit further includes:

a second latch circuit connected to the second terminal of the first switch, and the second latch circuit includes:

a seventh inverter having an input terminal connected to the second terminal of the first switch and an output terminal;

an eighth inverter having an input terminal connected to the output terminal of the seventh inverter and an output terminal; and a third switch circuit having a first terminal connected to the output terminal of the eighth inverter and a second terminal connected to the second terminal of the first switch.

8. The semiconductor device according to claim 7, wherein the second switch circuit further includes a control terminal connected to an output terminal of a final stage one of the fifth inverters, and the third switch circuit further includes a control terminal connected to an output terminal of a final stage one of the sixth inverters.

9. A semiconductor device comprising:

a first clocked inverter having a first input terminal and a first output terminal coupled to a first node;

a second clocked inverter having a second input terminal coupled to a second node and a second output terminal coupled to the first node;

an inverter having a third input terminal coupled to the first node and a third output terminal coupled to the second node; and a switch having a first terminal coupled to the first node and a second terminal coupled to the second node, wherein:

in a case where the first clocked inverter turns on, the second clocked inverter is configured to turn off and the switch is configured to turn on; and in a case where the first clocked inverter turns off, the second clocked inverter is configured to turn on and the switch is configured to turn off.

10. The semiconductor device according to claim 9, wherein, in the case where the first clocked inverter turns on, the first clocked inverter is configured to output a first voltage to the first node in accordance with a voltage of a first signal being at a first level and output a second voltage to the first node in accordance with a voltage of the first signal being at a second level, the first signal being input to the first input terminal of the first clocked inverter.

11. The semiconductor device according to claim 10, wherein, in the case where the first clocked inverter turns on, the switch is configured to output a third voltage to the first node while the first clocked inverter is outputting the first voltage to the first node and output a fourth voltage to the first node while the first clocked inverter is outputting the second voltage to the first node, the third voltage being lower than the first voltage, and the fourth voltage being higher than the second voltage.

12. The semiconductor device according to claim 9, wherein, in the case where the first clocked inverter turns off, the second clocked inverter and the inverter are configured to latch data to the second node based on a voltage of the first node.

* * * * *